United States Patent
Jikumaru et al.

(10) Patent No.: US 10,342,124 B2
(45) Date of Patent: Jul. 2, 2019

(54) DISPLAY DEVICE

(71) Applicant: Semiconductor Energy Laboratory Co., Ltd., Kanagawa-ken (JP)

(72) Inventors: Mika Jikumaru, Ohita (JP); Daisuke Kubota, Kanagawa (JP); Noriko Miyairi, Kanagawa (JP); Takaaki Nagata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/735,671

(22) Filed: Jun. 10, 2015

(65) Prior Publication Data
US 2015/0362776 A1     Dec. 17, 2015

(30) Foreign Application Priority Data

Jun. 13, 2014    (JP) .................................. 2014-122084
Jun. 27, 2014    (JP) .................................. 2014-132646

(51) Int. Cl.
*G02F 1/1333* (2006.01)
*H05K 1/02* (2006.01)
(Continued)

(52) U.S. Cl.
CPC ....... *H05K 1/0298* (2013.01); *G02F 1/13394* (2013.01); *G02F 1/133553* (2013.01);
(Continued)

(58) Field of Classification Search
CPC .................. H05K 1/0298; G02F 1/133553
See application file for complete search history.

(56) References Cited

U.S. PATENT DOCUMENTS

| 5,940,154 A | 8/1999 | Ukita et al. |
| 6,061,112 A | 5/2000 | Ukita et al. |

(Continued)

FOREIGN PATENT DOCUMENTS

| CN | 101900913 A | 12/2010 |
| EP | 1 806 602 A2 | 7/2007 |

(Continued)

OTHER PUBLICATIONS

International Search Report re Application No. PCT/IB2015/053992, dated Sep. 15, 2015.

(Continued)

*Primary Examiner* — Sang V Nguyen
(74) *Attorney, Agent, or Firm* — Husch Blackwell LLP

(57) ABSTRACT

Provided is a display device or an input/output device in which reflection of outside light is reduced. The display device includes a first substrate and a second substrate. The first substrate includes a first surface. A transistor is over the first surface. The second substrate includes a second surface. A first structure having a projection, a second structure having a projection, a black matrix covering the first structure and the second structure, and a color filter are over the second surface. The first surface faces the second surface. The black matrix has a plurality of projections reflecting the projection of the first structure and the projection of the second structure. A planar shape of the first structure is different from a planar shape of the second structure.

27 Claims, 30 Drawing Sheets

(51) Int. Cl.
*G02F 1/1339* (2006.01)
*G02F 1/1335* (2006.01)
*H01L 27/12* (2006.01)
*H01L 27/32* (2006.01)
*H01L 51/52* (2006.01)

(52) U.S. Cl.
CPC ........ *H01L 27/124* (2013.01); *H01L 27/1248* (2013.01); *H01L 27/323* (2013.01); *H01L 51/5284* (2013.01); *G02F 1/133345* (2013.01); *G02F 1/133512* (2013.01); *H01L 27/3244* (2013.01); *H01L 27/3258* (2013.01); *H01L 51/5209* (2013.01); *H01L 51/5225* (2013.01)

(56) References Cited

U.S. PATENT DOCUMENTS

| | | | |
|---|---|---|---|
| 6,433,487 B1 | 8/2002 | Yamazaki | |
| 6,433,767 B1* | 8/2002 | Murade | G02F 1/13454 345/87 |
| 6,709,901 B1 | 3/2004 | Yamazaki et al. | |
| 6,855,957 B1 | 2/2005 | Yamazaki et al. | |
| 6,900,084 B1 | 3/2005 | Yamazaki | |
| 7,212,265 B2 | 5/2007 | Eguchi S et al. | |
| 7,312,571 B2 | 12/2007 | Kim | |
| 7,773,182 B2 | 8/2010 | Kimura et al. | |
| 7,977,871 B2 | 7/2011 | Kim | |
| 8,558,341 B2 | 10/2013 | Tanaka et al. | |
| 8,654,292 B2 | 2/2014 | Kubota et al. | |
| 8,665,403 B2 | 3/2014 | Yamazaki et al. | |
| 8,853,724 B2 | 10/2014 | Seo et al. | |
| 8,911,653 B2* | 12/2014 | Yamazaki | H01L 51/0097 264/272.17 |
| 9,054,053 B2 | 6/2015 | Sagawa | |
| 9,075,270 B2* | 7/2015 | Lee | G02F 1/134363 |
| 9,645,451 B2 | 5/2017 | Kubota et al. | |
| 9,761,637 B2 | 9/2017 | Sagawa | |
| 2006/0038944 A1* | 2/2006 | Kim | G02F 1/133553 349/114 |
| 2007/0153171 A1* | 7/2007 | Kim | G02F 1/133555 349/114 |
| 2007/0157839 A1 | 7/2007 | Kim et al. | |
| 2009/0147210 A1* | 6/2009 | Saito | C09K 19/44 349/182 |
| 2010/0046236 A1 | 2/2010 | Nishiwaki | |
| 2010/0176717 A1* | 7/2010 | Lee | H01L 51/5271 313/504 |
| 2010/0182273 A1* | 7/2010 | Noguchi | G02F 1/13338 345/174 |
| 2010/0302492 A1* | 12/2010 | Kubota | G02F 1/134363 349/138 |
| 2011/0025969 A1* | 2/2011 | Chen | G02F 1/13338 349/139 |
| 2011/0122348 A1* | 5/2011 | Sakai | G02F 1/13338 349/110 |
| 2011/0141413 A1* | 6/2011 | Sakai | G02B 5/003 349/110 |
| 2011/0310069 A1* | 12/2011 | Sagawa | H01L 27/3258 345/204 |
| 2012/0235266 A1* | 9/2012 | Ootsuka | H01L 27/14623 257/432 |
| 2013/0182328 A1* | 7/2013 | Stewart | G02B 1/118 359/580 |
| 2013/0240852 A1* | 9/2013 | Yamazaki | H01L 51/5271 257/40 |
| 2013/0308073 A1* | 11/2013 | Yamazaki | H01L 27/323 349/46 |
| 2014/0160040 A1* | 6/2014 | Kang | H04R 17/005 345/173 |
| 2014/0306241 A1* | 10/2014 | Hirakata | H01L 51/5281 257/79 |
| 2014/0320769 A1* | 10/2014 | Masuda | G06F 3/044 349/12 |
| 2015/0131041 A1* | 5/2015 | Moriwaki | G02F 1/1337 349/106 |
| 2015/0349039 A1 | 12/2015 | Sagawa | |
| 2016/0152893 A1* | 6/2016 | Ogawa | C09K 19/3066 349/106 |
| 2017/0077189 A1 | 3/2017 | Sagawa | |
| 2018/0114816 A1 | 4/2018 | Sagawa | |

FOREIGN PATENT DOCUMENTS

| | | | |
|---|---|---|---|
| JP | 09-311328 A | 12/1997 | |
| JP | 10-133199 A | 5/1998 | |
| JP | 10-161151 A | 6/1998 | |
| JP | 2000-040584 | 2/2000 | |
| JP | 2003-196023 A | 7/2003 | |
| JP | 2003-243152 | 8/2003 | |
| JP | 1 475 849 A2 | 11/2004 | |
| JP | 2004-335470 A | 11/2004 | |
| JP | 2007-183587 A | 7/2007 | |
| JP | 2008-226483 A | 9/2008 | |
| JP | 2008-235605 A | 10/2008 | |
| JP | 2009-003916 A | 1/2009 | |
| JP | 2009-064562 A | 3/2009 | |
| JP | 2010-169913 A | 8/2010 | |
| JP | 2010-243523 A | 10/2010 | |
| JP | 2011-013387 * | 1/2011 | ............... G02B 5/20 |
| JP | 2011-013387 A | 1/2011 | |
| JP | 2011-128208 A | 6/2011 | |
| JP | 2012-003925 A | 1/2012 | |
| JP | 2014-038702 A | 2/2014 | |
| KR | 10-0247600 B1 | 3/2000 | |
| KR | 2007-0074051 A | 7/2007 | |
| TW | 449669 B | 8/2001 | |
| TW | 201305703 | 2/2013 | |
| WO | WO 2010/026682 A1 | 3/2010 | |
| WO | WO 2010/026683 A1 | 3/2010 | |

OTHER PUBLICATIONS

Written Opinion re Application No. PCT/IB2015/053992, dated Sep. 15, 2015.

Chinese Office Action re Application No. CN 201580031427.0, dated Sep. 28, 2018.

* cited by examiner

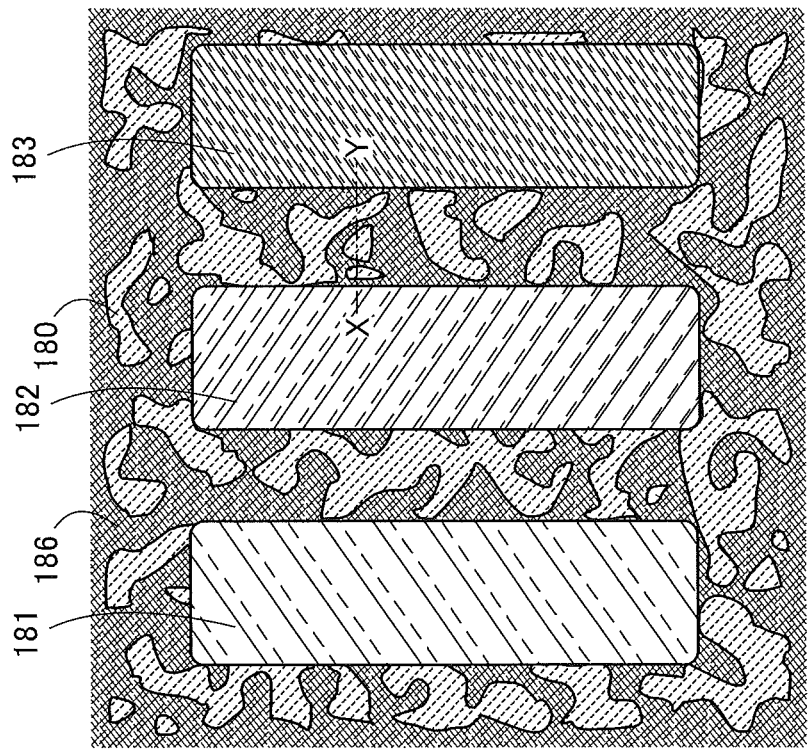
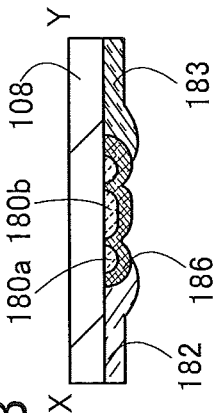
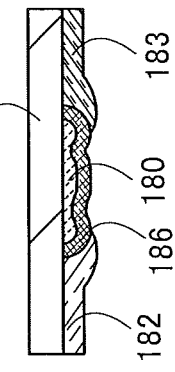
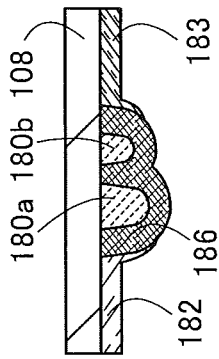
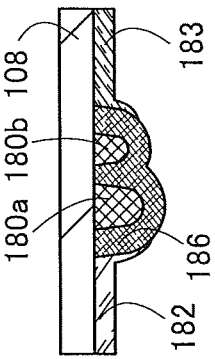
FIG. 2A
FIG. 2B
FIG. 2C
FIG. 2D
FIG. 2E

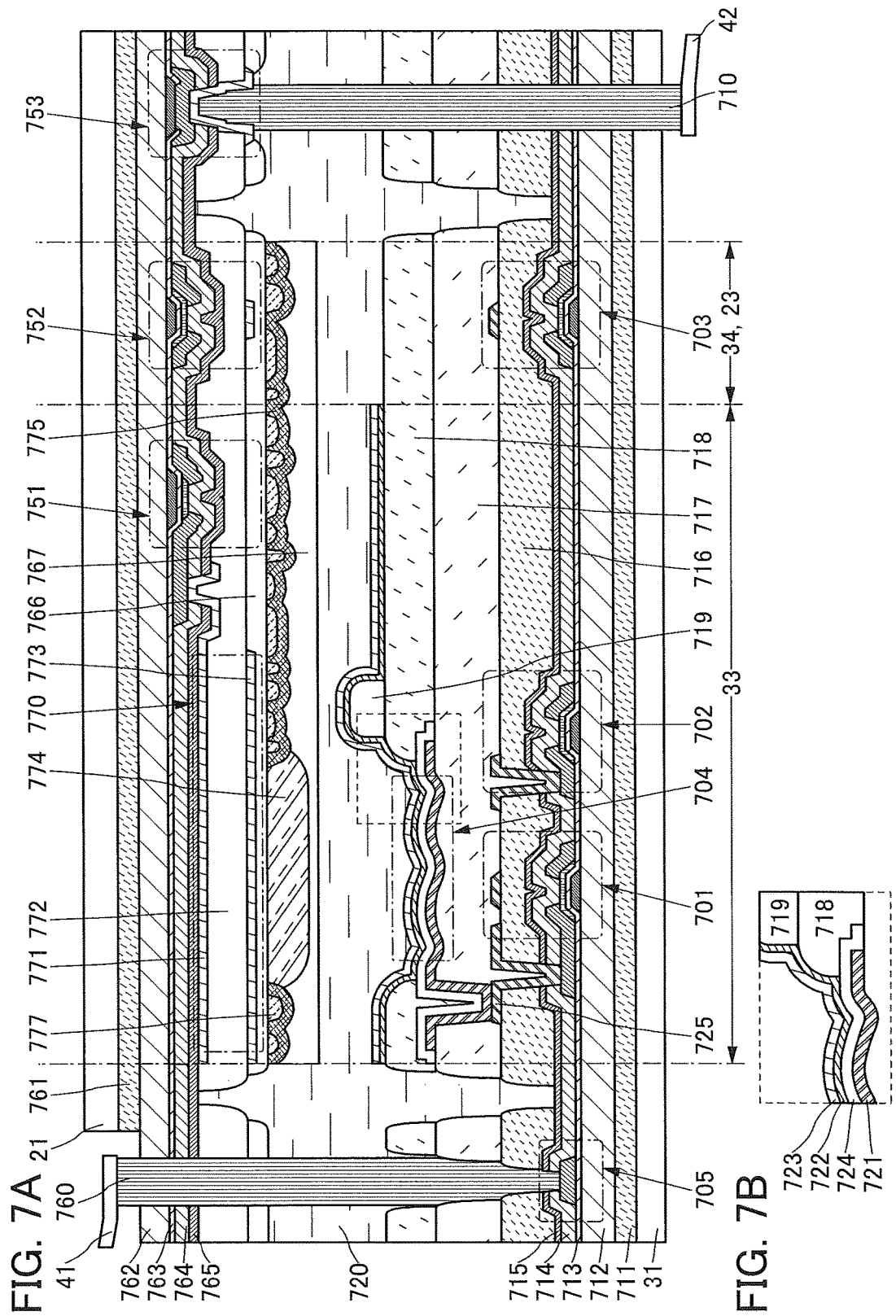

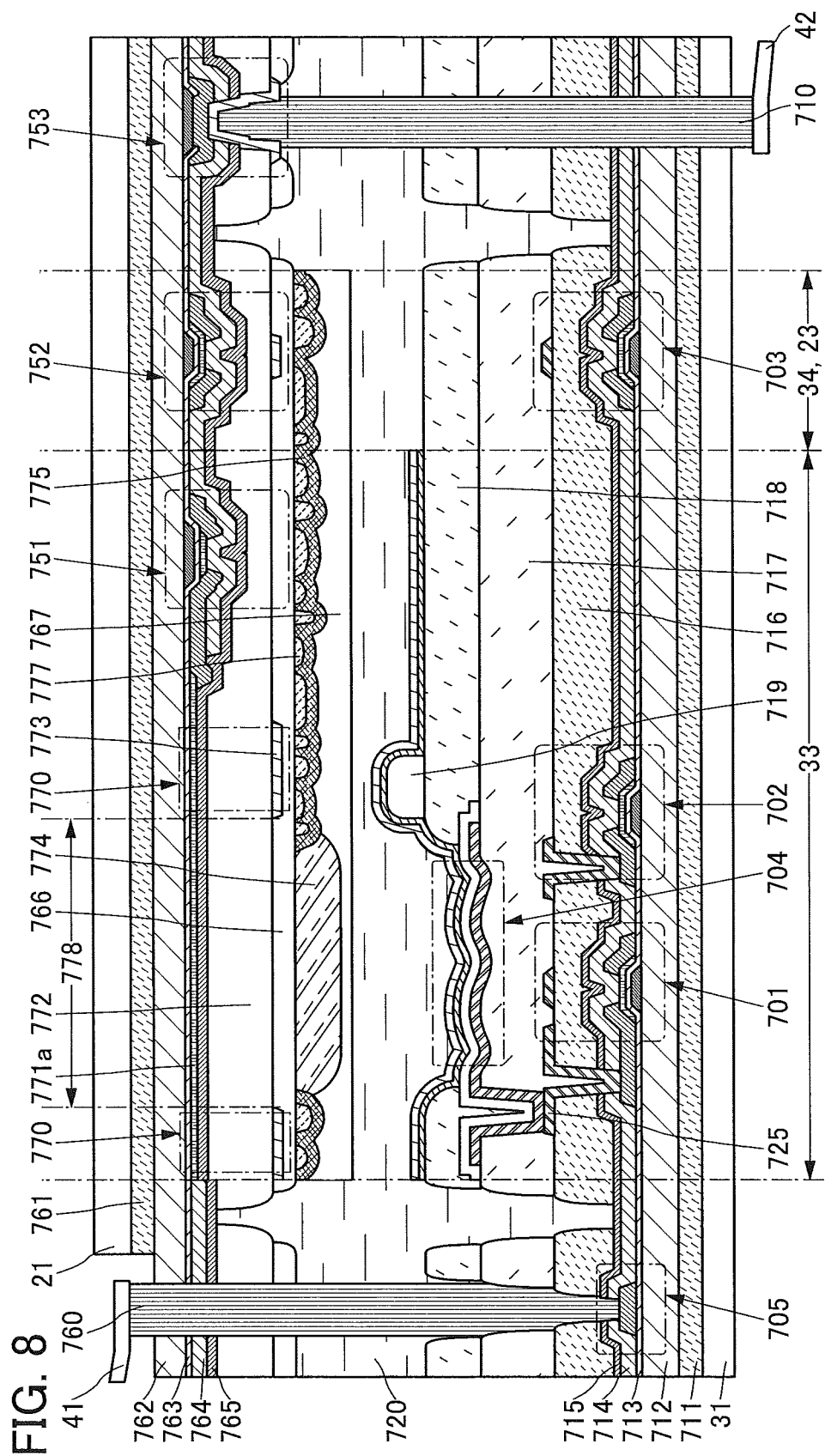

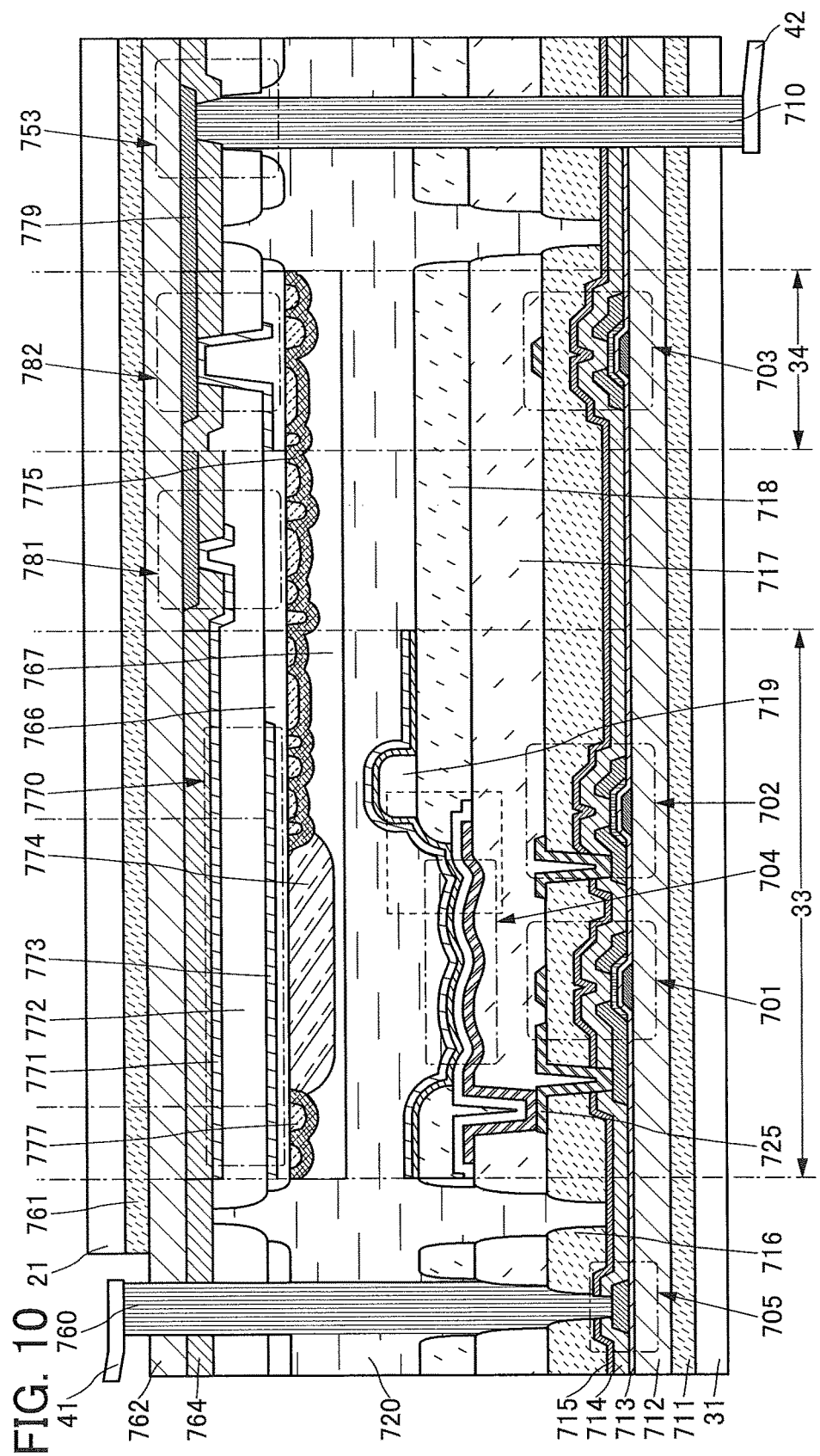

FIG. 11A
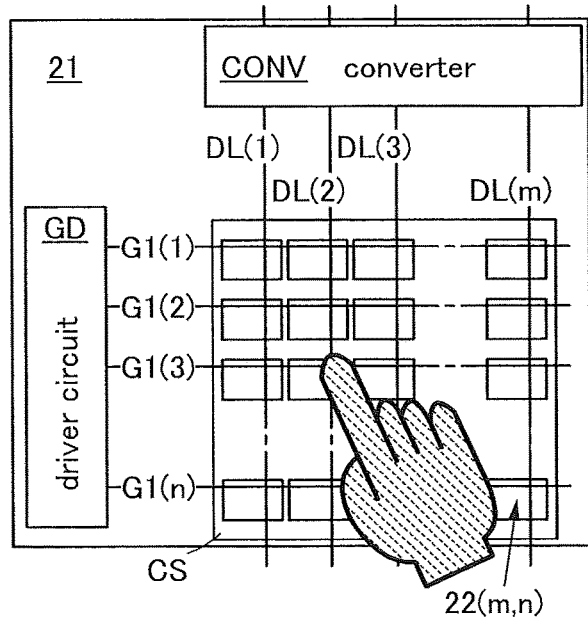
FIG. 11B
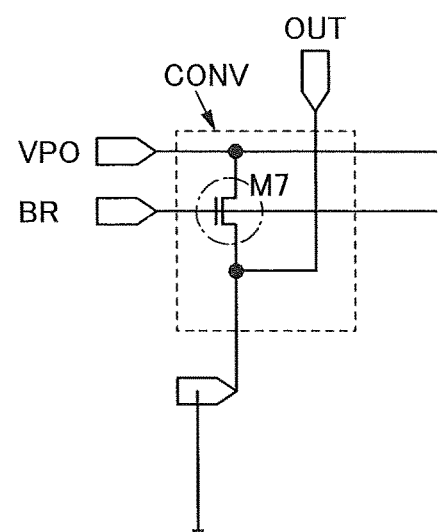
FIG. 11C
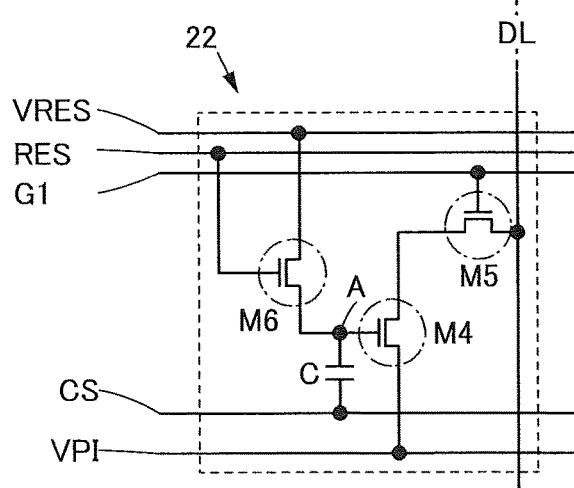
FIG. 11D1
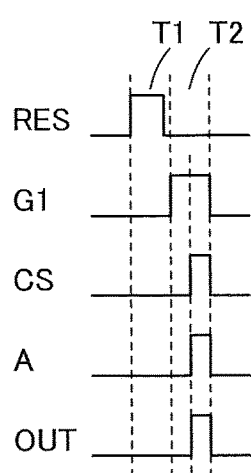
FIG. 11D2
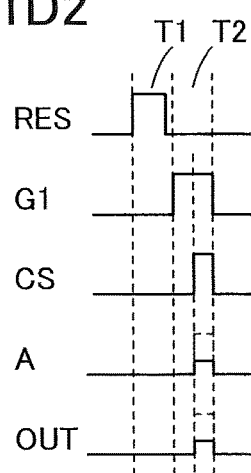

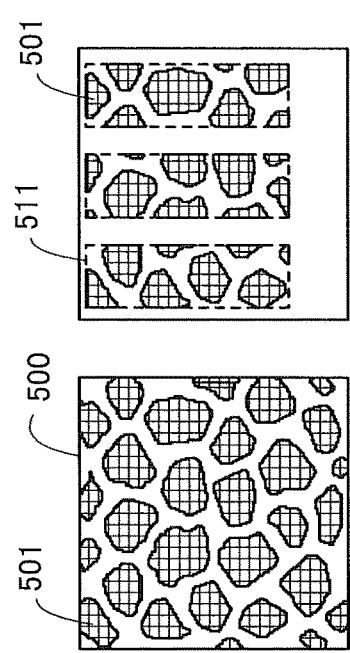 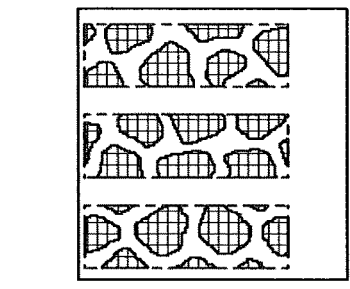 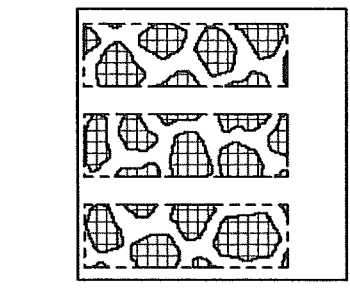 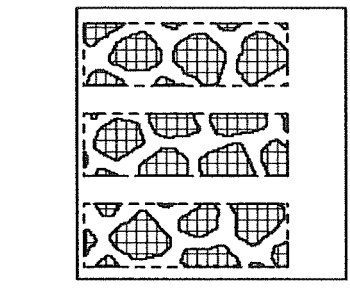 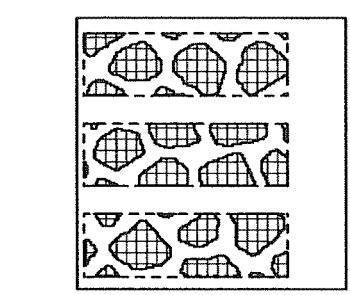 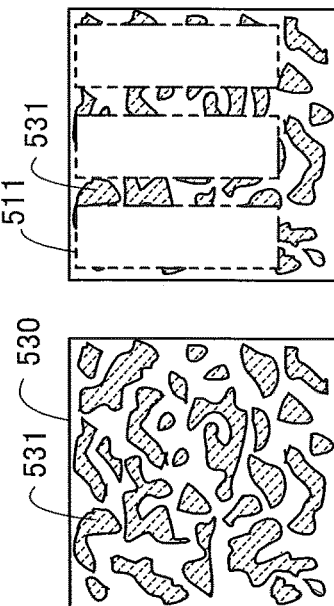 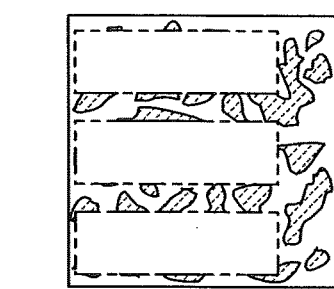 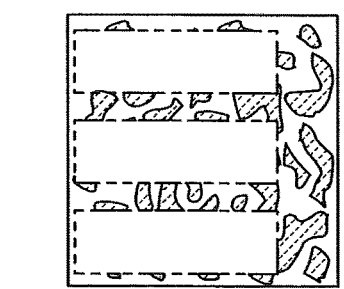 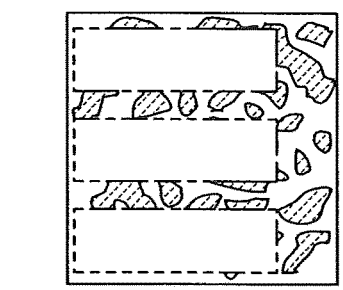 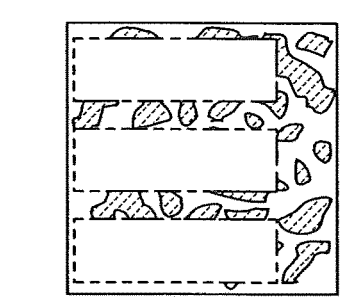
FIG. 24A1  FIG. 24A2  FIG. 24A3  FIG. 24A4  FIG. 24A5
FIG. 24B1  FIG. 24B2  FIG. 24B3  FIG. 24B4  FIG. 24B5

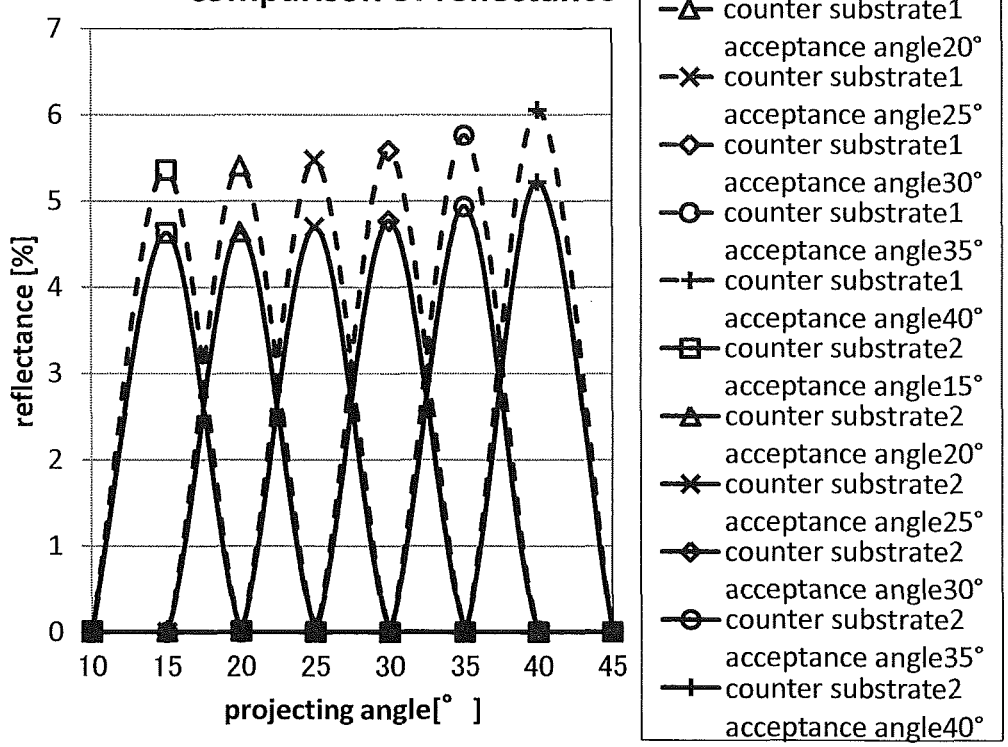

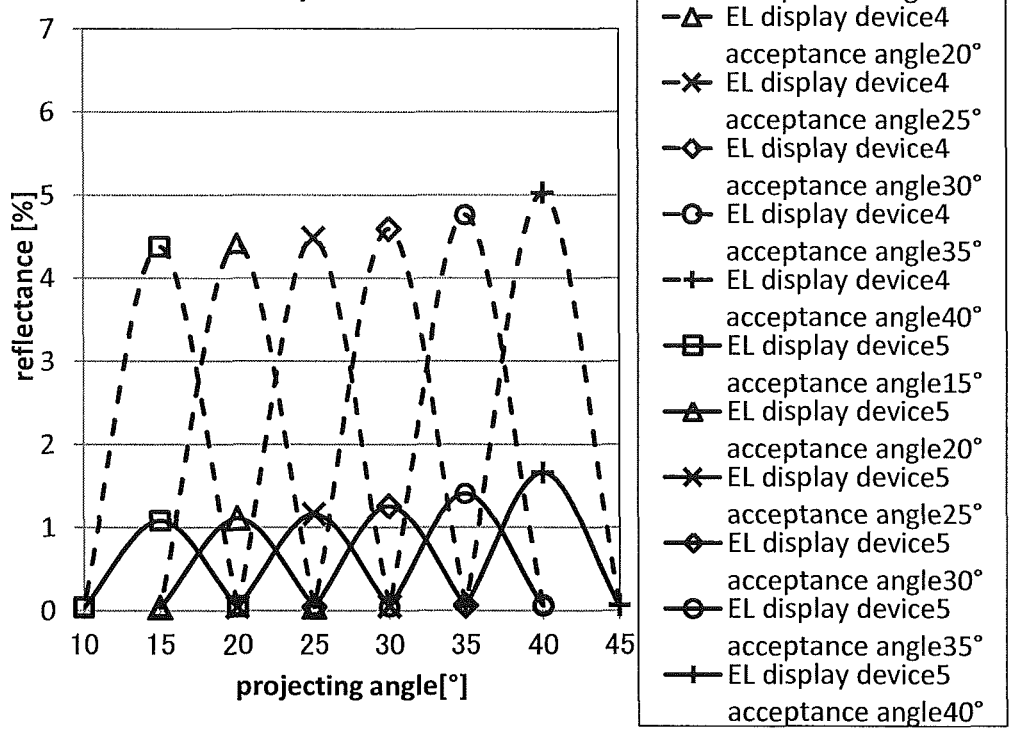

DISPLAY DEVICE

TECHNICAL FIELD

One embodiment of the present invention relates to a display device or an input/output device. One embodiment of the present invention relates to a display device including a light-emitting element, such as an electroluminescence (EL) element, and a display device including a liquid crystal element.

Note that one embodiment of the present invention disclosed in this specification and the like is not limited to the above technical field and relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, an electronic device, an input device, an input/output device, a driving method thereof, and a manufacturing method thereof.

Note that in this specification, an input/output device and an input device may be referred to as a touch panel and a touch sensor, respectively.

BACKGROUND ART

EL display devices are known as an active matrix display device. A display of the active matrix EL display device includes a plurality of pixels each having a pixel circuit and an EL element. In the EL display device, the pixel circuit controls the luminance of the EL element so that gray scale display can be performed.

Generally, the EL element included in each pixel has a light-emitting layer between a light-transmitting electrode and a light-reflecting electrode. Light generated by the light-emitting layer is extracted through the light-transmitting electrode. Note that a structure in which light is extracted to a substrate having an EL element is referred to as a bottom emission structure, whereas a structure in which light is extracted to the side opposite to the substrate having an EL element is referred to as a top emission structure.

In the top emission structure, light is emitted to the side opposite to the substrate having an EL element, i.e., the counter substrate side. When a color filter is formed on the counter substrate and an EL element is configured to emit white light, full-color display can be achieved. Note that a black matrix is provided in a region overlapping with a non-light-emitting region of the EL element in order to avoid a reduction in display quality due to light leakage between adjacent pixels.

A plurality of reflective electrodes are regularly arranged on a display of an EL display device. This structure has a problem in that these reflective electrodes function like mirrors and reflect an image in the display. Further, because of the reflective electrodes arranged regularly, interference fringes might appear on the display due to diffraction and interference of light reflected by each reflective electrode. A measure against the problems is to make the surface of the reflective electrode rough. In Patent Documents 1 and 2, a light-transmitting electrode (cathode), a light-emitting layer, and a metal electrode (anode) are stacked in this order over a resin film having dotted projections and depressions in its surface, thereby forming projections and depressions in the surface of a reflective electrode.

REFERENCE

Patent Document

[Patent Document 1] Japanese Published Patent Application No. 2000-040584
[Patent Document 2] Japanese Published Patent Application No. 2003-243152

DISCLOSURE OF INVENTION

Patent Document 1 is expected to be effective to some extent in terms of preventing reflection of images, but there is a problem of a reduction in display quality due to interference fringes because of a dot pattern, which is a highly symmetric planar shape, formed on the surface of a resin film.

Patent Document 2 discloses a method for suppressing diffraction of outside light by irregularly arranging projections and depression, but the planar shape of the projections and depressions is round, which is highly symmetric; thus, it cannot be said that sufficient measures are taken.

In addition, measures against a reduction in display quality due to outside light reflected by a black matrix are required.

In view of these, an object of one embodiment of the present invention is to provide a display device or an input/output device in which irregularity of the surface shape of a black matrix between pixels is increased to suppress reflection of images due to reflection of outside light and generation of interference fringes.

An object of one embodiment of the present invention is to provide an input/output device in which irregularity of the surface shape of a reflective electrode is increased to suppress reflection of images due to reflection of outside light and generation of interference fringes. An object of one embodiment of the present invention is to provide a display device or an input/output device which includes a reflective electrode with high irregularity of the surface shape and which can be easily increased in display size and definition.

Another object of one embodiment of the present invention is to provide a novel display device or input/output device. Note that a plurality of objects do not mutually preclude their existence. One embodiment of the present invention does not necessarily achieve all these objects. Objects other than those described above are apparent from the specification, drawings, and claims and can be an object of one embodiment of the present invention.

One embodiment of the present invention is a display device including a first substrate and a second substrate. The first substrate includes a first surface. A transistor is over the first surface. The second substrate includes a second surface. A first structure having a projection, a second structure having a projection, and a black matrix covering the first structure and the second structure are over the second surface. The first surface faces the second surface. The black matrix has a plurality of projections reflecting the projection of the first structure and the projection of the second structure. A planar shape of the first structure is different from a planar shape of the second structure.

One embodiment of the present invention is a display device including a first substrate and a second substrate. The first substrate includes a first surface. A first transistor, an insulating layer, and a light-emitting element over the insulating layer are over the first surface. The second substrate includes a second surface. A first structure having a projection, a second structure having a projection, and a black matrix covering the first structure and the second structure are over the second surface. The first surface faces the second surface. The insulating layer has a plurality of depressions. The black matrix has a plurality of projections reflecting the projection of the first structure and the projection of the second structure. A planar shape of the first structure is different from a planar shape of the second structure.

One embodiment of the present invention is a display device including a first substrate and a second substrate. The first substrate includes a first surface. A first transistor, an insulating layer, and a light-emitting element over the insulating layer are over the first surface. The second substrate includes a second surface. A first structure having a projection, a second structure having a projection, and a black matrix covering the first structure and the second structure are over the second surface. The first surface faces the second surface. The insulating layer has a plurality of depressions. The light-emitting element includes a first electrode, a second electrode, and a layer containing a light-emitting material between the first electrode and the second electrode. The first electrode has a plurality of depressions reflecting the plurality of depressions of the insulating layer. Planar shapes of the plurality of depressions of the insulating layer are different from each other. The black matrix has a plurality of projections reflecting the projections of the first structure and the second structure. A planar shape of the first structure is different from a planar shape of the second structure.

One embodiment of the present invention is a display device including a first substrate and a second substrate. The first substrate includes a first surface. A first transistor, an insulating layer, and a third electrode over the insulating layer are over the first surface. The second substrate includes a second surface. A first structure having a projection, a second structure having a projection, and a black matrix covering the first structure and the second structure are over the second surface. The first surface faces the second surface. A liquid crystal layer is between the first substrate and the second substrate. The insulating layer has a plurality of depressions. The black matrix has a plurality of projections reflecting the projections of the first structure and the second structure. A planar shape of the first structure is different from a planar shape of the second structure.

One embodiment of the present invention is an input/output device including the display device and a sensor element. The sensor element is over the second surface. The sensor element includes a first conductive layer, a second conductive layer, and a dielectric layer. The dielectric layer is between the first conductive layer and the second conductive layer.

One embodiment of the present invention is an input/output device including the display device and an input device. The input device is over the second surface. The input device includes a second transistor and a sensor element. The sensor element includes a first conductive layer, a second conductive layer, and a dielectric layer. The dielectric layer is between the first conductive layer and the second conductive layer. The second transistor is electrically connected to the sensor element.

The display device or the input/output device in the above embodiments may have a structure in which a first pixel and a second pixel are included and a planar shape of the depression in the first pixel is a planar shape in which the depression in the second pixel is rotated 90°.

In the above embodiments, a structure in which the planar shape of the depression does not have rotational symmetry may be used.

In the above embodiments, the first structure and the second structure may include a portion connected to each other.

In the above embodiments, the first structure and the second structure can include a region having a thickness of greater than or equal to 0.2 µm and less than or equal to 3 µm.

In the above embodiments, the projection can include a portion in which a tilt angle is greater than or equal to 2° and less than or equal to 80°.

In the above embodiments, a thickness of the first structure may be different from a thickness of the second structure.

In the above embodiments, the first structure and the second structure may include a region in which a refractive index is higher than a refractive index of the black matrix.

In the above embodiments, the first structure and the second structure may contain a material which is the same as a material of the black matrix.

In the above embodiments, a structure in which a third pixel and a fourth pixel are included, the third pixel overlaps with the first structure, the fourth pixel overlaps with the second structure, and a planar shape of the first structure is a planar shape in which the second structure is rotated 90° may be used.

In the above embodiments, a structure in which the planar shape of the first structure or the planar shape of the second structure does not have rotational symmetry may be used.

In the above input/output device, a structure in which a third conductive layer is over the second surface, the third conductive layer is electrically connected to at least one of the first conductive layer and the second conductive layer, and a part of the third conductive layer is between the black matrix and the first substrate may be employed.

One embodiment of the present invention can provide a display device or an input/output device in which irregularity of the surface shape of a black matrix is increased to suppress generation of interference fringes and a reduction in display quality due to reflection of outside light.

Furthermore, one embodiment of the present invention can provide a display device or an input/output device in which irregularity of the surface shape of a reflective electrode is increased to suppress generation of interference fringes and reflection of images due to reflection of outside light. One embodiment of the present invention can provide a display device or an input/output device which includes a reflective electrode with high surface shape irregularity and a black matrix with high surface shape irregularity and which can be easily increased in display size and definition. One embodiment of the present invention can provide a novel display device or input/output device. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 2A to 2E are a top view and cross-sectional views showing examples of a black matrix having a projection.

FIGS. 7A and 7B are cross-sectional views showing a structure example of a touch panel.

FIG. 8 is a cross-sectional view showing a structure example of a touch panel.

FIG. 10 is a cross-sectional view showing a structure example of a touch panel.

FIGS. 11A to 11D2 are a block diagram and circuit diagrams showing a structure of a touch panel.

FIGS. 24A1 to 24B5 are plan views showing arrangement examples of depressions and projections.

FIGS. 25A to 25F are diagrams showing a manufacturing method of depressions and projections.

FIG. 29 shows measurement results of reflectance of outside light.

FIG. 30 shows measurement results of reflectance of outside light.

BEST MODE FOR CARRYING OUT THE INVENTION

Figure 1:
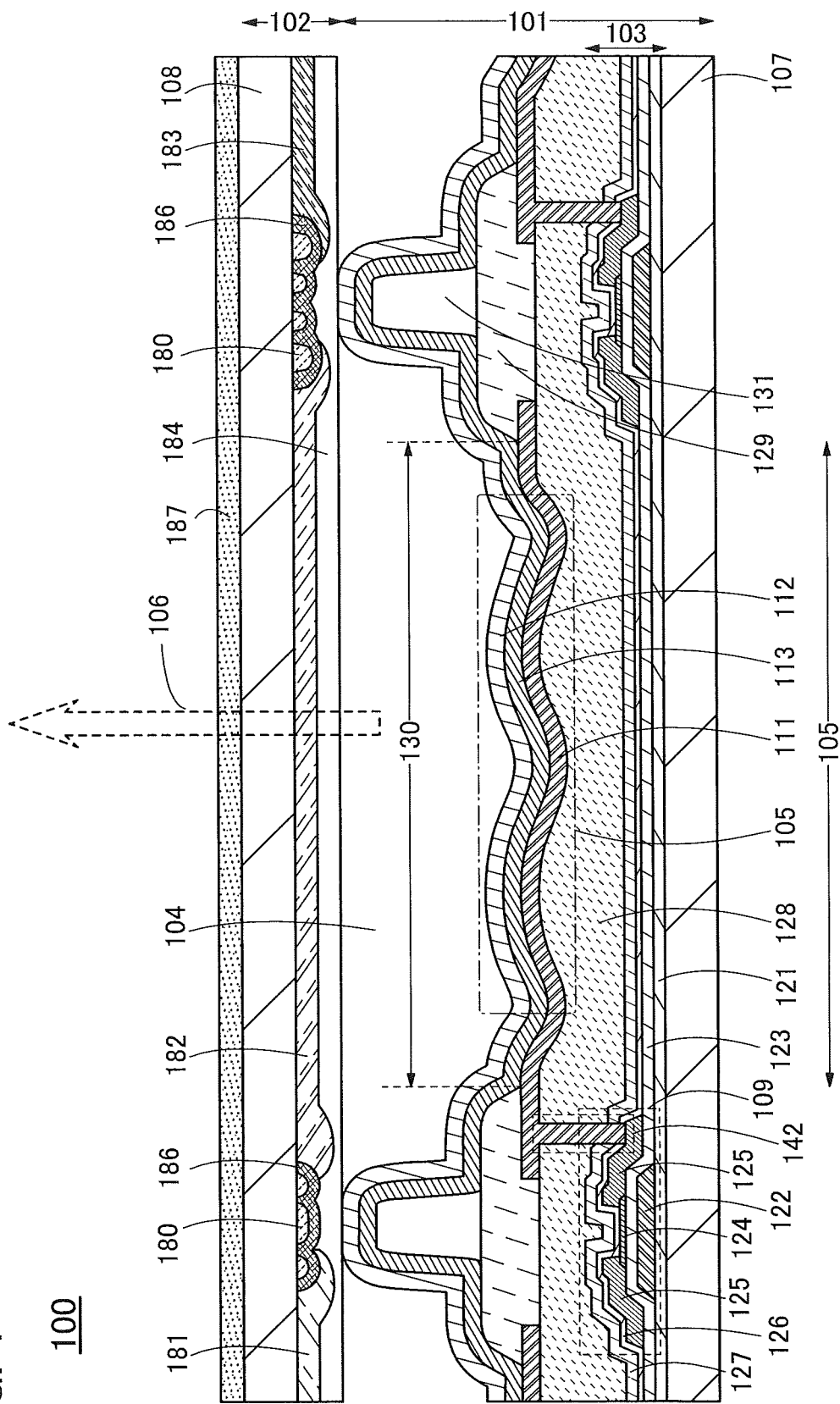
FIG. 1 is a cross-sectional view showing a structure example of a display device.

Embodiments of the present invention will be described in detail with reference to the accompanying drawings. It will be readily appreciated by those skilled in the art that modes and details of the present invention can be changed in various ways without departing from the spirit and scope of the present invention. Therefore, the present invention should not be construed as being limited to the description of the embodiments below.

In the drawings used for the description of embodiments of the present invention, the same portions or portions having a similar function are denoted by the same reference numerals, and the repeated description thereof is omitted.

Note that in this specification, a semiconductor device means a circuit including a semiconductor element (e.g., a transistor and a diode) and a device including the circuit. The semiconductor device also means any device that can function by utilizing semiconductor characteristics. For example, an integrated circuit, a chip including an integrated circuit, a display device, a light-emitting device, a lighting device, an electronic device, and the like include a semiconductor device in some cases.

Note that the terms "film" and "layer" can be interchanged with each other depending on the case or circumstances. For example, the term "conductive layer" can be changed into the term "conductive film", and the term "insulating film" can be changed into the term "insulating layer" in some cases.

Embodiment 1

An EL display device which is an example of one embodiment of the present invention will be described with reference to FIG. 1, FIGS. 2A to 2E, and FIGS. 3A to 3C.

FIG. 1 is a cross-sectional view showing a structure example of an EL display device 100. The EL display device 100 includes an element substrate 101 and a counter substrate 102. Note that the EL display device 100 has a top-emission structure where light 106 emitted from a light-emitting element 105 is extracted from the counter substrate 102 side.

[Structure Example of Element Substrate]

The element substrate 101 includes a transistor layer 103 over the substrate 107 and a light-emitting element 105 over the transistor layer 103. The transistor layer 103 includes a transistor, a capacitor, wirings/a group of wirings, and the like which are included in a pixel region and a driver. In FIG. 1, a transistor 109 of a pixel circuit is illustrated as a representative example.

There is no particular limitation on the structure of the transistor 109, and a transistor suitable for the characteristics of a circuit formed on the element substrate 101 is used. The transistor 109 can thus have either a bottom-gate structure as illustrated in FIG. 1 or a top-gate structure. For a semiconductor layer of the transistor 109, a semiconductor film having a single-layer structure or a multilayer structure using any of an amorphous silicon film, a polycrystalline silicon film, a single crystal silicon film, and an oxide semiconductor film can be used.

The transistor layer 103 includes, in the order from the substrate side, a first insulating layer 121, a gate electrode 122, a gate insulating layer 123, a semiconductor layer 124, a source electrode and a drain electrode 125, a second insulating layer 126, and a third insulating layer 127.

The first insulating layer 121 can be either a single-layer film or a stack including two or more layers, and there is no particular limitation on the thickness thereof. The first insulating layer 121 preferably has a flat top surface. Examples of an insulating film included in the first insulating layer 121 include a silicon oxide insulating film, a silicon oxynitride insulating film, a silicon nitride oxide insulating film, an aluminum oxide insulating film, an acrylic resin insulating film, a polyimide resin insulating film, a benzocyclobutene resin insulating film, a polyamide resin insulating film, an epoxy resin insulating film, and a siloxane-based resin insulating film. Note that the first insulating layer 121 preferably has a function as a blocking layer for suppressing diffusion of impurities contained in the substrate 107 to the semiconductor layer 124.

The gate electrode 122 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. These metal films and metal nitride films may be stacked, for example, tungsten (W) over tungsten nitride, aluminum (Al) and molybdenum (Mo) over Mo, titanium (Ti) over copper (Cu), Mo over molybdenum nitride.

The gate insulating layer 123 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Note that the gate insulating layer 123 may be a stacked layer of any of the above materials. The gate insulating layer 123 can be formed by a sputtering method, a CVD method, an MBE method, an ALD method, a PLD method, or the like.

For a semiconductor layer 124, a semiconductor film having a single-layer structure or a multilayer structure using any of an amorphous silicon film, a polycrystalline silicon film, a single crystal silicon film, and an oxide semiconductor film can be used. In the case where an oxide semiconductor film is used as the semiconductor layer 124, at least indium (In) or zinc (Zn) is preferably contained. As a stabilizer for reducing variation in electric characteristics of a transistor using the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that each of the source and drain electrodes 125 can be formed of a metal such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), barium (Ba), or neodymium (Nd), an alloy thereof, metal nitride thereof, or a stacked-layer film thereof. A stacked-layer film in which titanium is formed over copper, a stacked-layer film in which copper is formed over titanium, a stacked-layer film in which titanium, aluminum, and titanium are stacked in this order, and the like are particularly preferable.

An oxide insulating film is preferably used as the second insulating layer 126. The oxide insulating film preferably includes a region which contains oxygen in excess of that in the stoichiometric composition (oxygen-excess region), and for example, can be a silicon oxide film or a silicon oxynitride film including a region which contains oxygen in excess of that in the stoichiometric composition (oxygen-excess region).

A nitride insulating film is preferably used as the third insulating layer 127. For example, a silicon nitride film, a silicon nitride oxide film, and the like can be used as the nitride insulating film.

The transistor layer 103 is covered with the insulating layer 128. A reflective electrode layer 111, a light-emitting layer 113, and a light-transmitting electrode layer 112 are stacked over the insulating layer 128. The stack including these layers forms the light-emitting element 105. The reflective electrode layer 111 is connected to the transistor 109 through an opening formed in the second insulating layer 126, the third insulating layer 127, and the insulating layer 128. The reflective electrode layer 111 is a conductive layer serving as an anode of the light-emitting element 105. The light-emitting electrode layer 112 is a conductive layer serving as a cathode of the light-emitting element 105.

A light-emitting layer 113 is a layer including a light-emitting material. A light-emitting organic compound can be given as an example of the light-emitting material. Examples of the light-emitting organic compound include a fluorescent compound (e.g., coumarin 545T) and a phosphorescent compound (e.g., tris(2-phenylpyridinato)iridium (III) (abbreviation: Ir(ppy)$_3$)). A phosphorescent compound is preferably used as the light-emitting organic compound, in which case the emission efficiency of the light-emitting element 105 can be increased.

The light-emitting element 105 may include a layer other than the light-emitting layer 113 between the reflective electrode layer 111 and the light-transmitting electrode layer 112. The light-emitting element 105 includes at least one light-emitting layer containing a light-emitting organic compound, and may have a structure in which the light-emitting layer and a layer other than the light-emitting layer are stacked. Examples of the layer other than the light-emitting layer include a layer containing a substance having a high hole-injection property, a layer containing a substance having a high hole-transport property, a layer containing a substance having a poor hole-transport property (a substance which blocks holes), a layer containing a substance having a high electron-transport property, a layer containing a substance having a high electron-injection property, and a layer containing a substance having a bipolar property (a substance having a high electron-transport property and a high hole-transport property).

A plurality of depressions are randomly formed in part of a surface of the insulating layer 128. The reflective electrode layer 111 is formed in contact with a surface of the insulating layer 128; thus, a plurality of depressions reflecting projections and depressions of the surface of the insulating layer 128 are formed. The plurality of depressions are randomly formed in the surface of the reflective electrode layer 111, which can inhibit interference of a plurality of light rays reflected by the plurality of reflective electrode layers 111 in the pixel region.

Note that the insulating layer 128 can be formed in a manner similar to that of the first insulating layer 121. Here, a plurality of depressions are formed in the surface of the insulating layer 128; thus, the insulating layer 128 is preferably formed using a photosensitive resin material that is easy to process (e.g., photopolymer, photosensitive acrylic, or photosensitive polyimide).

The reflective electrode layer 111 can have either a single-layer structure or a layered structure where a plurality of films are stacked, and there is no particular limitation on the thickness thereof. The reflective electrode layer 111 includes at least one light-reflective conductive film that can reflect at least the light 106. Examples of the light-reflective conductive film include a metal film of molybdenum, titanium, tantalum, tungsten, aluminum, silver, copper, chromium, neodymium, scandium, or the like, or an alloy film that contains any of these metals.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. An alloy containing gold and copper can be used. A metal nitride can be used for the light-reflective conductive film. Specifically, a metal nitride film of titanium nitride, molybdenum nitride, tungsten nitride, or the like can be used.

For example, a film having a two-layer structure where a titanium film is stacked over a film containing an aluminum-nickel-lanthanum alloy can be formed as the reflective electrode layer 111.

Alternatively, a layered film in which a light-transmitting conductive film that transmits visible light is stacked over a light-reflective conductive film may be formed as the reflective electrode layer 111. Examples of the light-transmitting conductive film include a film containing a metal oxide such as indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added.

An insulating layer 129 is formed over the insulating layer 128 in the element substrate 101. The insulating layer 129 has an opening 130. A region in the opening 130 where the reflective electrode layer 111, the light-emitting layer 113, and the light-transmitting electrode layer 112 are stacked serves as the light-emitting element 105. Note that the insulating layer 129 serves as a partition for separating the light-emitting elements 105 in the adjacent pixels from each other.

An insulating layer 131 is formed over the insulating layer 129. The insulating layer 131 has a function as a spacer for maintaining a gap between the element substrate 101 and the counter substrate 102.

The insulating layer 129 and the insulating layer 131 can each have either a single-layer structure or a layered structure including two or more layers, and there is no particular limitation on the thicknesses thereof. The insulating layer 129 and the insulating layer 131 are preferably formed using a photosensitive resin material such as photopolymer, photosensitive acrylic, or photosensitive polyimide. The insulating layer 131 may be an inorganic insulating material such as a silicon oxide film that can be formed by a CVD method, a sputtering method, or the like.

The light-emitting layer 113 and the light-transmitting electrode layer 112 are stacked in the whole pixel region to cover the insulating layer 129 and the insulating layer 131. The light-emitting element 105 has a structure in which a wavelength range in each pixel is the same, specifically, the light-emitting element 105 emits white light.

The light-transmitting electrode layer 112 can have either a single-layer structure or a layered structure, using a light-transmitting conductive film that transmits visible light. Examples of the conductive film that transmits visible light include a film containing a metal oxide such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added. Alternatively, a metal (e.g., silver) film that is thin enough to transmit light (preferably has a thickness of approximately greater than or equal to 5 nm and less than or equal to 30 nm) may be used.

Instead of the light-transmitting electrode layer 112, a semi-transmissive electrode layer (also referred to as a transflective electrode layer) having both a light-reflecting property and a light-transmitting property may be provided. The semi-transmissive electrode layer can be formed of, for example, a layered film of a metal thin film (preferably has a thickness of less than or equal to 20 nm, more preferably less than or equal to 10 nm) and the above-described light-transmitting metal oxide film. As the metal thin film, a film with a single-layer structure or a layered structure using silver, magnesium, or an alloy containing such a metal material can be used.

The use of the semi-transmissive electrode layer allows the light-emitting element 105 to have a micro-cavity structure. In a micro-cavity structure, part of light emission from the light-emitting layer 113 is repeatedly reflected between the reflective electrode layer 111 and the semi-transmissive electrode layer; accordingly, the intensity of light in a specific wavelength range can be increased by interference and extracted.

[Structure Example of Counter Substrate]

The counter substrate 102 includes a substrate 108, a plurality of structures 180, a black matrix 186, color filters 181, 182, and 183, and an overcoat 184. In addition, an anti-reflection film (AR film) 187 is provided on the side opposite to the color filter side of the counter substrate 102. The reason why the counter substrate 102 and the anti-reflection film 187 are described separately is that the anti-reflection film 187 is bonded after the substrates are divided in general.

The plurality of structures 180 are formed on the substrate 108. Each of the structures 180 preferably has a projecting shape. The plurality of structures 180 can have either a single-layer structure or a layered structure including two or more layers. The plurality of structures 180 are preferably formed using a photosensitive resin material such as photopolymer, photosensitive acrylic, or photosensitive polyimide. The plurality of structures 180 may be formed using an inorganic insulating material such as silicon oxide that can be formed by a CVD method, a sputtering method, or the like.

The black matrix 186 is in contact with the plurality of structures 180. Note that the black matrix is sometimes referred to as a light blocking layer. The black matrix 186 has a function of blocking light that enters the EL display device 100 through the substrate 108 and a function of blocking part of light emitted from the light-emitting layer 113 to suppress interference between adjacent pixels. The black matrix 186 may have a single-layer structure or a layered structure including two or more layers. Examples of a film of the black matrix 186 are a chromium film, a titanium film, a nickel film, a high molecular layer in which carbon black is dispersed.

The color filters 181 to 183 are adjacent to the black matrix 186. The color filters 181 to 183 are optical filter layers for converting the light (white light) emitted by the light-emitting layer 113 into light of different colors. For example, the use of red, green, and blue color filters as the color filter layers 181 to 183 allows the EL display device 100 to perform full-color display. A color filter may be provided on the substrate 107 side.

An overcoat 184 has functions of planarizing the surface of the counter substrate 102 and preventing diffusion of impurities (such as water and/or oxygen). The overcoat 184 can be formed using, for example, a polyimide resin, an epoxy resin, an acrylic resin, or the like.

The counter substrate 102 may be provided with a drying agent to prevent the light-emitting element 105 from deteriorating. For a similar purpose, a space 104 between the substrate 107 and the substrate 108 is preferably filled with an inert gas, such as a nitrogen gas or an argon gas, or a solid substance, such as a resin material. When the space 104 is filled with a material (e.g., resin) with a refractive index higher than that of the light-transmitting electrode layer 112, total reflection can be reduced at the interface between the light-transmitting electrode layer 112 and the space 104, leading to the increase in extraction efficiency of the light 106.

As the substrate 107, a substrate having heat resistance high enough to resist a fabricating process of the element substrate 101 can be used. As the substrate 108, a substrate having heat resistance high enough to resist a fabricating process of the counter substrate 102 can be used.

Examples of substrates that can be used as the substrates 107 and 108 include a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, and a polyimide substrate.

Supporting substrates (e.g., glass substrates) used in fabricating the element substrate 101 and the counter substrate 102 are separated, and flexible substrates may be attached with a bonding layer. A typical example of each of the flexible substrates is a plastic substrate. In addition, thin glass with a thickness of greater than or equal to 20 μm and less than or equal to 50 μm, metal foil, or the like can be used. The use of flexible substrates as the substrates 107 and 108 enables the EL display device 100 itself to be bent.

Therefore, in this specification and the like, a transistor can be formed using any of a variety of substrates, for example. The type of a substrate is not limited to a certain type. A semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

A flexible substrate may be used as the substrate, and the transistor may be provided directly on the flexible substrate. A separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

The structure of the black matrix having projections will be described in detail with reference to FIGS. 2A to 2E.

[Structure Example of Black Matrix]

FIGS. 2A and 2B are a planar view and a cross-sectional view of a structure example of the black matrix 186. FIGS. 2C to 2E are cross-sectional views of other structure examples of the black matrix 186.

FIG. 2A shows planar shapes and positions of the plurality of structures 180 on the substrate 108, the black matrix 186, and the color filters 181 to 183. Note that FIG. 2A shows the side of the substrate 108 where the black matrix 186 and the like are not formed, i.e., the reverse side of the substrate 108.

FIG. 2B is a cross-sectional view taken along dashed dotted line X-Y in FIG. 2A. As shown in FIGS. 2A and 2B, the black matrix 186 covers the plurality of structures 180 including a first structure 180a and a second structure 180b. The black matrix 186 thus has a plurality of projections in the surface that reflects the shape of the plurality of structures 180. As shown in FIG. 2A, the planar shape of the projection of the first structure 180a is different from that of the second structure 180b. In other words, the plurality of structures 180 have irregular planar shapes and thus the plurality of projections of the black matrix 186 also have irregular planar shapes.

It is not preferable that the planar shape of the structures 180 have rotational symmetry like a circle and a regular polygon. In particular, irregular planar shapes, such as a mottled pattern, a snakeskin pattern, a leopard pattern, and a marble pattern, can reduce interference fringes caused by reflection of outside light.

The plurality of structures 180 may be connected to each other as shown in FIG. 2C. Since the plurality of structures 180 includes a continuous region, can be favorably covered by the black matrix 186 formed thereon. When the structure 180 is formed of the same material as the black matrix 186, the structure 180 can have a function as a light blocking layer. It is preferable that the plurality of structures 180 have an island shape as shown in FIG. 2B. The projections of the black matrix 186 also have an island shape that reflects the plurality of island-shaped structures 180; thus, the effect of suppressing interference fringes can be increased.

It is preferable that the projections of the structures 180 each have a height (a thickness of the thickest part) of from 0.2 μm to 3 μm, more preferably from 1 μm to 2 μm.

The structure 180 is preferably tapered such that the thickness is gradually increased from the edge. When the structure 180 is tapered, the structure 180 can be sufficiently covered by the black matrix 186 formed thereon. The inclination (taper angle) of the structure 180 can be more than or equal to 2° and less than or equal to 80°, preferably more than or equal to 5° and less than or equal to 60°, more preferably more than or equal to 10° and less than or equal to 45°.

FIG. 2D shows an example in which the first structure 180a and the second structure 180b have different heights. The structures different in heights allow the height of projections of the black matrix 186 to vary from region to region; thus, the effect of inhibiting interference fringes can be increased.

FIG. 2E shows an example in which the first structure 180a and the second structure 180b are formed with a material having a refractive index different from that of the black matrix 186. It is particularly preferable that the refractive index of the material be larger than that of the black matrix 186. Note that the first structure 180a and the second structure 180b may be formed with the same material as the black matrix 186.

The structure 180 overlapping with one pixel preferably has a planar shape obtained by translational operation and rotational operation of the structure 180 overlapping with another pixel. For example, the planar shape of the structure 180 overlapping with one pixel is preferably obtained by rotating the structure 180 overlapping with another pixel 90°.

Next, the structure of a reflective electrode is described in detail with reference to FIGS. 3A to 3C.

[Structure Example of Reflective Electrode Layer (Reflective Electrode)]

Figure 3A:
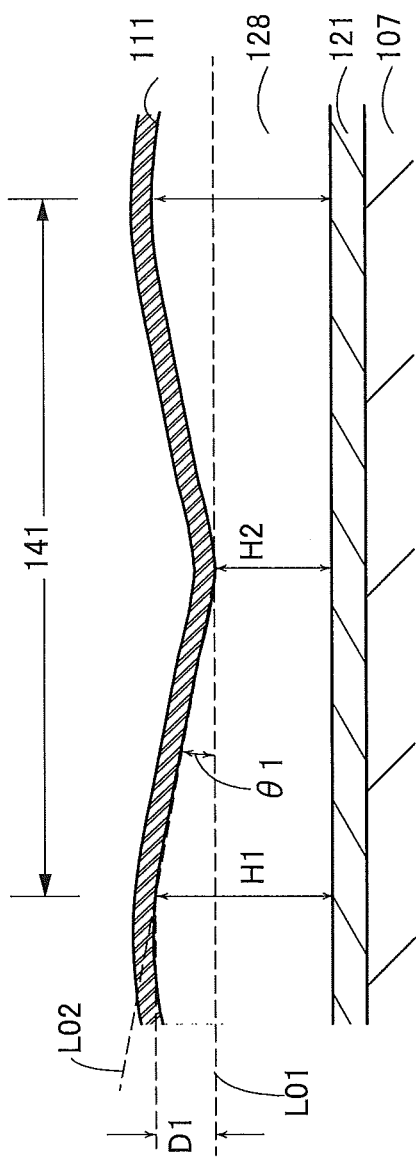
FIGS. 3A to 3C are a top view and a cross-sectional view of a structure example of a reflective electrode having a depression and a top view of an example of a planar shape of the depression.

FIG. 3A is a plan view illustrating a structure example of the reflective electrode layer 111. FIG. 3B is a cross-sectional view thereof. FIG. 3C is a plan view illustrating an example of a planar shape of a depression formed in the surface of the reflective electrode layer 111.

The reflective electrode layer 111 has a plurality of depressions 141 reflecting the surface of the insulating layer 128. As illustrated in FIG. 3A, the plurality of depressions 141 are formed in a region 140 of the insulating layer 128. In FIG. 3A, the depressions 141 are formed only in a region of the insulating layer 128 in which the light-emitting element 105 is stacked. The region 140 includes the whole region of the insulating layer 129 in which the opening 130 is formed.

An opening 142 is formed in the insulating layer 128. The reflective electrode layer 111 is connected to the transistor 109 through the opening 142 (see FIG. 1). The opening 142 is out of the region 140 in order to prevent poor connection between the reflective electrode layer 111 and the transistor 109 in the opening 142 (see FIG. 1 and FIG. 3A).

Note that the reflective electrode layer 111 preferably has a curved surface due to the depressions 141. This is because a too large difference in height of the surface of the reflective electrode layer 111 makes it difficult to form the light-emitting layer 113 on the reflective electrode layer 111 and leads to a reduction in extraction efficiency of the light 106 to the outside of the substrate 108. For this reason, a depth D1 of the depression 141 is, for example, greater than or equal to 0.2 μm and less than or equal to 1.5 μm, and is preferably greater than or equal to 0.2 μm and less than or equal to 1.2 μm.

A tilt angle θ1 of the depression 141 is greater than or equal to 2° and less than or equal to 15°, preferably greater than or equal to 2° and less than or equal to 12°.

The depth D1 and the tilt angle θ1 of the depression 141 will be described with reference to FIG. 3B. The depth D1 can be calculated from a thickness difference of the insulating layer 128 in the depression 141 between a thickness H1 of the thickest portion (referred to as a mountain of the depression) and a thickness H2 of the thinnest portion (referred to as a valley of the depression). That is, D1=H1−H2 is satisfied.

The tilt angle θ1 is formed by extension lines L01 and L02 in the cross section of the reflective electrode layer 111. The extension line L01 in the cross section of the reflective electrode layer 111 is a straight line that passes through the bottom of the valley of the depression 141 and is parallel to the surface of the substrate 107. The extension line L02 is a straight line that passes through the top of the mountain and the bottom of the valley of the depression 141.

The size of the planar shape of the depression 141 is, depending on the size of the region 140 (the reflective electrode layer 111 in the region 140), greater than or equal to 5 μm and less than or equal to 30 μm. Note that the size of the depression 141 can be determined by a diameter φ1 of a circumcircle Cir01 of the depression 141 as illustrated in FIG. 3C and by a distance between the top of a mountain and that of the others of the depression 141 in the cross section of the reflective electrode layer 111. When the depressions 141 are too small, the light 106 is scattered by the surface of the reflective electrode layer 111, decreasing extraction efficiency of the light 106; whereas when the depressions 141 are too large, an effect of inhibiting interference fringes is hardly achieved.

The size of the depression 141 including the border of the region 140, like a depression 141a, may be less than or equal to 10 μm. The proportion of depressions with a size of greater than 10 μm and less than 30 μm among the plurality of depressions 141 in the region 140 of one reflective electrode layer 111 is higher than or equal to 60%.

Although the shapes and sizes of the plurality of depressions 141 are different from each other as illustrated in FIG. 3A, the depressions 141 are preferably arranged at the same density among the plurality of reflective electrode layers 111. For example, the proportion of the total area of the depressions 141 to the area of the region 140 (or the opening 130) is higher than or equal to 30% and lower than or equal to 70%, preferably higher than or equal to 40% and lower than or equal to 60%.

Figure 3B:
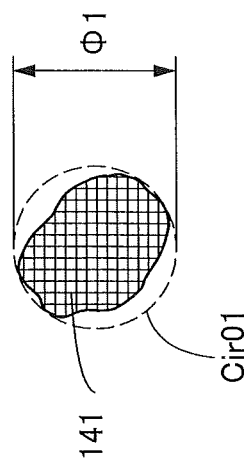
Figure 3C:
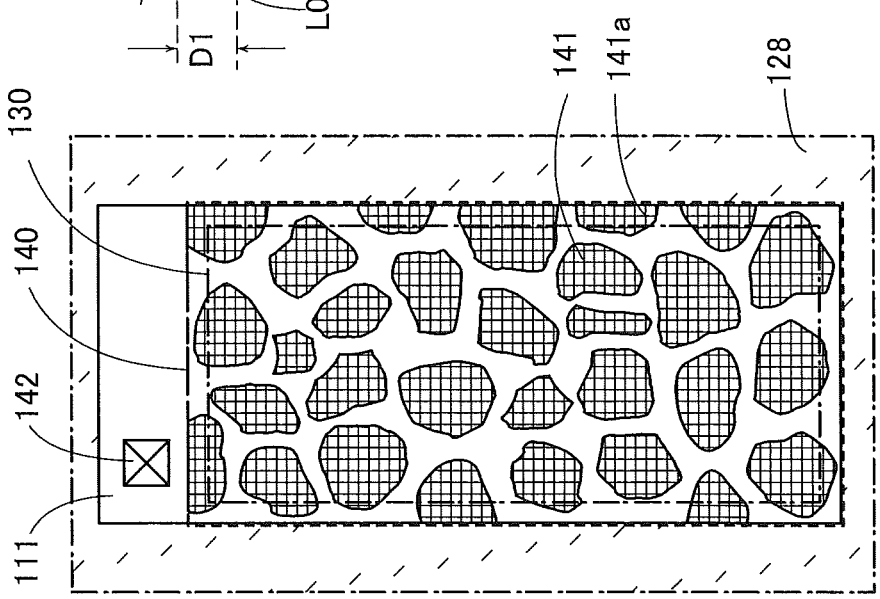

The surface of the reflective electrode layer 111 has the plurality of depressions 141 whose shapes and sizes are different from each other as illustrated in FIGS. 3A to 3C; thus, the projections and depressions of the surface of the reflective electrode layer 111 can be provided in irregular shapes and sizes. This can inhibit interference of light reflected by the plurality of reflective electrode layers 111 in the pixel region, and can make interference fringes on the screen of the EL display device 100 unlikely appear.

The thickness of the reflective electrode layer 111 is approximately several hundred nm, for example. Thus, the depressions formed in the insulating layer 128 should have shapes similar to those of the depressions 141 in order that the depressions 141 be formed in the above-described manner. Therefore, the shapes of the depressions 141 shown in FIGS. 3A to 3C can be applied to that of the insulating layer 128.

A method for forming projections and depressions in the surface of the reflective electrode layer 111 is not limited to the method of forming a plurality of depressions in the surface of the insulating layer 128. There is another method in which a conductive film to be the reflective electrode layer 111 is formed on the insulating layer 128 having a flat surface and then a plurality of depressions or projections are formed in the surface of the conductive film.

This embodiment can increase irregularity of the surface shape of the reflective electrode of the light-emitting element, leading to inhibition of interference fringes and reflection of images due to outside light reflected by the display of the EL display device. The projections on the surface of the black matrix can also inhibit interference fringes and reflection of images due to outside light.

This embodiment can be implemented in appropriate combination with any of the structures described in the other embodiments.

Embodiment 2

Embodiment 2 describes a structure of an active matrix EL display device in detail.

Figure 4:
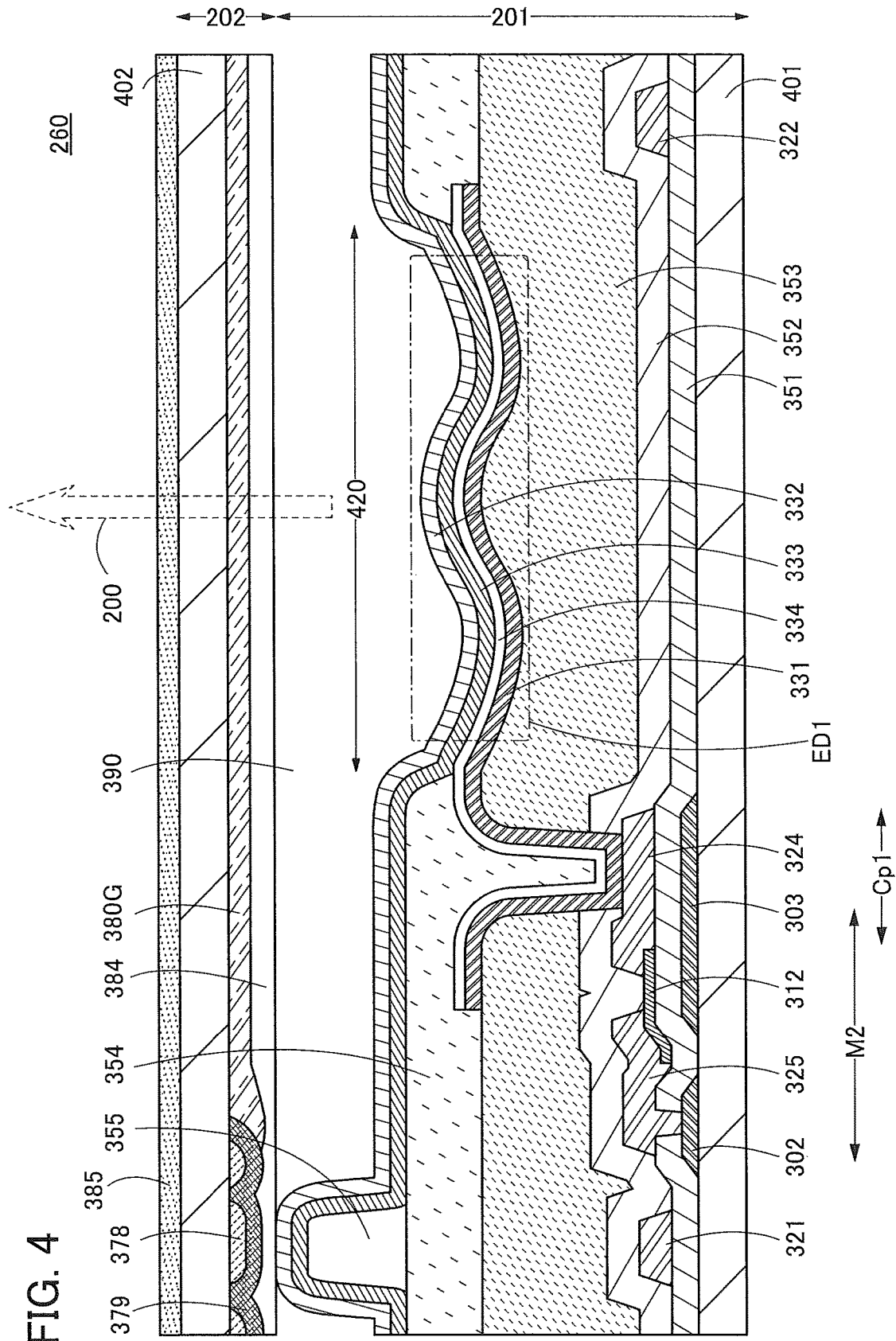
FIG. 4 is a cross-sectional view showing a structure example of a display device.
Figure 5:
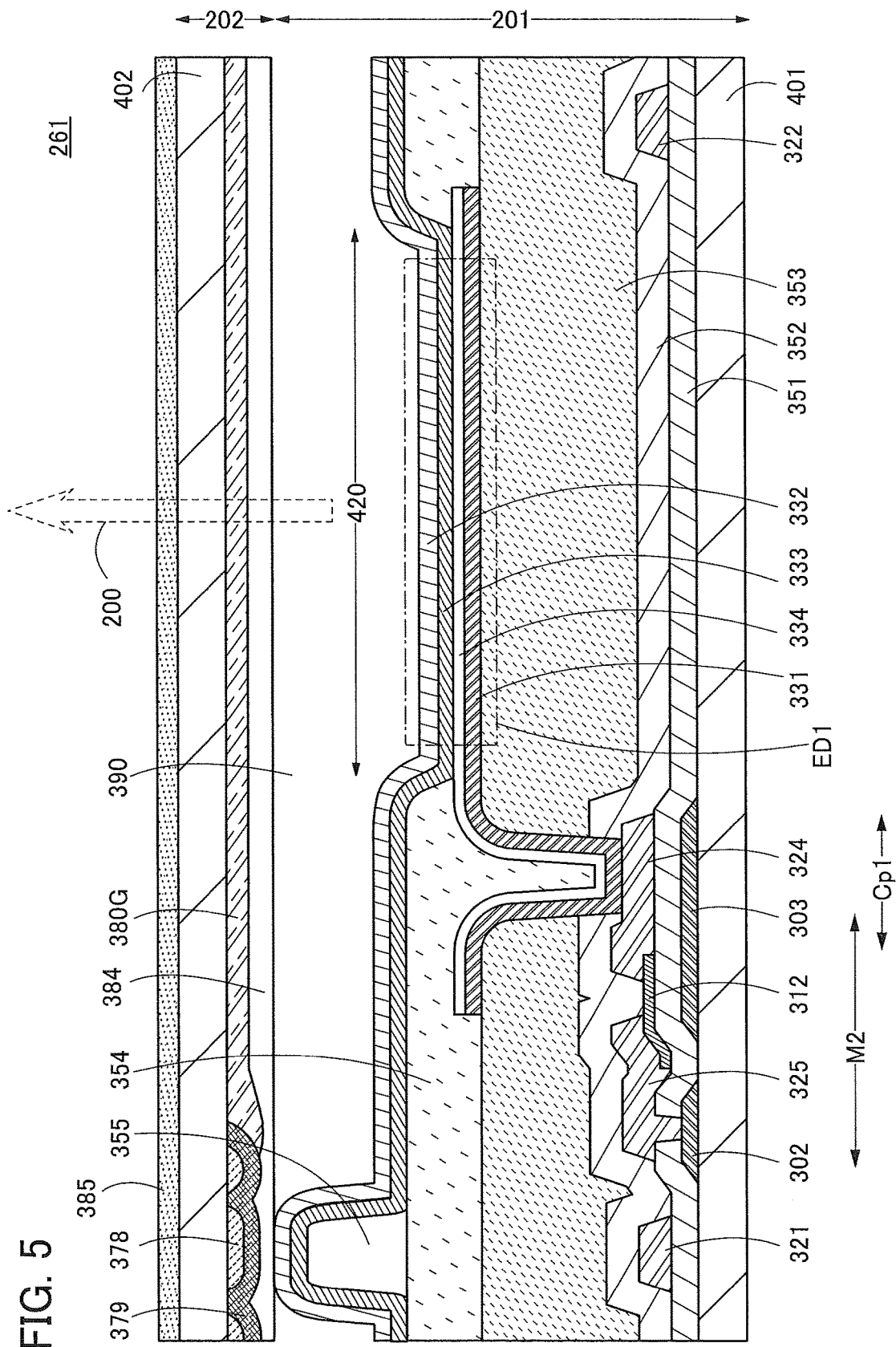
FIG. 5 is a cross-sectional view showing a structure example of a display device.
Figure 20A:
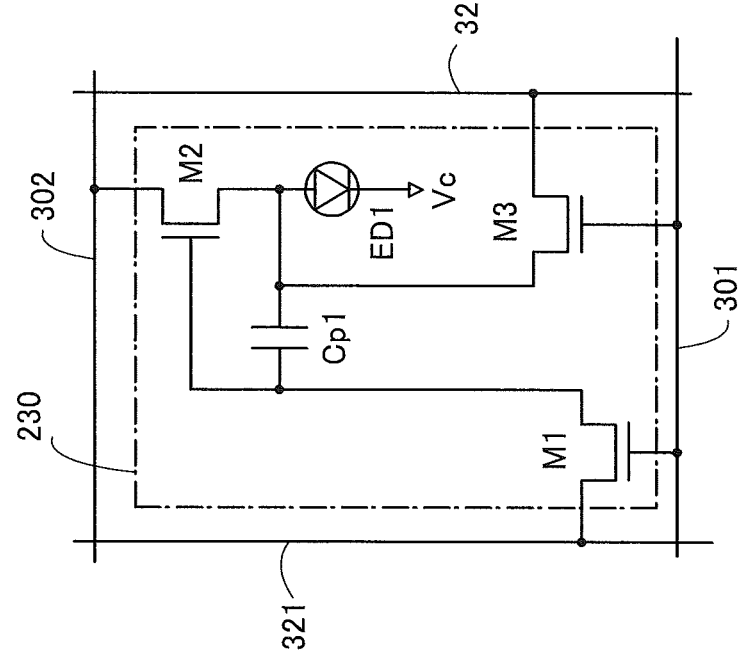
FIGS. 20A and 20B are a circuit diagram showing a configuration example of a pixel circuit and a plan view showing an example of planar layout of the pixel circuit, respectively.
Figure 20B:
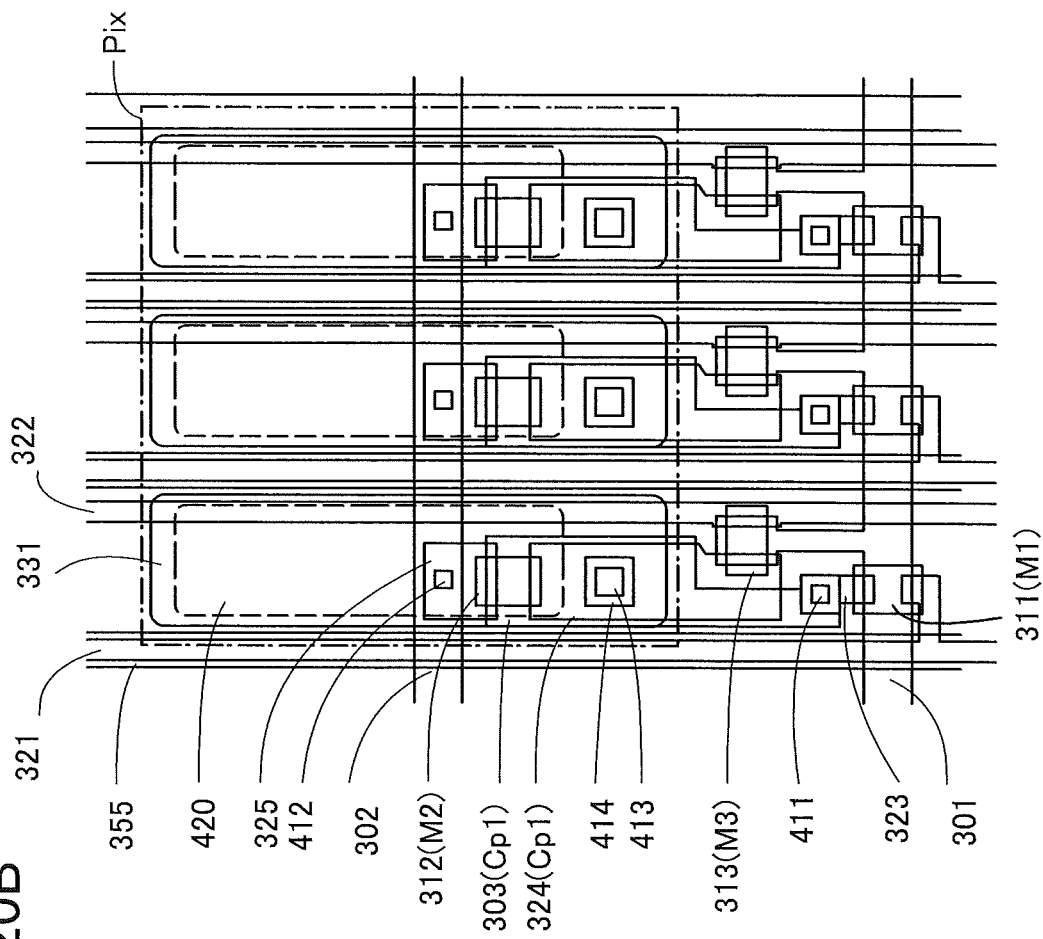

FIG. 4 and FIG. 5 are cross-sectional views each illustrating a structure example of an EL display device. FIG. 20A is a circuit diagram illustrating a configuration example of a pixel circuit. FIG. 20B is a planar layout diagram of the pixel circuit.

As shown in FIG. 4, an EL display device 260 is similar to the EL display device 100 (FIG. 1) and includes an element substrate 201 and a counter substrate 202. The counter substrate 202 is fixed to the element substrate 201 with a sealant (not illustrated). The EL display device 260 has a top-emission structure like the EL display device 100. A light 200 from a pixel region is emitted from the counter substrate 202 side.

A light-emitting layer which emits white light is included in a light-emitting element in the pixel region, and the counter substrate 202 is provided with a color filter so that full-color display can be performed. Note that a method for performing full-color display is not limited to this.

A circuit mounted on the element substrate 201 includes transistors of a single conductivity type; the transistors in this embodiment are all n-channel transistors. The transistors formed in the element substrate 201 in this embodiment are all transistors in which a channel is formed in oxide semiconductor layer. Hereinafter, such a transistor is referred to as an OS transistor.

[Example of Structure of Pixel Circuit]

The pixel region of the EL display device is provided with a plurality of gate lines 301 (hereinafter also referred to as GLs 301), a plurality of source lines 321 (hereinafter also referred to as SLs 321), power supply lines 302 (hereinafter also referred to as ANLs 302); and power supply lines 322 (hereinafter also referred to as PYLs 322).

The pixel circuit 230 includes an light-emitting element ED1 (hereinafter also simply referred to as ED1), three transistors (M1, M2, and M3), and one capacitor Cp1 (see FIG. 20A). The transistor M1 is a switch that controls conduction between the pixel circuit 230 and the SL 321. A gate of the transistor M1 is connected to the GL 301, a drain of the transistor M1 is connected to the SL 321, and a source of the transistor M1 is connected to a gate of the transistor. M2. The transistor M2 functions as a current source of ED1. A drain of the transistor M2 is connected to the ANL 302, and a source of the transistor M2 is connected to an anode of ED1. The capacitor Cp1 is connected between the gate of the transistor M2 and the anode of ED1. The transistor M3 has a function of keeping the voltage of the anode of ED1 when the transistor M1 is on. A gate of the transistor M3 is connected to the GL 301, a drain of the transistor M3 is connected to the anode of ED1, and a source of the transistor M3 is connected to the PVL 322.

Here, for easy understanding of the function of the pixel circuit 230, the source and the drain of the transistors M1 to M3 are distinguished from each other. However, the source and the drain of the transistor may be interchanged with each other depending on the voltage applied to the transistor. Thus, a distinction between a source and a drain of a transistor in one embodiment of the present invention is not limited to the distinction between the source and the drain of the transistor in this embodiment. Here, the circuit includes n-channel transistors; therefore, a terminal (electrode) to which a high-level signal and high power supply voltage are mainly input is referred to as a drain, and a terminal (electrode) to which a low-level signal and low power supply voltage are mainly input is referred to as a source.

Here, constant voltage as power supply voltage is applied to a cathode of ED1, the ANL 302, and the PVL 322. Positive voltage as high power supply voltage is applied to the ANL 302, and negative voltage as low power supply voltage is applied to the cathode of ED1 and the PVL 322. Note that power supply voltage applied to the cathode of ED1 is lower than power supply voltage applied to the PVL 322.

In the light-emitting display device 260, the light-emitting elements ED1 in all the pixel circuits 230 are light-emitting elements that emit white light and a color filter substrate is provided with a color filter of red, green, and blue (RGB), whereby full-color display is performed. Thus, a unit pixel (Pix) includes three pixel circuits 230 for RGB provided in the same row so as to be adjacent to each other. FIG. 20B corresponds to a planar layout of the unit pixel. FIG. 4 shows a cross section of the pixel circuit 230 in a cross section of the EL panel 260. FIG. 4 is not a cross-sectional view of the pixel circuit 230 taken along a specific line but a view for illustrating the layered structure of the pixel circuit 230. In FIG. 4, the transistor M2, the capacitor Cp1, and ED1 are illustrated.

[Example of Manufacturing Method of Element Substrate]

Structures and fabricating methods of the pixel circuits 230 will be described below with reference to FIG. 4, FIGS. 20A and 20B, FIGS. 21A and 21B, FIGS. 22A and 22B, and FIGS. 23A and 23B. Note that a source driver and a gate driver are also formed over the element substrate 201 in a fabricating process of the pixel circuit 230. Therefore, transistors and capacitors with structures similar to those of the transistor and the capacitor in the pixel circuit 230 are formed in the drivers. The element substrate 201 can be formed in a manner similar to that of the element substrate 101.

[Transistor and Capacitor]

Figure 21A:
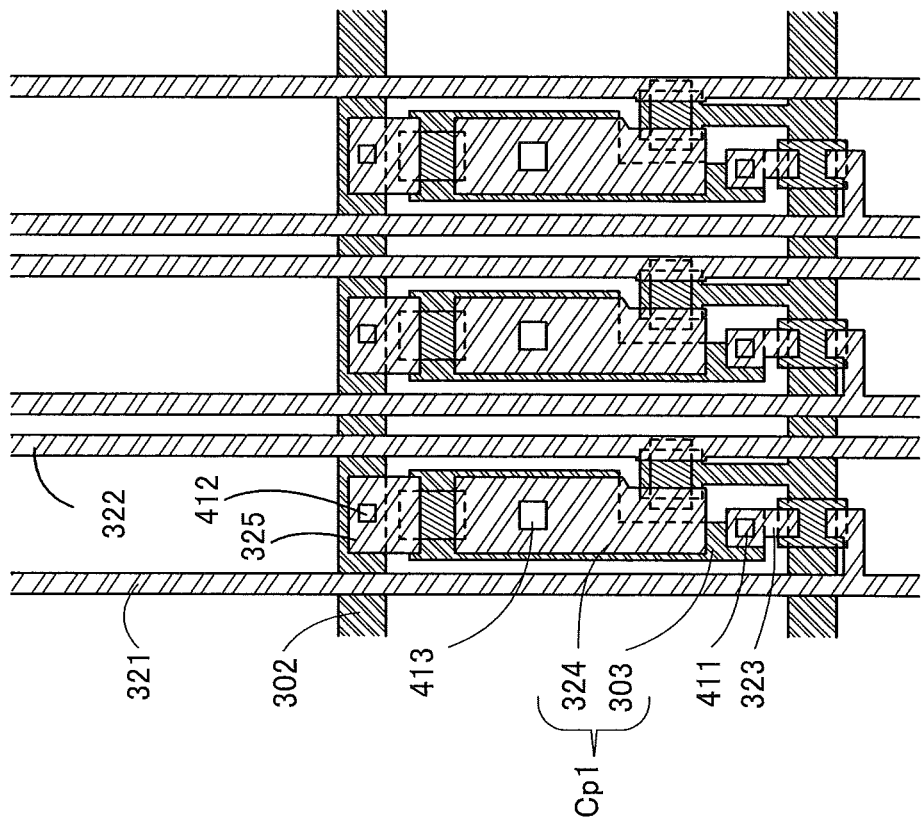
FIGS. 21A and 21B are plan views showing an example of a manufacturing method of a pixel circuit.

First, wirings and an electrode (the GL 301, the ANL 302, and an electrode 303) in a first layer are formed over a substrate 401 (FIG. 21A). The electrode 303 forms the gate electrode of the transistor M2 and a terminal (electrode) of the capacitor Cp1. The wirings and electrode (301, 302, and 303) in a first layer are formed using a conductive film with a single-layer structure or a layered structure including two or more layers. Examples of such a conductive film include a metal film of aluminum, chromium, copper, tantalum, titanium, molybdenum, tungsten, or the like, any of the metal films to which another metal element is added, an alloy film containing one or more kinds of the above metal elements, and a compound film containing one or more kinds of the above metal elements. For example, a tungsten film is formed to a thickness in the range from 180 nm to 250 nm by a sputtering method, and this tungsten film is processed in photolithography and etching steps to form the wirings and electrode (301 to 303) in the first layer.

Then, an insulating layer 351 is formed so as to cover the wirings and electrode (301 to 303) in the first layer (FIG. 4). The insulating layer 351 forms gate insulating layers in the transistors M1 to M3. The insulating layer 351 can have either a single-layer structure or a layered structure. Examples of a film that can be used for the insulating layer 351 include oxide films such as a silicon oxide film, an aluminum oxide film, and a hafnium oxide film, nitride films such as a silicon nitride film and aluminum nitride film, oxynitride films such as a silicon oxynitride film and an aluminum oxynitride film, and nitride oxide films such as a silicon nitride oxide film and an aluminum nitride oxide film.

Note that in this specification, oxynitride refers to a substance that contains more oxygen than nitrogen, and nitride oxide refers to a substance that contains more nitrogen than oxygen.

For example, for the insulating layer 351, a silicon nitride film with a thickness in the range from 300 nm to 450 nm and a silicon oxynitride film with a thickness in the range from 20 nm to 100 nm are formed. Note that the silicon nitride film may be formed to have a layered film by performing a step of forming a silicon nitride film two or more times.

An oxide semiconductor layer 311, an oxide semiconductor layer 312, and an oxide semiconductor layer 313 are limited over the insulating layer 351 (FIG. 21A). An oxide semiconductor film with a single-layer structure or a layered structure including two or more layers are formed by a sputtering method, a coating method, a pulsed laser deposition method, a laser ablation method, or the like. As the oxide semiconductor film, a semiconductor film containing a metal oxide such as an In—Ga oxide, an In—Zn oxide, an In-M-Zn oxide (M is Al, Ti, Ga, Y, Zr, La, Ce, Nd, or Hf) can be firmed.

Then, openings 411 and 412 are formed in the insulating layer 351 in photolithography and etching steps (FIG. 21A). The opening 411 is formed to connect the transistor M1 and the capacitor Cp1. The opening 412 is formed to connect the transistor M2 and the ANL 302.

Figure 21B:
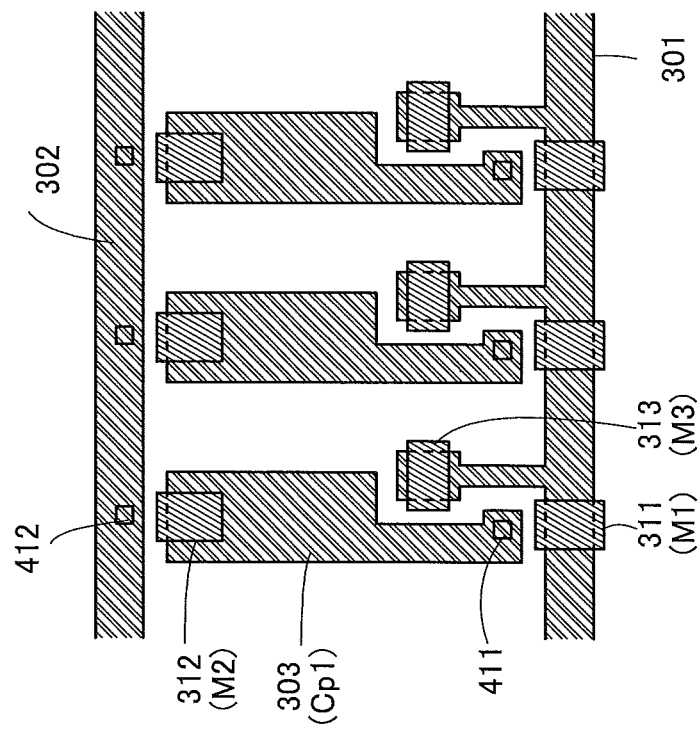

Wirings and electrodes (the SL 321, the PVL 322, an electrode 323, an electrode 324, and an electrode 325) in a second layer are formed over the insulating layer 351 (FIG. 21B). The wirings and electrodes (321 to 325) in the second layer can be formed in a manner similar to that of the wirings and electrode (301 to 303) in the first layer. For example, a copper film is formed by a sputtering method and then processed in photolithography and etching steps, so that the wirings and electrodes (321 to 325) in the second layer are formed. Alternatively, the wirings and electrodes (321 to 325) in the second layer may be formed using a film having a three-layer structure of a titanium film, an aluminum film, and a titanium film.

The electrode 323 forms a source electrode of the transistor M1. The electrode 324 forms a drain electrode of the transistor M2 and an electrode (terminal) of the capacitor Cp1. A region where the insulating layer 351, the electrode 303, and the electrode 324 overlap with each other focus the capacitor Cp1 that uses the insulating layer 351 as a dielectric (FIG. 4).

Through the above steps, the transistors M1 to M3 and the capacitor Cp1 are formed.

[Light-Emitting Element]

Next, an insulating layer 352 is formed so as to cover the transistors M1 to M3 and the capacitor Cp1 (FIG. 4). The insulating layer 352 can be formed in a manner similar to that of the insulating layer 351. For example, a film having a three-layer structure of a silicon oxynitride film, a silicon oxynitride film, and a silicon nitride film is formed for the insulating layer 352. Then, the opening 413 is formed in the insulating layer 352 so as to reach the electrode 324 (FIG. 21B).

Figure 22A:
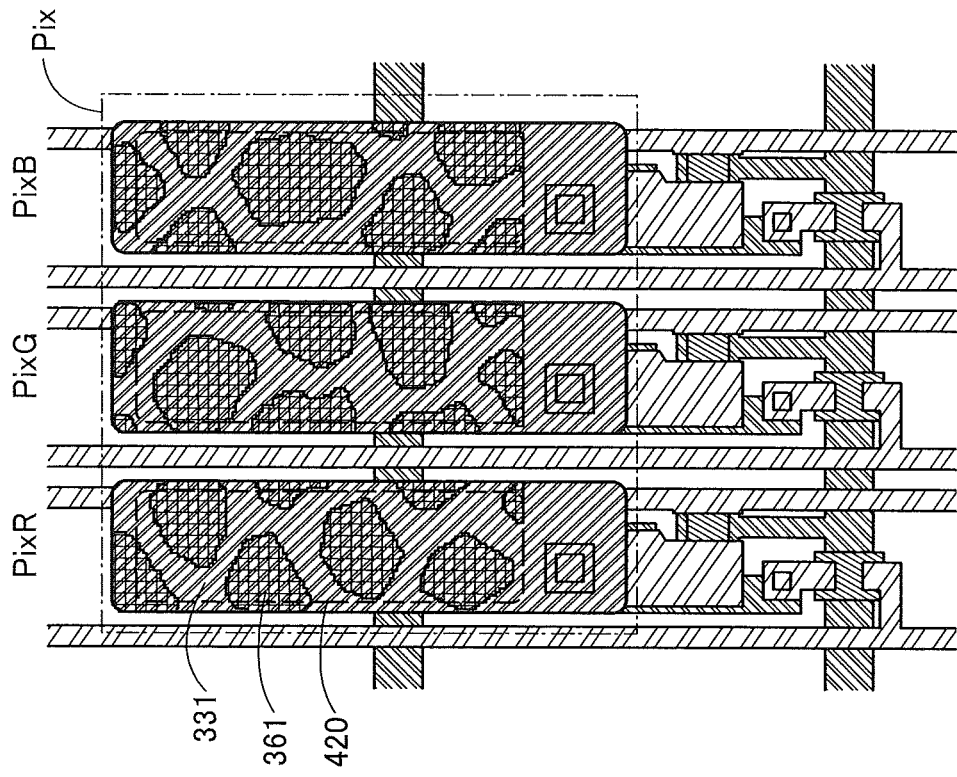
FIGS. 22A and 22B are plan views showing an example of a manufacturing method of a pixel circuit.

The insulating layer 353 is formed so as to cover the insulating layer 352 (FIG. 4). Here, a plurality of depressions are formed in the insulating layer 353 like in the insulating layer 128 (see FIG. 1 and FIGS. 2A to 2C). Thus, here, the insulating layer 353 is formed using a photosensitive resin material that can be easily processed (e.g., photopolymer, photosensitive acrylic, or photosensitive polyimide). An opening 414 is formed in the insulating layer 353 to connect ED1 and the electrode 324 (FIG. 22A).

For example, the insulating layer 353 may be formed by performing an exposure step and a development step of a photosensitive resin material twice. First, a positive photosensitive resin material is applied to a surface of the insulating layer 352. Then, the photosensitive resin material is subjected to exposure treatment using a photomask that exposes a portion where the opening 414 is formed, and after that, development and baking steps are performed, so that a lower layer of the insulating layer 353 is framed. A positive photosensitive resin material is applied again and exposure, development, and baking steps are performed, whereby an upper layer of the insulating layer 353 is formed. A photomask that allows openings 414 and depressions 361 to be exposed to light is used in the second exposure step.

Through such steps, the insulating layer 353 having the depressions 361 is formed. As illustrated in FIG. 22A, a region 360 where the depressions 361 are formed and a region where a reflective electrode layer 331 serves as a cathode of ED1 overlap with each other. Here, the depressions 361 are not formed in a region of the insulating layer 353 that does not overlap with the reflective electrode layer 331.

Here, a unit pixel Pix includes three pixels of red, green, and blue (RGB) (PixR, PixG, and PixB). The planar shapes of all the depressions 361 in three regions 360 included in the unit pixel Pix are different from each other. By thus forming the plurality of depressions 361, the surface shapes of the reflective electrode layers 331 that are adjacent to each other in the column direction can be different from each other. Therefore, when all the reflective electrodes in the pixel region are regarded as one mirror surface, irregularity of the surface shape of the mirror surface can be increased. The planar shapes and arrangement of the depressions 361 are determined in terms of the unit pixel Pix, whereby a photomask for forming the depressions 361 in the insulating layer 353 can be easily designed even when the EL panel 260 is increased in area or density.

Figure 22B:
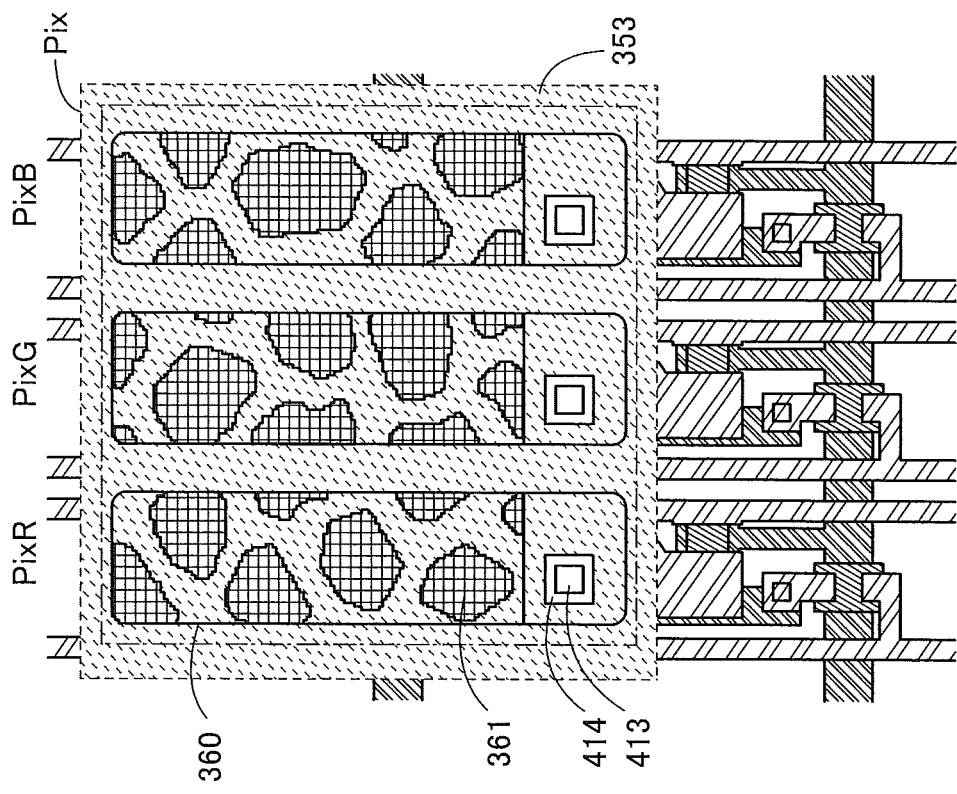

Next, the reflective electrode layer 331 is formed over the insulating layer 353 (FIG. 4 and FIG. 22B). Here, for example, a metal film with a three-layer structure of a titanium film, an aluminum film, and a titanium film is formed, and this metal film is processed in photolithography and etching steps to form the reflective electrode layer 331. Alternatively, the reflective electrode layer 331 may be formed using a stack of a silver film and an indium tin oxide film to which silicon oxide is added. The surface shape of the reflective electrode layer 331 reflects the surface shape of the insulating layer 353; thus, the plurality of depressions 361 are formed in the surface of the reflective electrode layer 331.

A light-transmitting conductive layer 334 is formed over the reflective electrode layer 331 (FIG. 4). Here, a semi-transmissive electrode is provided as the cathode of ED1 to form a micro-cavity structure. The light-transmitting conductive layer 334 functions as an adjustment layer that adjusts the optical path length between the reflective electrode layer 331 and a semi-transmissive layer 332. The thickness of the light-transmitting conductive layer 334 is adjusted in accordance with color of light extracted from the pixel. Here, the unit pixel PIX includes the three pixels of red, green, and blue (RGB) (PixR, PixG, and PixB); therefore, the thickness of the light-transmitting conductive layer 334 is adjusted in accordance with the wavelength range of light of RGB. The surface of the light-transmitting conductive layer 334 is has an irregular shape similar to that of the reflective electrode layer 331.

The insulating layer 354 including an opening 420 is formed using a photosensitive resin material so as to cover the reflective electrode layer 331 and the light-transmitting conductive layer 334. The opening 420 and the region 360 of the reflective electrode layer 331 in which the depressions 361 are formed overlap with each other (FIG. 4 and FIG. 22B).

Figure 23B:
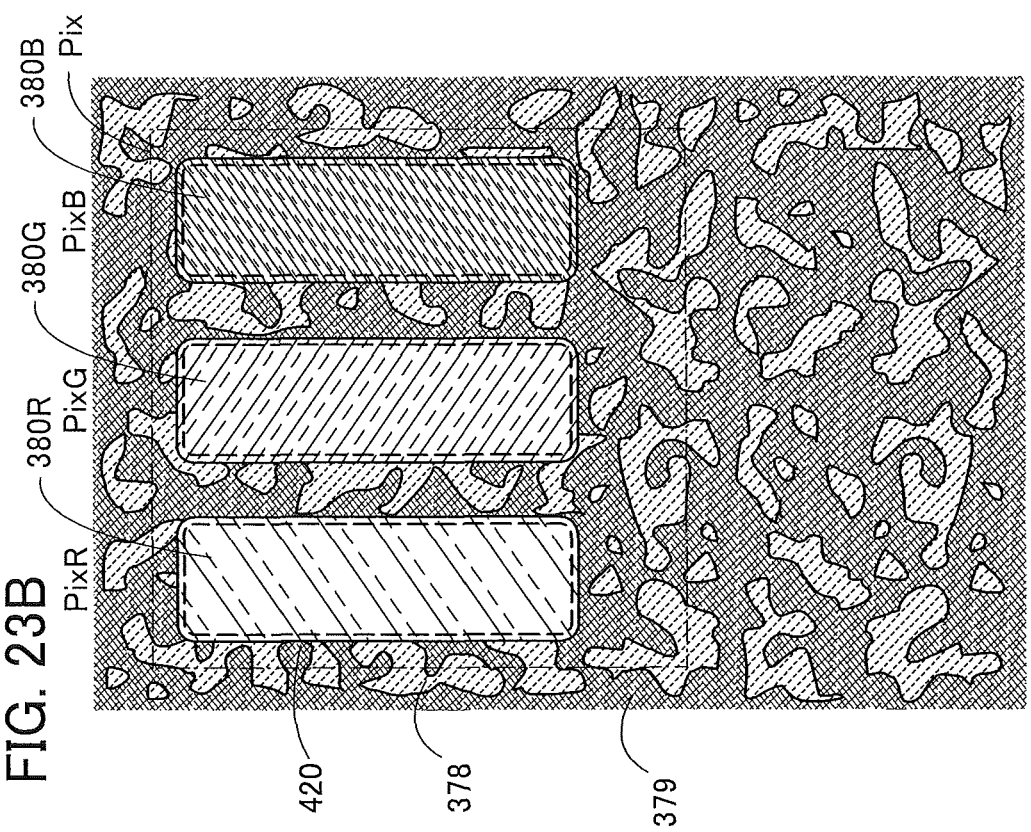
FIGS. 23A and 23B are plan views showing an example of a fabricating method of a pixel circuit.
Figure 23A:
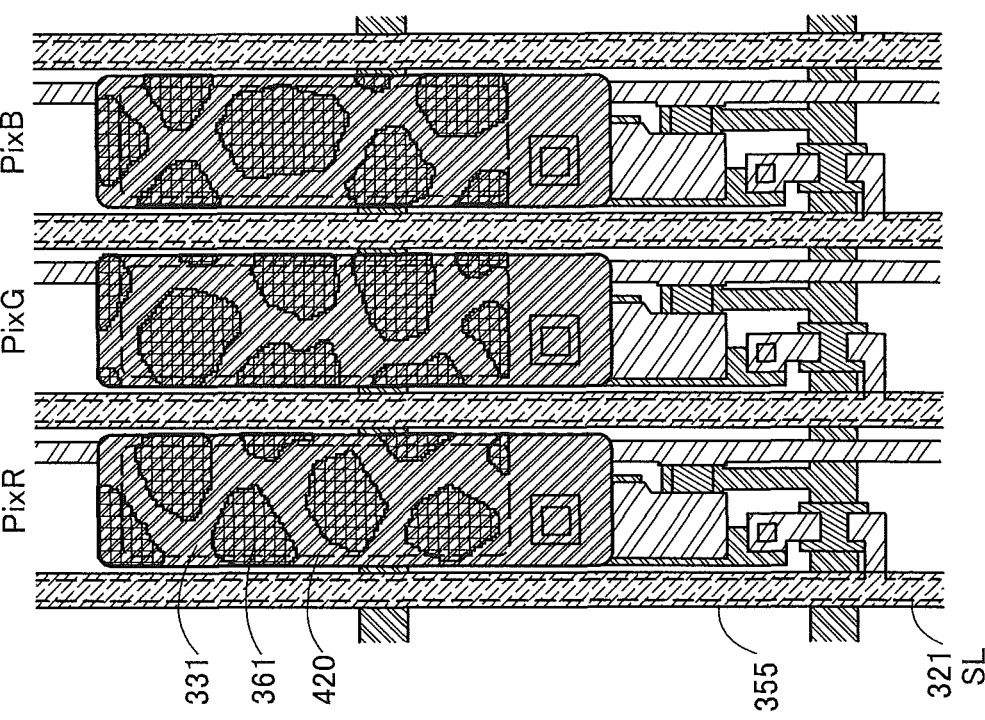

The insulating layer 355 serving as a spacer is formed over the insulating layer 354 (FIG. 4 and FIG. 23A). The insulating layer 355 is formed using a photosensitive resin material. In this example, the insulating layer 355 is formed in a region that overlaps with the SL 321, as illustrated in FIG. 23A.

A light-emitting layer 333 and the semi-transmissive conductive layer 332 are formed so as to cover the insulating layer 353 and the insulating layer 354. The semi-transmissive conductive layer 332 is shared by all the pixel circuits 230 and functions as the cathode of ED1. A portion where the reflective electrode layer 331, the light-transmitting conductive layer 334, the light-emitting layer 333, and the semi-transmissive conductive layer 332 are stacked in the opening 420 functions as ED1.

The element substrate 201 is completed through the above steps.
[Counter Substrate]
The counter substrate 202 can be formed in a similar manner to the counter substrate 102. A plurality of structures 378 are formed on the substrate 402. A black matrix 379 covers the plurality of structures 378. The black matrix 379 has a projecting shape reflecting the shape of the plurality of structures 378.

Color filters 380R, 380G, and 380B corresponding to R, G, and B are formed. As illustrated in FIG. 23B, the color filters 380R, 380G, and 380B are arranged in stripes.

An overcoat 384 in contact with the color filters 380R, 380G, and 380B may be formed as in the counter substrate 102.

The counter substrate 202 is completed through these steps. After that, the counter substrate 202 is bonded to the element substrate 201 with a sealant, and then, the element substrate 201 and the counter substrate 202 are divided. An anti-reflection film 385 is formed on the side of the counter substrate 202 opposite to the side where the color filters 380R, 380G, and 380B are formed. An FPC is mounted to a terminal of the element substrate 201. Through such necessary assembly steps, the EL display device 260 is completed.

As needed, a space 390 between the element substrate 201 and the counter substrate 202 may be filled with an inert gas, such as a nitrogen gas or an argon gas, an inert liquid, or a resin material.

In this specification and the like, an active matrix method in which an active element is included in a pixel or a passive matrix method in which an active element is not included in a pixel can be used for an EL display device.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Since the size of the element is small, the aperture ratio can be improved, so that power consumption can be reduced or higher luminance can be achieved.

Other than an active matrix display device, a passive-matrix display device, in which an active element (non-linear element) is not used, can also be used. Since an active element (a non-linear element) is not used, the number of manufacturing steps is small, so that manufacturing cost can be reduced or yield can be improved. Since an active element (a non-linear element) is not used, the aperture ratio can be improved, so that power consumption can be reduced or higher luminance can be achieved, for example.

This embodiment can be implemented in appropriate combination with any of the structures described in the other embodiments.

Embodiment 3

In Embodiment 3, another mode of an active matrix EL display device is described with reference to FIG. 5.

An EL display device 261 shown in FIG. 5 includes the black matrix 379 and the reflective electrode layer 331. The black matrix 379 has projections, and the reflective electrode layer 331 in the opening 420 does not have a depression. It is difficult to reduce reflection of outside light by the reflective electrode layer 331, but reflection of outside light by the black matrix 379 can be reduced.

Note that details are omitted because the EL display device 260 is the same as the EL display device 260 in FIG. 4 except for the shape of the insulating layer 353, the reflective electrode layer 331, the light-transmitting conductive layer 334, the light-emitting layer 333, and the semi-transmissive conductive layer 332 in the opening 420.

This embodiment can be implemented in appropriate combination with any of the structures described in the other embodiments.

Embodiment 4

Embodiment 4 describes structure examples of a touch sensor, a touch sensor module provided with a touch sensor, a touch panel, a touch panel module, and the like of one embodiment of the present invention. In the description below, a capacitive touch sensor is used as a touch sensor. A flexible touch panel is also included in one embodiment of the present invention.

Note that in this specification and the like, a device in which a connector such as an FPC or a tape carrier package (TCP) is attached to a substrate provided with a touch sensor, and a device in which an integrated circuit (IC) is directly mounted on a substrate by a chip on glass (COG) method can be referred to as a touch sensor module. A device having both a function as a touch sensor and a function of displaying an image or the like can be referred to as a touch panel (an input/output device). A device in which the connector is attached to a touch panel and a device on which an IC is mounted on a touch panel can be referred to as a touch panel module or simply referred to as a touch panel.

A capacitive touch sensor which can be used for one embodiment of the present invention includes a capacitor. For example, the capacitor can have a stacked-layer structure of a first conductive layer, a second conductive layer, and an insulating layer between the first conductive layer and the second conductive layer. The first conductive layer and the second conductive layer each function as an electrode of the capacitor. The insulating layer functions as a dielectric.

A more specific structure example of one embodiment of the present invention is described below with reference to drawings.

Structure Example

Figure 6A:
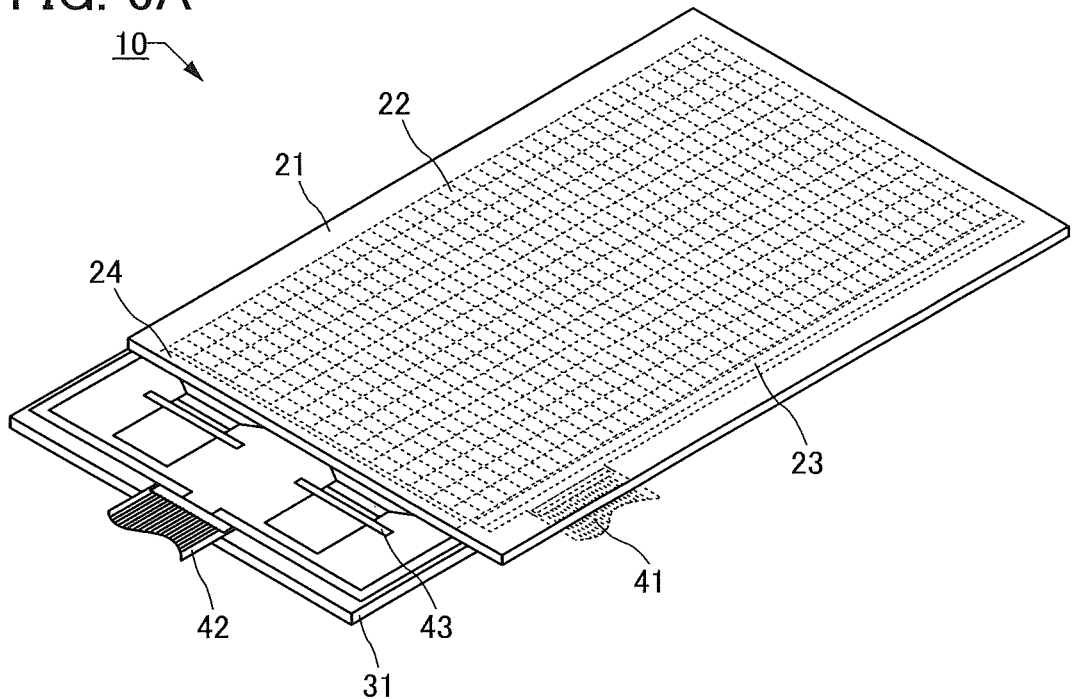
FIGS. 6A and 6B are perspective views showing a structure example of a touch panel.
Figure 6B:
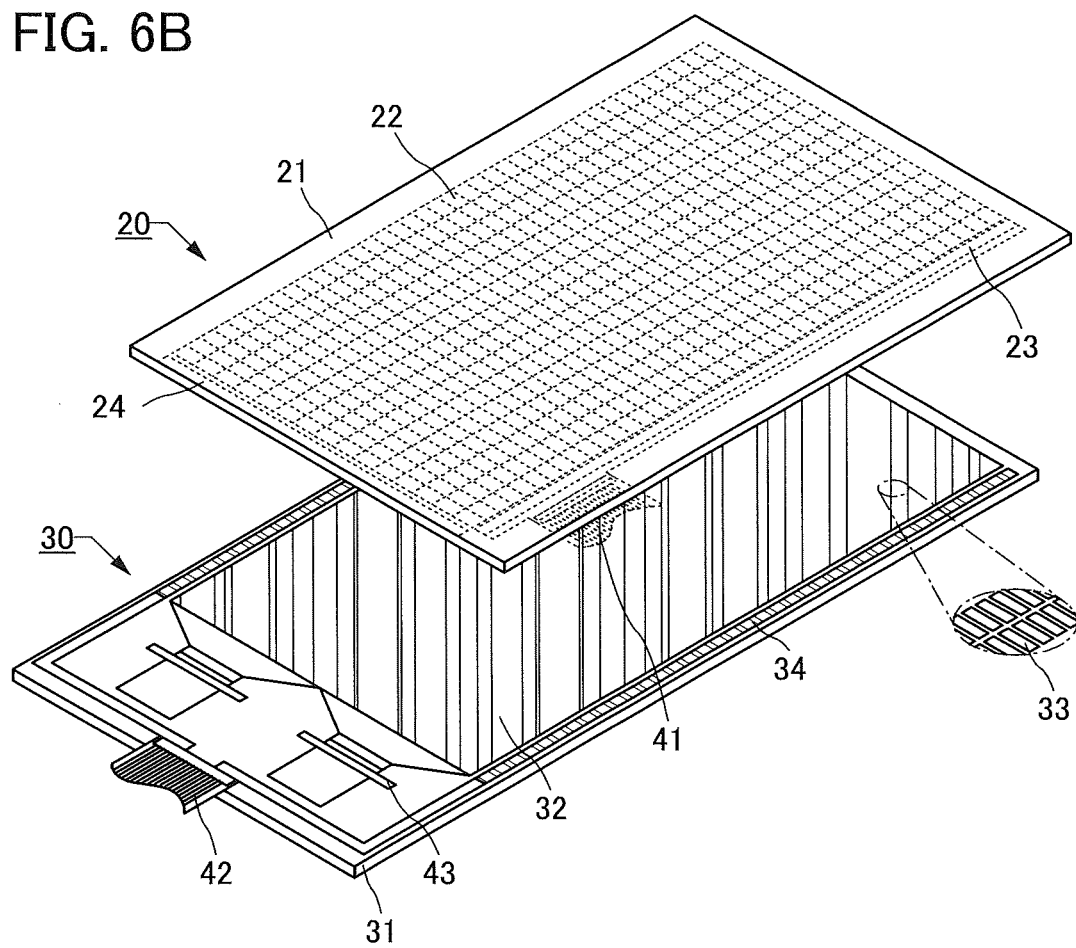

FIG. 6A is a schematic perspective view of a touch panel module 10 of one embodiment of the present invention. FIG. 6B is a developed schematic perspective view of the touch panel 10. The touch panel module 10 includes a touch sensor module 20 and a display panel 30 overlapping with each other.

The touch sensor module 20 includes a second substrate 21, sensor elements 22 over the second substrate 21, and an FPC 41. The touch sensor module 20 serves as a touch sensor. The plurality of sensor elements 22 are provided in a matrix on a first substrate 31 side of the second substrate 21. The second substrate 21 preferably includes circuits 23 and 24 electrically connected to the sensor elements 22. A circuit having a function of selecting a plurality of sensor elements 22 can be used for at least one of the circuits 23 and 24. A circuit having a function of outputting a signal from the sensor element 22 can be used for at least one of the circuits 23 and 24. The FPC 41 has a function of supplying a signal from the outside to at least one of the circuits 23 and 24 and the sensor element 22. The FPC 41 also has a function of outputting a signal from at least one of the circuits 23 and 24 and the sensor element 22 to the outside.

The display panel 30 includes a display portion 32 over the first substrate 31. The display portion 32 includes a plurality of pixels 33 arranged in a matrix. The first substrate 31 preferably includes a circuit 34 electrically connected to the pixel 33 in the display portion 32. For example, the circuit 34 functions as a gate driver circuit. An FPC 42 has a function of supplying a signal from the outside to at least one of the display portion 32 and the circuit 34. The first substrate 31 in FIG. 6 includes a terminal 43. An FPC can be attached to the terminal 43, an IC functioning as a source driver circuit can be directly mounted on the terminal 43 by a COG method or a COF method, or an FPC, a TAB, a TCP, or the like on which an IC is mounted can be attached to the terminal 43, for example. Note that an object in which an IC or a connector such as an FPC is mounted on the display panel 30 can be referred to as a display panel module.

The touch panel module 10 of one embodiment of the present invention can output positional information based on the change in capacitance that occurs when the touch panel module 10 is touched and that is sensed by the plurality of sensor elements 22. Image can be displayed on the display portion 32.

Cross-Sectional Structure Example 1

FIG. 7A is a cross-sectional schematic view of a touch panel module of one embodiment of the present invention. In the touch panel illustrated in FIG. 7A, an active matrix touch sensor and an active matrix display element are provided between a pair of substrates, and thus, the touch panel can have a small thickness. Note that in this specification and the like, a touch sensor in which sensor elements each include an active element is referred to as an active matrix touch sensor.

The touch panel module has a structure in which the second substrate 21 and the first substrate 31 are bonded to each other with a bonding layer 720. The second substrate 21 includes a capacitor 770, a transistor 751, a transistor 752, a contact portion 753, a color filter 774, a black matrix 775, and the like. The first substrate 31 includes transistors 701, 702, and 703, a light-emitting element 704, a contact portion 705, and the like.

An insulating layer 712, an insulating layer 713, an insulating layer 714, an insulating layer 715, an insulating layer 716, an insulating layer 717, an insulating layer 718, a spacer 719, a conductive layer 725, and the like are provided over the first substrate 31 with a bonding layer 711 provided therebetween.

The first substrate 31 may have flexibility. The second substrate 21 may have flexibility. Owing to the first substrate 31 and the second substrate 21 having flexibility, a touch panel of one embodiment of the present invention shown in FIGS. 7A and 7B can have flexibility.

The light-emitting element 704 is provided over the insulating layer 717. The light-emitting element 704 includes a first electrode 721, an EL layer 722, and a second electrode 723 (see FIG. 7B). An optical adjustment layer 724 is provided between the first electrode 721 and the EL layer 722. The insulating layer 718 covers end portions of the first electrode 721 and the optical adjustment layer 724.

The first electrode 721 has a function as the reflection electrode layer 331 described in Embodiment 1. The second electrode 723 has a function as the semi-transmissive conductive layer 332 described in Embodiment 1. The optical adjustment layer 724 has a function as the light-transmitting conductive layer 334 described in Embodiment 1.

Since a plurality of depressions are formed in the insulating layer 717, depressions reflecting the surface shape of the insulating layer 717 is formed in the first electrode 721.

This can inhibit generation of interference fringes and reflection of images due to reflection of outside light in the display portion 32.

FIG. 7A shows the pixel 33 including the transistor 701 for controlling current and the transistor 702 for controlling switching. One of a source and a drain of the transistor 701 is electrically connected to the first electrode 721 through the conductive layer 725.

FIG. 7A shows the circuit 34 including the transistor 703 and the circuit 23 including the transistor 752.

In the example illustrated in FIG. 7A, the transistors 701 and 703 each have a structure in which a semiconductor layer where a channel is formed is provided between two gate electrodes. Such transistors can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can suppress display unevenness even in a display panel or a touch panel in which the number of wirings is increased because of increase in size or resolution.

Note that the transistor included in the circuit 34 and the transistor included in the pixel 33 may have the same structure. Transistors included in the circuit 34 may have the same structure or different structures. Transistors included in the pixel 33 may have the same structure or different structures. Transistors provided on the second substrate 21 side (the transistor 751, the transistor 752, and the like) may have the same structure or different structures.

The light-emitting element 704 has a top emission structure and thus emits light on the second electrode 723 side. The transistors 701 and 702, a capacitor, a wiring, and the like overlap with the light-emitting region of the light-emitting element 704, and an aperture ratio of the pixel 33 can be increased.

On the first substrate 31 side of the second substrate 21, a bonding layer 761, insulating layers 762, 763, 764, and 765, a first conductive layer 771, a dielectric layer 772, a second conductive layer 773, an insulating layer 766, a color filter 774, a black matrix 775, a plurality of structures 777, and the like are provided. In addition, an overcoat 767 covering the color filter 774 and the black matrix 775 may be provided.

The black matrix 775 is provided over the plurality of structures 777; thus, projections reflecting the surface shape of the structures 777 are formed in the black matrix 775. This can reduce generation of interference fringes and reflection of images due to reflection of outside light in the display portion 32.

The first conductive layer 771 is electrically connected to one of a source and a drain of the transistor 751.

The second conductive layer 773 is provided on the first substrate 31 side of the second substrate 21 and is in contact with the dielectric layer 772. Note that the second conductive layer 773 may have an opening.

By using a flexible material for the first substrate 31 and the second substrate 21, a flexible touch panel can be achieved.

A color filter method is employed in the touch panel of one embodiment of the present invention. In the color filter method, three pixels of red (R), green (G), and blue (B) express one color, for example. In addition, a pixel of white (W) or yellow (Y) may be used.

Owing to the combination of the color filter 774 and a microcavity structure using the optical adjustment layer 724, light with high color purity can be extracted from the touch panel of one embodiment of the present invention. The thickness of the optical adjustment layer 724 may be varied depending on the color of the pixel. Some pixels do not necessarily have the optical adjustment layer 724.

An EL layer that emits white light is preferably used as the EL layer 722 of the light-emitting element 704. By using the light-emitting element 704, it is not necessary to form the EL layers 722 expressing different colors in pixels. Therefore, the cost can be reduced, and the high resolution is achieved easily. Furthermore, by varying the thickness of the optical adjustment layer 724 in pixels, light with a wavelength suitable for each pixel can be extracted, which increases color purity. Note that the EL layers 722 expressing different colors may be formed in pixels, in which case the optical adjustment layer 724 are not necessarily used.

An opening is provided in the insulating layers and the like in a region overlapping with the contact portion 705 provided over the first substrate 31, and the contact portion 705 and the FPC 41 are electrically connected to each other with a connection layer 760 provided in the opening. Furthermore, an opening is provided in the insulating layers and the like in a region overlapping with the second substrate 21, and the contact portion 753 and the FPC 42 are electrically connected to each other through a connection layer 710 provided in the opening.

In the structure illustrated in FIG. 7A, the contact portion 705 has a conductive layer formed by processing a conductive film for the source electrode and the drain electrode of the transistor. Furthermore, the contact portion 753 has a stacked-layer structure of a conductive layer formed by processing a conductive film for the gate electrode of the transistor, a conductive layer formed by processing a conductive film for the source electrode and the drain electrode of the transistor, and a conductive layer formed by processing a conductive film for the second conductive layer 773. The contact portion preferably has a stacked-layer structure of a plurality of conductive layers as described above because electric resistance can be reduced and mechanical strength can be increased.

As the connection layer 710 and the connection layer 760, any of various anisotropic conductive films (ACF), anisotropic conductive pastes (ACP), or the like can be used.

A material in which impurities such as water or hydrogen do not easily diffuse is preferably used for the insulating layer 712 and the insulating layer 762. That is, the insulating layer 712 and the insulating layer 762 can each function as a barrier film. Such a structure can effectively suppress diffusion of the impurities to the light-emitting element 704 and the transistors even in the case of using a material permeable to moisture for the first substrate 31 and the second substrate 21, and a highly reliable touch panel can be achieved.

Note that the insulating layer 712 and/or the insulating layer 713 may have a plurality of depressions as the insulating layer 717. This leads to the increase in surface area of the insulating layers and in space for a transistor, a contact portion, and the like. As a result, the touch panel 10 can be reduced in size and miniaturized because the plurality of pixels 33 can be disposed more densely.

The insulating layer 765 and/or the dielectric layer 772 may have a plurality of depressions as the insulating layer 717. This leads to the increase in surface area of the first conductive layer 771 and the second conductive layer 773 and in capacitance of the capacitor 770. As a result, the touch panel 10 can be resistant to noise and stable in operation.

The same method as that used for the insulating layer 717 may be used for forming a plurality of depressions of the insulating layer 712 and/or the insulating layer 713. The same method as that used for the insulating layer 717 may be used for forming a plurality of depressions of the insulating layer 765 and/or the insulating layer 772. Note that the method of limning the insulating layer 353 described in Embodiment 2 can be referred to for a method of forming a plurality of depressions in the insulating layer 717,

[Components]

The above components are described below.

The transistor includes a conductive layer functioning as the gate electrode, the semiconductor layer, a conductive layer functioning as the source electrode, a conductive layer functioning as the drain electrode, and an insulating layer functioning as a gate insulating layer. FIG. 7A shows the case where a bottom-gate transistor is used.

Note that there is no particular limitation on the structure of the transistor included in the touch panel of one embodiment of the present invention. For example, a forward staggered transistor or an inverted staggered transistor may be used. A top-gate transistor or a bottom-gate transistor may be used. A semiconductor material used for the transistor is not particularly limited, and for example, an oxide semiconductor, silicon, or germanium can be used.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 4, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of a transistor is formed. In particular, an oxide semiconductor having a wider band gap than silicon is preferably used. A semiconductor material having a wider band gap and a lower carrier density than silicon is preferably used because off-state leakage current of the transistor can be reduced.

The oxide semiconductor preferably contains at least indium (In) or zinc (Zn). The semiconductor layer more preferably contains an In-M-Zn-based oxide (M is a metal such as Al, Ti, Ga, Ge, Y, Zr, Sn, La, Ce, or Hf).

As the semiconductor layer, it is particularly preferable to use an oxide semiconductor layer including a plurality of crystal parts whose c-axes are aligned perpendicular to a surface on which the semiconductor layer is formed or the top surface of the semiconductor layer and in which the adjacent crystal parts have no grain boundary.

Because such an oxide semiconductor contains no grain boundary, generation of a crack caused by stress when a display panel is bent is prevented. Therefore, such an oxide semiconductor can be preferably used for a flexible touch panel which is used in a bent state, or the like.

Moreover, the use of such an oxide semiconductor for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

As conductive layers such as a gate, a source, and a drain of the transistor and a wiring and an electrode in the touch panel, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stack of indium tin oxide and an alloy of silver and magnesium is preferably used because the conductivity can be increased.

Examples of an insulating material that can be used for the insulating layers, the dielectric layer 772, the overcoat 767, the spacer 719, and the like include a resin such as acrylic or epoxy resin, a resin having a siloxane bond, and an inorganic insulating material such as silicon oxide, silicon oxynitride, silicon nitride oxide, silicon nitride, or aluminum oxide.

As described above, the light-emitting element is preferably provided between a pair of insulating films with low water permeability. Thus, impurities such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

For the bonding layers, a curable resin such as a heat curable resin, a photocurable resin, or a two-component type curable resin can be used. For example, a resin such as an acrylic resin, a urethane resin, an epoxy resin, or a resin having a siloxane bond can be used.

The EL layer 722 includes at least a light-emitting layer. In addition to the light-emitting layer, the EL layer 722 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 722, either a low molecular compound or a high molecular compound can be used, and an inorganic compound may be used. Each of the layers included in the EL layer 722 can be formed by any of the following methods: an evaporation method (including a vacuum evaporation method), a transfer method, a printing method, an inkjet method, a coating method, and the like.

As examples of a material that can be used for the black matrix 775, carbon black, a metal oxide, and a composite oxide containing a solid solution of a plurality of metal oxides can be given.

As examples of a material that can be used for the color filter 774, a metal material, a resin material, and a resin material containing a pigment or dye can be given.

The structures 777 are preferably formed using a photosensitive resin material, such as photopolymer, photosensitive acrylic, and photosensitive polyimide, or an inorganic insulating material, such as a silicon oxide film.

Manufacturing Method Example

Here, a method for manufacturing a flexible touch panel is described.

For convenience, a structure including a pixel and a circuit, a structure including an optical member such as a color filter, or a structure including a touch sensor is referred to as an element layer. An element layer includes a display element, for example, and may include a wiring electrically connected to the display element or an element such as a transistor used in a pixel or a circuit in addition to the display element.

Here, a support body (e.g., the first substrate 21 or the second substrate 31) with an insulating surface where an element layer is formed is referred to as a base material.

As a method for forming an element layer over a flexible base material provided with an insulating surface, there is a method in which an element layer is formed directly over a base material. Another method is that an element layer is formed over a supporting base material that is different from the base material and has stiffness, and then, the element layer is separated from the supporting base material and transferred to the base material.

In the case where a material of the base material can withstand heating temperature in a process for forming the element layer, it is preferable that the element layer be formed directly over the base material, in which case a manufacturing process can be simplified. At this time, the element layer is preferably formed in a state where the base material is fixed to the supporting base material, in which case transfer thereof in an apparatus and between apparatuses can be easy.

In the case of employing the method in which the element layer is formed over the supporting base material and then transferred to the base material, first, a separation layer and an insulating layer are stacked over the supporting base material, and then the element layer is formed over the insulating layer. Next, the element layer is separated from the supporting base material and then transferred to the base material. At this time, a material is selected that would causes separation at an interface between the supporting base material and the separation layer, at an interface between the separation layer and the insulating layer, or in the separation layer.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride layer be used over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is not necessarily provided in the case where separation can occur at an interface between the supporting base material and the insulating layer. For example, with the use of glass as the supporting base material and an organic resin such as polyimide as the insulating layer, a separation trigger may be made by locally heating part of the organic resin by laser light or the like, and separation may be performed at an interface between the glass and the insulating layer. Alternatively, a metal layer may be provided between the supporting base material and the insulating layer formed of an organic resin, and separation may be performed at the interface between the metal layer and the insulating layer by heating the metal layer by feeding a current to the metal layer. In that case, the insulating layer formed of an organic resin can be used as a base material.

Examples of such a base material having flexibility include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, it is preferable to use a material with a low thermal expansion coefficient, and for example, a polyamide imide resin, a polyimide resin, PET, or the like with a thermal expansion coefficient lower than or equal to $30 \times 10^{-6}$/K can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the base material. Alternatively, a composite material where glass and a resin material are attached to each other may be used.

In the structure of FIG. 7A, for example, a first separation layer and the insulating layer 762 are formed in this order over a first supporting base material, and then other components are formed thereover. Separately, a second separation layer and the insulating layer 712 are formed in this order over a second supporting base material, and then upper components are formed. Next, the first supporting base material and the second supporting base material are bonded to each other using the bonding layer 720. After that, separation at an interface between the second separation layer and the insulating layer 712 is conducted so that the second supporting base material and the second separation layer are removed, and then the second substrate 31 is bonded to the insulating layer 712 using the bonding layer 711. Further, separation at an interface between the first separation layer and the insulating layer 762 is conducted so that the first supporting base material and the first separation layer are removed, and then the first substrate 21 is bonded to the insulating layer 762 using the adhesive layer 761. Note that either side may be subjected to separation and attachment first.

The above is the description of a manufacturing method of a flexible touch panel.

Cross-Sectional Structure Example 2

FIG. 8 is a cross-sectional structure example whose structure is partly different from that of FIGS. 7A and 7B. The structure in FIG. 8 is mainly different from that of FIGS. 7A and 7B in a structure of the first conductive layer 771.

FIG. 8 shows an example where a first conductive layer 771a including a semiconductor layer formed by processing the same film as that for the semiconductor layers of the transistor 751 and the transistor 752 is used instead of the first conductive layer 771 of FIG. 7A. The first conductive layer 771a is in contact with the insulating layer 765.

Here, the first conductive layer 771a preferably includes an oxide semiconductor. An oxide semiconductor is a semiconductor material whose resistivity can be controlled by oxygen vacancies in the film of the semiconductor material and/or the concentration of impurities such as hydrogen or water in the film of the semiconductor material. Therefore, even when the semiconductor layer used for the first conductive layer 771a and the semiconductor layers used for the transistors are formed by processing the same semiconductor film, resistivity of these semiconductor layers can be controlled by increasing or decreasing oxygen vacancies and/or the concentration of impurities.

Specifically, plasma treatment is performed on an oxide semiconductor layer included in the first conductive layer 771a serving as an electrode of the capacitor 770 so that oxygen vacancies in the oxide semiconductor layer and/or impurities such as hydrogen and water in the oxide semiconductor layer is increased. Accordingly, the first conductive layer 771a includes an oxide semiconductor layer which can have a high carrier density and a low resistance. Alternatively, an insulating film (insulating layer 765) containing hydrogen is formed in contact with the oxide semiconductor layer to diffuse hydrogen from the insulating film containing hydrogen to the oxide semiconductor layer, so that the oxide semiconductor layer can have a high carrier density and a low resistance. Such an oxide semiconductor layer can be used for the first conductive layer 771a.

The insulating layer 764 is provided over the transistor 751 and the transistor 752 to prevent the oxide semiconductor layers thereof from being subjected to the plasma treatment. By provision of the insulating layer 764, the structure where the oxide semiconductor layers are not in contact with the insulating layer 765 containing hydrogen can be obtained. With the use of an insulating film capable of releasing oxygen as the insulating layer 764, oxygen can be supplied to the oxide semiconductor layers of the transistors. The oxide semiconductor layer to which oxygen is supplied becomes an oxide semiconductor layer in which oxygen vacancies in the film or at the interface are reduced and has a high resistance. Note that as the insulating film capable of releasing oxygen, a silicon oxide film, a silicon oxynitride film, and the like can be used, for example.

As the plasma treatment to be performed on the oxide semiconductor layer, plasma treatment using a gas containing one of a rare gas (He, Ne, Ar, Kr, or Xe), phosphorus, boron, hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide semiconductor layer. The oxygen vacancy might cause carrier generation. Further, when hydrogen is supplied from an insulating film that is in the vicinity of the oxide semiconductor layer, specifically, that is in contact with the lower surface or the upper surface of the oxide semiconductor layer, and hydrogen enters the oxygen vacancy, an electron serving as a carrier might be generated. Therefore, the oxide semiconductor layer used for the first conductive layer 771a where oxygen vacancies are increased by the plasma treatment has a higher carrier density than the oxide semiconductor layers of the transistors.

The oxide semiconductor layers of the transistors in which oxygen vacancies are reduced and the hydrogen concentration is reduced can be referred to as a highly purified intrinsic or substantially highly purified intrinsic oxide semiconductor layer. The term "substantially intrinsic" refers to the state where an oxide semiconductor has a carrier density lower than $1\times10^{17}/cm^3$, preferably lower than $1\times10^{15}/cm^3$, or further preferably lower than $1\times10^{13}/cm^3$. Furthermore, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). The highly purified intrinsic or substantially highly purified intrinsic oxide semiconductor layer has a low density of defect states and accordingly can have a low density of trap states.

Furthermore, the highly purified intrinsic or substantially highly purified intrinsic oxide semiconductor layer has an extremely low off-state current; even when an element has a channel width W of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode in the range from 1 V to 10 V. Thus, the transistors 751, 752, and the like each of whose channel region is formed in the oxide semiconductor layer has a small change in electrical characteristics and is highly reliable. Note that a similar oxide semiconductor layer is preferably used for the transistors 701, 702, 703, and the like that are provided on the second substrate 31 side.

In FIG. 8, a region of the insulating layer 764 overlapping with the first conductive layer 771a serving as the electrode of the capacitor 770 is selectively removed. The insulating layer 765 may be formed in contact with the first conductive layer 771a and then be removed from the upper surface of the first conductive layer 771a. For example, an insulating film containing hydrogen, that is, an insulating film capable of releasing hydrogen, typically, a silicon nitride film, is used as the insulating layer 765, whereby hydrogen can be supplied to the first conductive layer 771a. The insulating film capable of releasing hydrogen preferably has a hydrogen concentration of $1\times10^{22}$ atoms/cm$^3$ or higher. When such an insulating film is formed in contact with the first conductive layer 771a, it is possible to make the first conductive layer 771a effectively contain hydrogen. In this manner, in combination with the above-described plasma treatment, the structure of the insulating film in contact with the oxide semiconductor layer is changed, whereby the resistance of the oxide semiconductor layer can be appropriately adjusted. Note that a layer including an oxide semiconductor whose resistance is sufficiently reduced can be referred to as an oxide conductor layer.

Hydrogen contained in the first conductive layer 771a reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Therefore, the oxide semiconductor included in the first conductive layer 771a containing hydrogen has a higher carrier density than the oxide semiconductor used for the transistors.

Hydrogen in the oxide semiconductor layer of the transistor in which a channel region is formed is preferably reduced as much as possible. Specifically, in the oxide semiconductor layer, the concentration of hydrogen which is measured by secondary ion mass spectrometry (SIMS) is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$.

The oxide semiconductor included in the first conductive layer 771a serving as the electrode of the capacitor 770 has higher hydrogen concentration and/or more oxygen vacancies than the oxide semiconductor used for the transistors, and the resistance thereof is reduced.

The oxide semiconductor layer used for the first conductive layer 771a and the transistors is typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor layer used for the first conductive layer 771a and the transistors has a light-transmitting property.

Note that in the case where the oxide semiconductor layer used for the first conductive layer 771a and the transistors is an In-M-Zn oxide, when the summation of In and M is assumed to be 100 atomic %, the proportions of In and M are preferably set to be greater than or equal to 25 atomic % and less than 75 atomic %, respectively, or greater than or equal to 34 atomic % and less than 66 atomic %, respectively.

An energy gap of the oxide semiconductor layer used for the first conductive layer 771a and the transistors is preferably 2 eV or more, 2.5 eV or more, or 3 eV or more.

The thickness of the oxide semiconductor layer used for the first conductive layer 771a and the transistors can be greater than or equal to 3 nm and less than or equal to 200 nm, greater than or equal to 3 nm and less than or equal to 100 nm, or greater than or equal to 3 nm and less than or equal to 60 nm.

Further, in the case where the oxide semiconductor layer used for the first conductive layer 771a and the transistors is an In-M-Zn oxide, the atomic ratio of metal elements of a sputtering target used for forming the In-M-Zn oxide preferably satisfies In≥M and Zn≥M As the atomic ratio of metal elements of such a sputtering target, In:M:Zn=1:1:1, In:MZn=1:1:1.2, In:M:Zn=2:1:1.5, In:M:Zn=2:1:2.3, In:M:Zn=2:1:3, In:MZn=3:1:2, or the like is preferable. Note that the proportion of each metal element in the atomic ratio of the formed oxide semiconductor layer used for the first conductive layer 771a and the transistors varies within a range of ±40% of that of the corresponding metal in the above atomic ratio of the sputtering target as an error.

When hydrogen is added to an oxide semiconductor in which an oxygen vacancy is generated, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor. In other words, the oxide conductor is a degenerate semiconductor and it is suggested that the conduction band edge agrees with or substantially agrees with the Fermi level. Therefore, the oxide conductor film can be used as the electrode of the capacitor, for example.

In the structure shown in FIG. 8, the first conductive layer 771a can be formed at the time of forming the transistors; thus, the manufacturing process can be simplified. In addition, the manufacturing cost can be reduced because a photomask is not necessary for forming the first conductive layer 771a in FIG. 8.

A touch panel shown in FIG. 8 includes the second conductive layer 773 having an opening 778. In FIG. 8, the second conductive layer 773 overlaps with the black matrix 775, and the opening 778 of the second conductive layer 773 overlaps with the color filter 774.

The emission region of the light-emitting element 704 is overlapped with the color filter 774, and light extracted from the light-emitting element 704 is emitted to the second substrate 21 side through the color filter 774. Light can be emitted without passing through the second conductive layer 773 in the case where the second conductive layer 773 has the opening 778 overlapping with the color filter 774, which leads to inhibition of reduction in luminance of light emitted from the second substrate 21 side.

Cross-Sectional Structure Example 3

Figure 9:
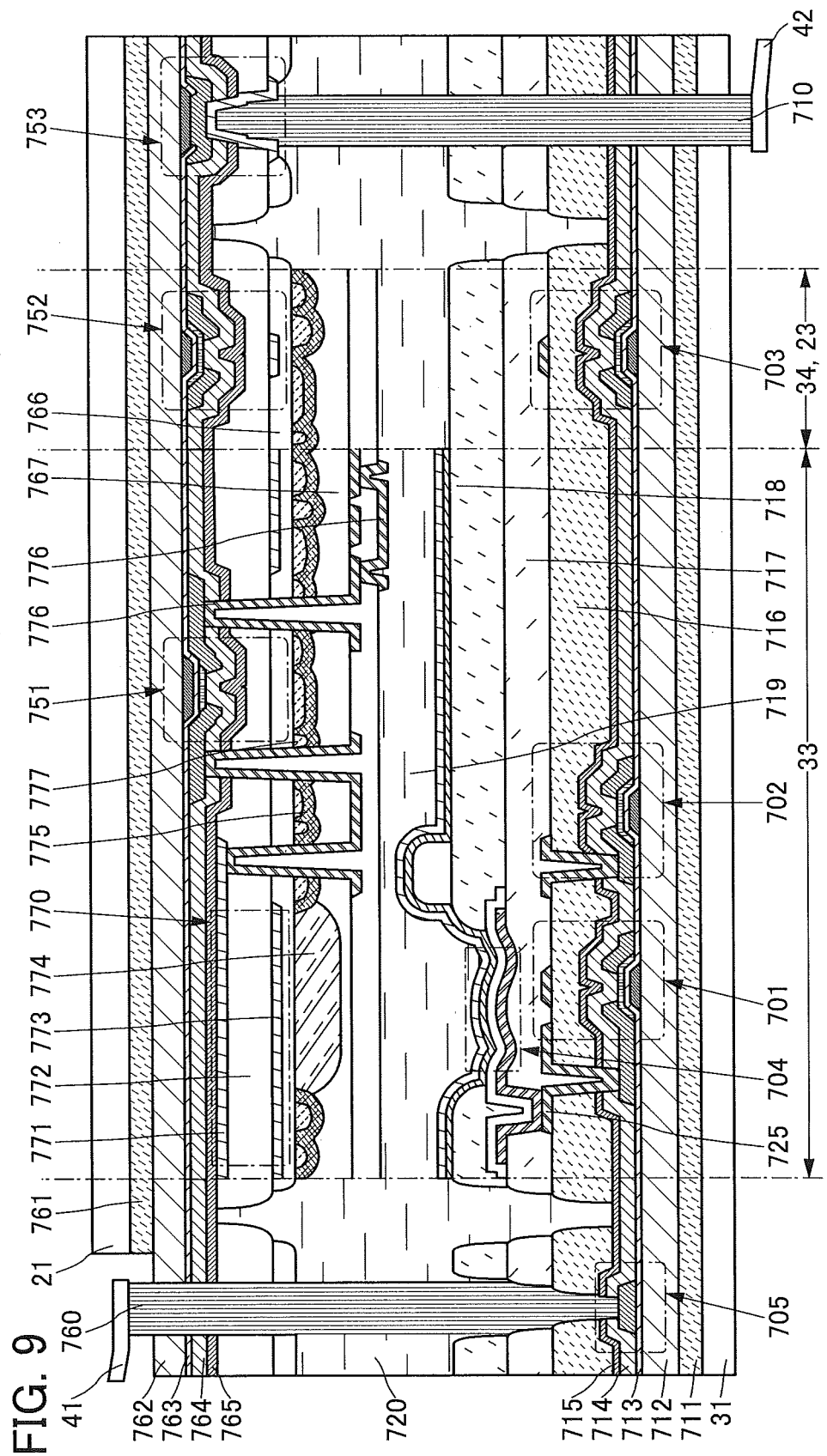
FIG. 9 is a cross-sectional view showing a structure example of a touch panel.

FIG. 9 is a cross-sectional structure example which is partly different from those in FIGS. 7A and 7B and FIG. 8. The main difference between FIG. 9 and FIGS. 7A and 7B is that FIG. 9 includes a third conductive layer 776.

The touch panel in FIG. 9, which is one embodiment of the present invention, includes two conductive layers for forming a capacitor and the third conductive layer 776. The third conductive layer 776 serves as a wiring for electrical connection to the first conductive layer 771 or the second conductive layer 773 of the capacitor or another circuit. For example, the third conductive layer 776 serves as a wiring for electrically connecting the transistor 751 to a transistor included in the circuit 23 or 24.

It is preferable that the third conductive layer 776 be closer to the display element side than the black matrix 775 and that they partly overlap with each other. The third conductive layer 776 is hidden by the black matrix when seen from the detection surface side (i.e., the display surface) of the touch panel. This structure prevents the third conductive layer 776 from being in the viewer's sight. A touch panel with high visibility can be provided.

A material containing a metal and an alloy is preferably used for the third conductive layer 776. A material containing a metal and an alloy has relatively high conductivity. Thus, the use of the material for a wiring or an electrode inhibits signal delay and leads to the increase in sensitivity of the touch sensor. Most of the materials have visible light blocking properties, and the third conductive layer 776 is provided in a position overlapping with the black matrix 775. Thus, the third conductive layer 776 does not block light emitted from the light-emitting element 704 to the color filter 774, leading to the increase in aperture ratio of the pixel. Note that it is not necessary to use the light blocking material for the third conductive layer 776, and a material transmitting visible light partly, such as a conductive oxide and a conductive organic compound, may be used.

Cross-Sectional Structure Example 4

FIG. 10 shows a cross-sectional structure example which is partly different from the structures shown in FIGS. 7A and 7B, FIG. 8, and FIG. 9. The structure shown in FIG. 10 differs from the structure shown in FIGS. 7A and 7B mainly in that a transistor on the second substrate 21 side is not provided. That is, the cross-sectional structure shown in FIG. 10 can be used for a passive matrix touch panel.

At this time, the first conductive layer 771 can have a belt-like shape extending in one direction. Furthermore, the second conductive layer 773 can have a belt-like shape extending in a direction crossing the first conductive layer 771. A plurality of first conductive layers 771 and a plurality of second conductive layers 773 with such a structure are arranged, so that a passive matrix touch panel can be obtained.

In FIG. 10, a contact portion 781 for contact between the first conductive layer 771 and a wiring 779 and a contact portion 782 for contact between the second conductive layer 773 and a wiring 779 are shown. The first conductive layer 771 and the wiring 779 are electrically connected to each other through an opening provided in the insulating layer 764. The second conductive layer 773 and the wiring 779 are electrically connected to each other through an opening provided in the insulating layer 764 and the insulating layer 772.

The above is the description of the cross-sectional structure example.

This embodiment can increase irregularity of the surface shape of the reflective electrode of the light-emitting element, and it is possible to inhibit interference fringes and reflection of images due to outside light reflected by a screen of the EL display device. The projections on the surface of the black matrix can also inhibit interference fringes and reflection of images due to outside light.

Though this embodiment shows the structure including two substrates, i.e., the first substrate supporting the touch sensor and the second substrate supporting the display element, the structure is not limited thereto. For example, a structure with three substrates where a display element is sandwiched between two substrates and the first substrate supporting a touch sensor is bonded thereto can be employed. Alternatively, a structure with four substrates where a display element sandwiched with two substrates and a touch sensor sandwiched between two substrates are bonded to each other can be employed.

Note that the structure described in this embodiment in which the sensor element 22 is provided on the first substrate 31 side of the second substrate 21 is a non-limiting example. The sensor element 22 may be provided on the side in which the touch panel's display is viewed of the second substrate 21 (i.e., the side opposite to the first substrate 31). Alternatively, the first substrate 31 may include the sensor element 22.

Note that a low resistance material is preferably used for a conductive film i.e., a wiring or an electrode, included in the touch sensor, such as the first conductive layer 771 and the second conductive layer 773. For example, ITO, IZO (registered trademark), silver, copper, aluminum, a carbon nanotube, and graphene may be used. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, light transmittance of 89% or more and a sheet resistance of 40 ohm/square or more and 100 ohm/square or less can be achieved. Such a metal nanowire provides high light transmittance, and the metal nanowire, a carbon nanotube, and graphene may be used for an electrode of the display element, such as a pixel electrode or a common electrode.

Embodiment 4 can be implemented in appropriate combination with any of the structures described in the other embodiments.

Embodiment 5

In this embodiment, a structure example of a touch sensor of one embodiment of the present invention and a driving method thereof is described with reference to drawings.

Structure Example

FIG. 11A is a block diagram illustrating a structure of a touch panel (also referred to as an input/output device) of one embodiment of the present invention. FIG. 11B is a circuit diagram illustrating a structure of a converter CONY. FIG. 11C is a circuit diagram illustrating a structure of the sensor element 22. FIG. 11D1 and FIG. 11D2 are timing charts illustrating a driving method of the sensor element 22.

The touch sensor illustrated in this embodiment includes a plurality of sensor elements 22 arranged in a matrix, scan lines G1 electrically connected to the plurality of sensor elements 22 arranged in a row direction, signal lines DL electrically connected to the plurality of sensor elements 22 arranged in a column direction, and the substrate 21 with flexibility where the sensor elements 22, scan lines G1, and the signal lines DL are provided (see FIG. 11A).

For example, the plurality of sensor elements 22 can be arranged in a matrix of n rows and in columns (n and in are each a natural number larger than or equal to 1).

Note that the sensor element 22 includes a capacitor C for sensing. The capacitor C corresponds to the capacitor 770 in Embodiment 4. For example, a first electrode and a second electrode of the capacitor C correspond to the first conductive layer 771 and the second conductive layer 773 in Embodiment 4, respectively.

The second electrode of the capacitor C is electrically connected to a wiring CS. Accordingly, a potential of the second electrode of the capacitor C can be controlled by a control signal supplied from the wiring CS.

The sensor element 22 of one embodiment of the present invention includes at least a transistor M4. In addition, a transistor M5 and/or a transistor M6 may be included (see FIG. 11C).

A gate of the transistor M4 is electrically connected to the first electrode of the capacitor C, and a first electrode of the transistor M4 is electrically connected to a wiring VPI. The wiring VPI has a function of supplying, for example, a ground potential.

A gate of the transistor M5 is electrically connected to the scan line G1, a first electrode of the transistor M5 is electrically connected to a second electrode of the transistor M4, and a second electrode of the transistor M5 is electrically connected to the signal line DL. The scan line G1 has a function of supplying, for example, a selection signal. The signal line DL has a function of supplying, for example, a sensor signal DATA.

A gate of the transistor M6 is electrically connected to a wiring RES, a first electrode of the transistor M6 is electrically connected to the first electrode of the capacitor C, and a second electrode of the transistor M6 is electrically connected to a wiring VRES. The wiring RES has a function of supplying, for example, a reset signal. The wiring VRES has a function of supplying, for example, a potential at which the transistor M4 can be turned on.

Capacitance of the capacitor C is changed when an object gets closer to the first electrode or the second electrode or when a gap between the first electrode and the second electrode is changed, for example. Thus, the sensor element 22 can supply the sensor signal DATA in accordance with a change in capacitance of the capacitor C.

The wiring CS electrically connected to the second electrode of the capacitor C has a function of supplying a control signal controlling a potential of the second electrode of the capacitor C.

Note that a node at which the first electrode of the capacitor C, the gate of the transistor M4, and the first electrode of the transistor M6 are electrically connected to each other is referred to as a node A.

Figure 12A:
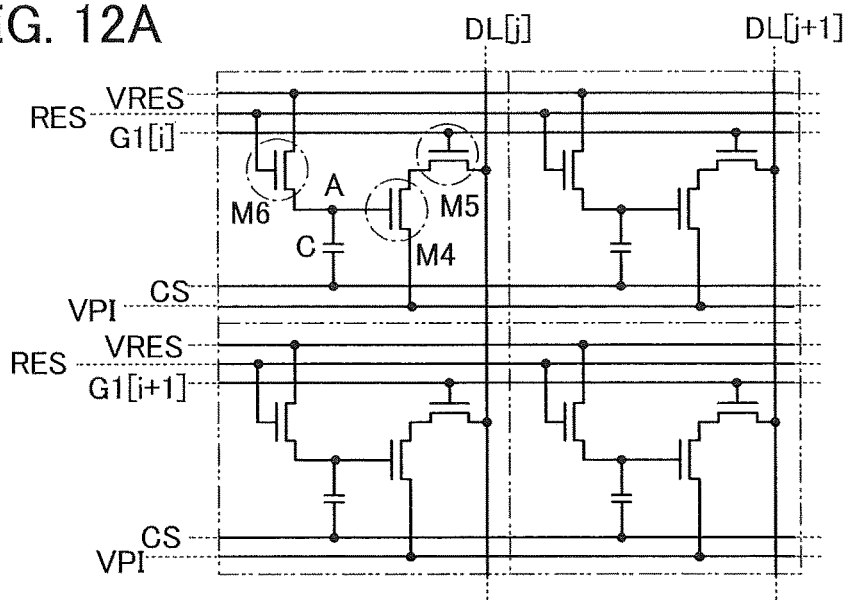
FIGS. 12A to 12C are a circuit diagram and schematic diagrams showing a structure of a touch panel.

FIG. 12A is an example of a circuit diagram in the case where four sensor elements 22 are arranged in an array of two rows and two columns.

Figure 12B:
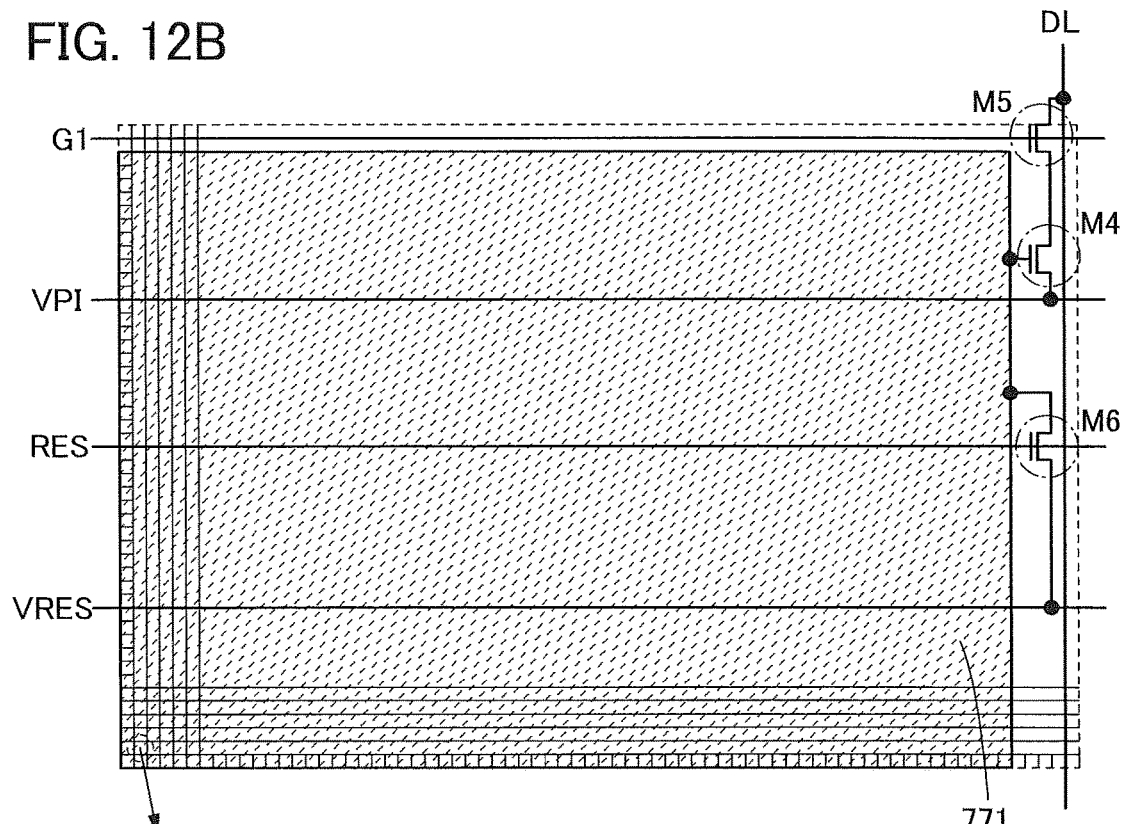
Figure 12C:
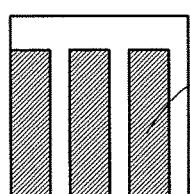

FIG. 12B shows a positional relationship between the first conductive layer 771 (corresponding to the first electrode) included in the sensor element 22 and the wirings. The first conductive layer 771 is electrically connected to the gate of the transistor M4 and the second electrode of the transistor M6. The first conductive layer 771 overlaps with a plurality of pixels 33 shown in FIG. 12C. The transistors M4 to M6 are preferably arranged not to overlap with the first conductive layer 771 as shown in FIG. 12B.

A wiring VPO and a wiring BR shown in FIG. 11B each have a function of supplying, for example, a power source potential high enough to turn on a transistor. The signal line DL has a function of supplying a sensor signal DATA. A terminal OUT has a function of supplying a signal converted based on the sensor signal DATA.

The converter CONY has a conversion circuit. Any of various circuits that can convert the sensor signal DATA and supply the converted signal to the terminal OUT can be used as the converter CONV. For example, a circuit serving as a source follower circuit or a current mirror circuit, which is formed by electrically connecting the converter CONY to the sensor element 22, can be used.

Specifically, a source follower circuit can be formed using the converter CONY including a transistor M7 (see FIG. 11B). Note that a transistor that can be formed in the same process as those of the transistors M4 to M6 may be used as the transistor M7.

For example, the structure of the transistor 751, 752, or the like illustrated in Embodiment 4 may be used for the transistors M4 to M7.

Figure 13A:
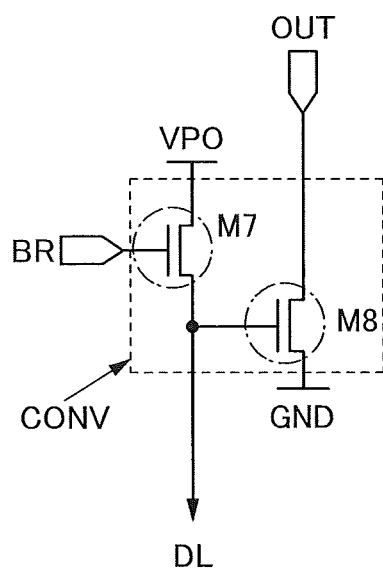
FIGS. 13A to 13C are circuit diagrams showing a structure of a touch panel.
Figure 13B:
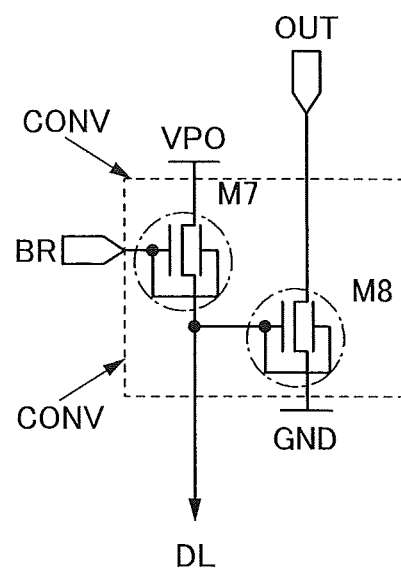
Figure 13C:
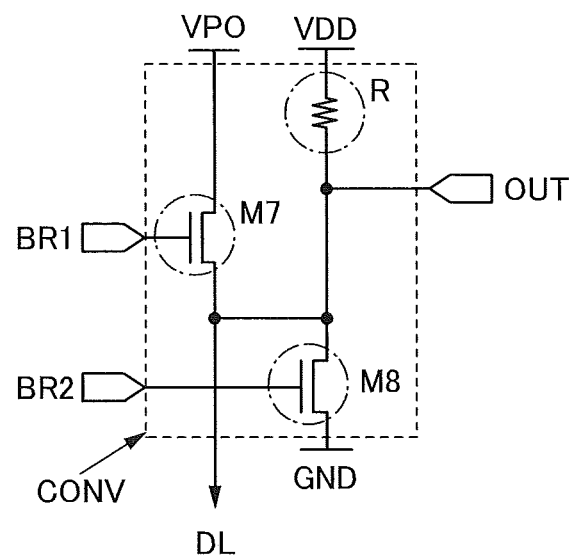

Note that the structure of the converter CONY is not limited to that shown in FIG. 11B. FIGS. 13A to 13C illustrate different examples of the converter CONY.

The converter CONY in FIG. 13A includes a transistor M8 in addition to the transistor M7. Specifically, a gate of the transistor M8 is electrically connected to the signal line DL, a first electrode of the transistor M8 is electrically connected to the terminal OUT, and a second electrode of the transistor M8 is electrically connected to a wiring GND. The wiring GND has a function of supplying, for example, a ground potential. As shown in FIG. 13B, the transistors M7 and M8 may each include a second gate. In that case, the second gate is preferably electrically connected to the gate.

The converter CONV in FIG. 13C includes the transistor M7, the transistor M8, and a resistor R. Specifically, the gate of the transistor M7 is electrically connected to a wiring BR1. The gate of the transistor M8 is electrically connected to a wiring BR2, the first electrode of the transistor M8 is electrically connected the terminal OUT and a second electrode of the resistor R, and the second electrode of the transistor M8 is electrically connected the wiring GND. A first electrode of the resistor R is electrically connected a wiring VDD. The wirings BR1 and BR2 each have a function of supplying, for example, a power source potential high enough to turn on a transistor. The wiring VDD has a function of supplying, for example, a high power source potential.

Driving Method Example

Next, the driving method of the sensor element 22 is explained with reference to FIGS. 11A, 11B, 11C, 11D1, and 11D2.
<First Step>
In a first step, a reset signal for turning on the transistor M6 and subsequently turning off the transistor M6 is supplied to the gate of the transistor M6, and a potential of the first electrode of the capacitor C (that is, a potential of the node A) is set at a predetermined potential (see a period T1 in FIG. 11D1).

Specifically, a reset signal is supplied to the wiring RES. The transistor M6 to which the reset signal is supplied sets the potential of the node A to a potential at which the transistor M4 is turned on, for example.
<Second Step>
In a second step, a selection signal that turns on the transistor M5 is supplied to the gate of the transistor M5, and the second electrode of the transistor M4 is electrically connected to the signal line DL (see a period T2 in FIG. 11D1).

Specifically, a selection signal is supplied to the scan line G1. Through the transistor M5 to which the selection signal is supplied, the second electrode of the transistor M4 is electrically connected to the signal line DL.
<Third Step>
In a third step, a control signal is supplied to the second electrode of the capacitor C, and a potential that varies depending on the control signal and the capacitance of the capacitor C is supplied to the gate of the transistor M4.

Specifically, a rectangular control signal is supplied to the wiring CS. By supplying the rectangular control signal to the second electrode of the capacitor C, the potential of the node A is changed based on the capacitance of the capacitor C (see the latter half in the period T2 in FIG. 11D1).

For example, when the capacitor C is placed in the air and an object with a higher dielectric constant than the air comes close to the second electrode of the capacitor C, the apparent capacitance of the capacitor C increases.

Thus, the change in the potential of the node A due to the rectangular control signal becomes smaller than that in the case where an object whose dielectric constant is higher than that of the air is not located closer (see a solid line in FIG. 11D2).

In addition, when a gap between the first electrode and the second electrode of the capacitor C is changed by deformation of the touch panel, the capacitance of the capacitor C is changed. Accordingly, the potential of the node A is changed.

<Fourth Step>
In a fourth step, a signal obtained by the change in the potential of the gate of the transistor M4 is supplied to the signal line DL.

For example, a change in current due to the change in the potential of the gate of the transistor M4 is supplied to the signal line DL.

The converter CONV converts a change in current flowing through the signal line DL into a voltage change and supplies the voltage change, for example.
<Fifth Step>
In a fifth step, a selection signal for turning off the transistor M5 is supplied to the gate of the transistor M5.

In this manner, operation of the plurality of sensor elements 22 electrically connected to one scan line G1 is completed.

When there are n scan lines G1, the first step to the fifth step are conducted with respect to each of the scan line G1(1) to the scan line G1(n).

The above is the description of the driving method.

This embodiment can be implemented in combination with any of the embodiments described in this specification as appropriate.

Embodiment 6

Figure 14:
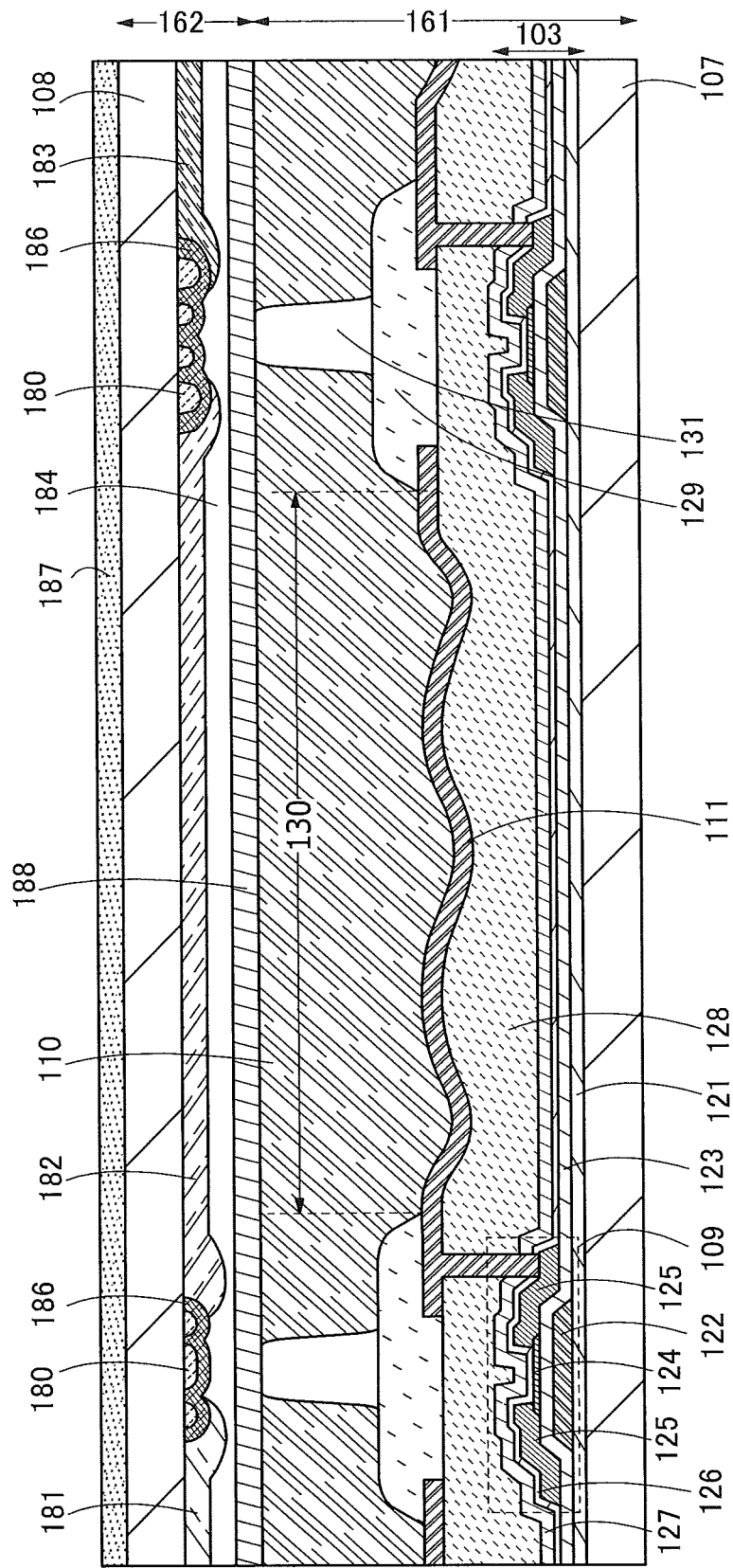
FIG. 14 is a cross-sectional view showing a structure example of a display device.

Embodiment 6 describes an embodiment of an active matrix liquid crystal display device with reference to FIG. 14.

A liquid crystal display device 120 illustrated in FIG. 14 is an example of a reflective liquid crystal display device. Note that description of the components of an element substrate 161 and a counter substrate 162 which are similar to those in Embodiment 1 will be omitted.

The transistor layer 103 is formed in the element substrate 161. The transistor layer 103 is covered with the insulating layer 128. The reflective electrode layer 111, the insulating layer 129, and the insulating layer 131 are formed over the insulating layer 128.

In the counter substrate 162, a counter electrode layer 188 is formed on the overcoat 184 in addition to the components of the counter substrate 102 described in Embodiment 1.

Furthermore, a liquid crystal layer 110 is provided between the reflective electrode layer 111 and the counter electrode layer 188.

Note that an alignment film may be provided between the reflective electrode layer 111 and the liquid crystal layer 110 and between the counter electrode layer 188 the liquid crystal layer 110 (not shown in FIG. 14). An optical member (an optical substrate), such as a polarizing member or a retardation member, may be provided as appropriate (not shown in FIG. 14). For example, circular polarization with a polarizing substrate and a retardation substrate may be used. A light source, such as a backlight or a sidelight, may be used.

As examples of the liquid crystal material used for the liquid crystal layer 110, the following can be given: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like. Further, a mixed material of any of the above-described liquid crystals and a chiral material or the like can be used.

The structure shown in FIG. 14, in which the liquid crystal layer 110 is provided between the reflective electrode layer 111 and the counter electrode layer 188 and potential difference is applied therebetween, allows alignment control of the liquid crystal layer 110; thus, display modes of the liquid crystal display device 120 can be changed.

The reflective liquid crystal display device in FIG. 14 is a non-limiting example. The use of a light-transmitting conductive material for the reflective electrode layer 111 allows a manufacture of a light-transmissive liquid crystal display device. The light-transmissive liquid crystal display device may have a structure in which the insulating layer 128 does not have projections or depressions and only the black matrix 186 of the counter substrate has projections.

The liquid crystal display device shown in FIG. 14 is of a vertical electric field mode (e.g., TN, VA, MVA, PVA, STN, and OCB), in which potential difference is applied between the reflective electrode layer 111 and the counter electrode layer 188, and can also be of a horizontal electric field mode (e.g., in-plane-switching (IPS) and fringe field switching (FFS)).

Described below is a semi-transmissive liquid crystal display device, which is an embodiment of an active matrix liquid crystal display device using the present invention. The semi-transmissive liquid crystal display device in which both a reflective electrode and a transmissive electrode exist in a unit pixel can have characteristics of both of a reflective liquid crystal display device and a transmissive liquid crystal display device. Note that description of components similar to those in FIG. 14 is omitted.

Modification Example 1

Figure 15:
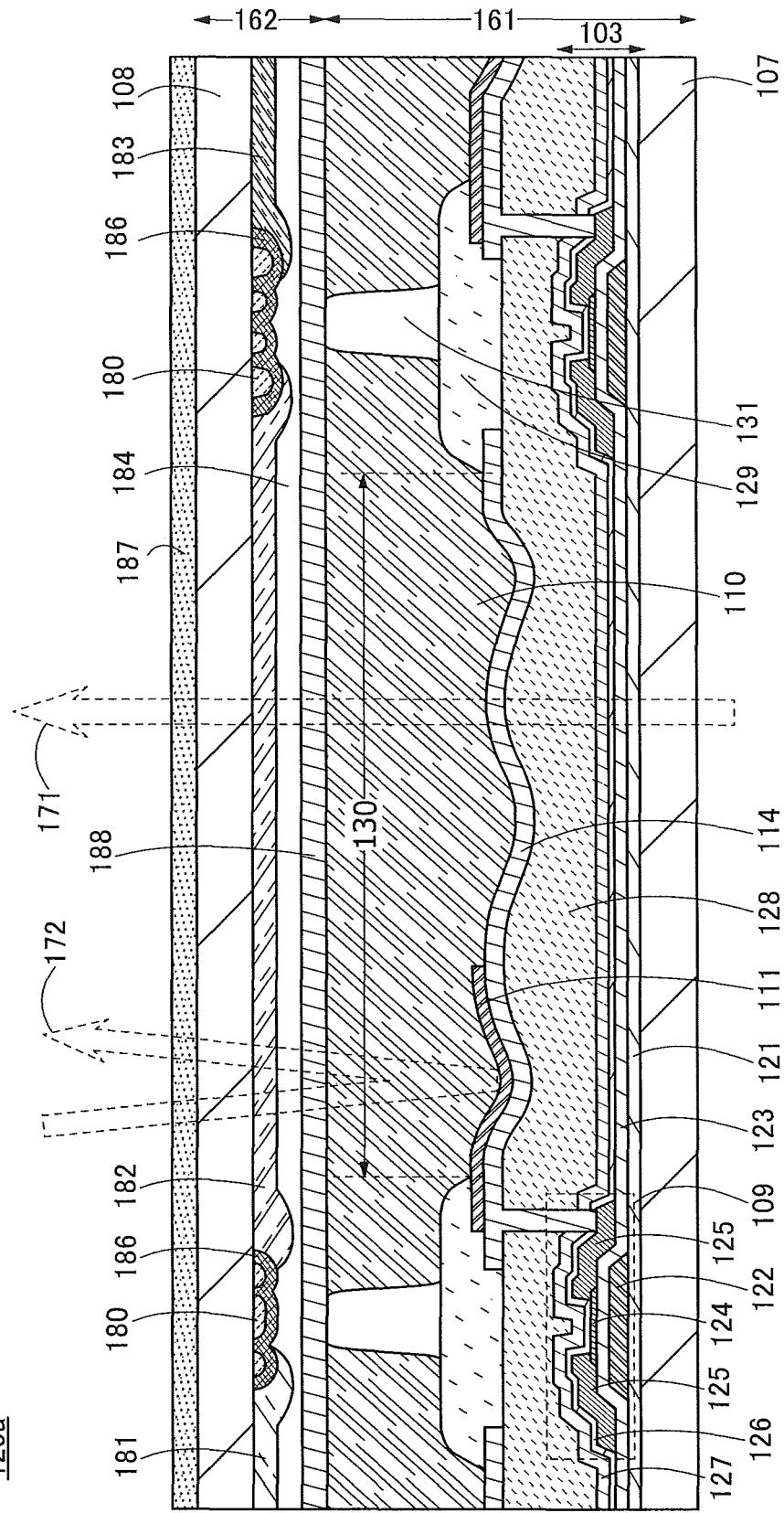
FIG. 15 is a cross-sectional view showing a structure example of a display device.

A liquid crystal display device 120a shown in FIG. 15 includes a light-transmitting electrode layer 114 over the insulating layer 128 and the reflective electrode layer 111 over the light-transmitting electrode layer 114. The reflective electrode layer 111 overlaps with part of the light-transmitting electrode layer 114. The light-transmitting electrode layer 114 has a region in contact with the liquid crystal layer 110. Note that the light-transmitting electrode layer 114 and the reflective electrode layer 111 may be stacked in reverse order of FIG. 15.

A light 171 from the element substrate 161 side, such as a light from a backlight, passes through the region where the light-transmitting electrode layer 114 is in contact with the liquid crystal layer 110 in the opening 130. The reflective electrode layer 111 reflects a light 172 from the outside of the liquid crystal display device 120a.

As shown in FIG. 15, the liquid crystal display device 120a includes both of the light-transmitting electrode layer 114 and the reflective electrode layer 111 in the opening 130 on the element substrate 161 side; thus, a semi-transmissive liquid crystal display device in which display can be seen in the dark and in the bright without a backlight can be achieved. Since display can be seen even when a backlight is off, power consumption of the liquid crystal display device can be reduced.

The ratio of the area occupied by the reflective electrode layer 111 to the opening 130 can be determined depending on the usage of the liquid crystal display device 120a. The display region in the liquid crystal display device 120a may include a region where the ratio of the area occupied by the reflective electrode layer 111 from that in other regions is different. Further, the display region in the liquid crystal display device 120a may include both a region where a unit pixel includes the light-transmitting electrode layer 114 and the reflective electrode layer 111 in the opening 130 and a region where a unit pixel includes only the light-transmitting electrode layer 114 in the opening 130. In addition, the display region in the liquid crystal display device 120a may include both a region where a unit pixel includes the light-transmitting electrode layer 114 and the reflective electrode layer 111 in the opening 130 and a region where a unit pixel includes only the reflective electrode layer 111 in the opening 130.

Although FIG. 15 shows a structure in which the insulating layer 128 in the opening 130 has a plurality of depressions, the plurality of depressions of the insulating layer 128 in the opening 130 may be formed only in a region where the reflective electrode layer 111 is in contact with the liquid crystal layer 110.

Modification Example 2

Figure 16:
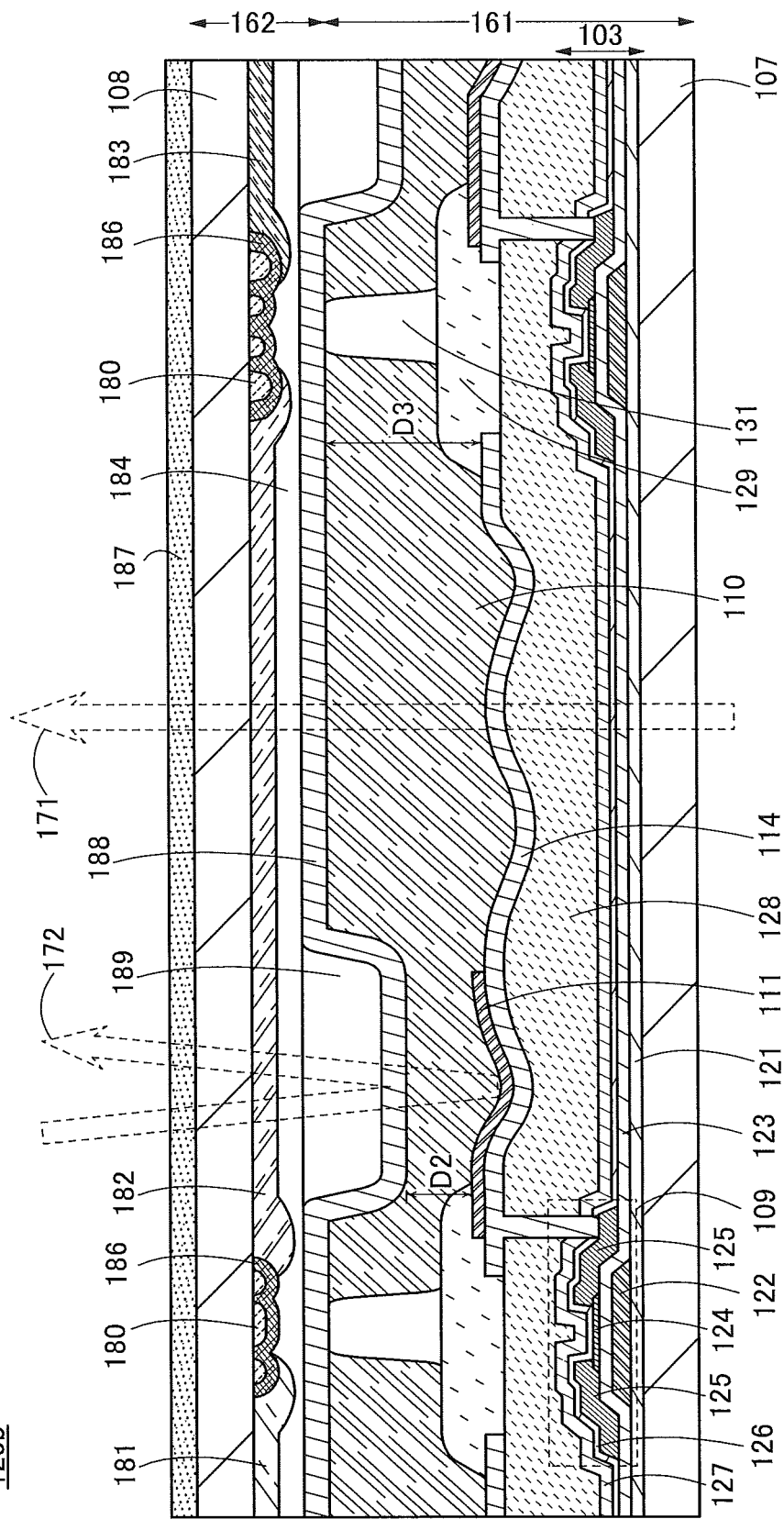
FIG. 16 is a cross-sectional view showing a structure example of a display device.

A liquid crystal display device 120b shown in FIG. 16 is different from the liquid crystal display device 120a in that an insulating layer 189 is provided on the overcoat 184.

The distance that the light 171 travels through the liquid crystal layer 110 is nearly equal to the distance between the light-transmitting electrode layer 114 and the counter electrode layer 188 because the light 171 travels in a straight light through the liquid crystal layer 110 in the liquid crystal display device 120a. In contrast, the distance that the light 172 travels through the liquid crystal layer 110 is nearly equal to twice the distance between the reflective electrode layer 111 and the counter electrode layer 188 because the light 172 is once reflected by the reflective electrode layer 111 which is in contact with the liquid crystal layer 110.

The difference between the distance that the light 171 travels through the liquid crystal layer 110 and the distance that the light 172 travels through the liquid crystal layer 110 might lead to variation in displaying state, such as display brightness, between the case where the light-emitting display device 120a serves as a reflective liquid crystal display device and the case where the light-emitting display device 120a serves as a transmissive liquid crystal display device. Thus, the distance that the light 172 travels through the liquid crystal layer 110 is preferably shorter.

The insulating layer 189 serves as an optical adjustment layer in the liquid crystal display device 120b. When the insulating layer 189 is provided so as to overlap with the reflective electrode layer 111, the distance between the counter electrode layer 188 and the reflective electrode layer 111 in the overlap region can be reduced.

The distance between the counter electrode layer 188 and the reflective electrode layer 111 with which the insulating layer 189 overlap is represented as D2, and the distance between the counter electrode layer 188 and the light-transmitting layer 114 with which the overcoat 184 overlap is represented as D3. When D2 is about half of D3, the distance that the light 171 travels through the liquid crystal layer 110 and the distance that the light 172 travels through the liquid crystal layer 110 can be nearly the same. Note that the intensity of electric field applied to the liquid crystal layer 110 through which the light 172 passes is larger than that through which the light 171 travels because D2 is less than D3. For this reason, D2 is preferably less than or equal to half of D3.

Figure 17:
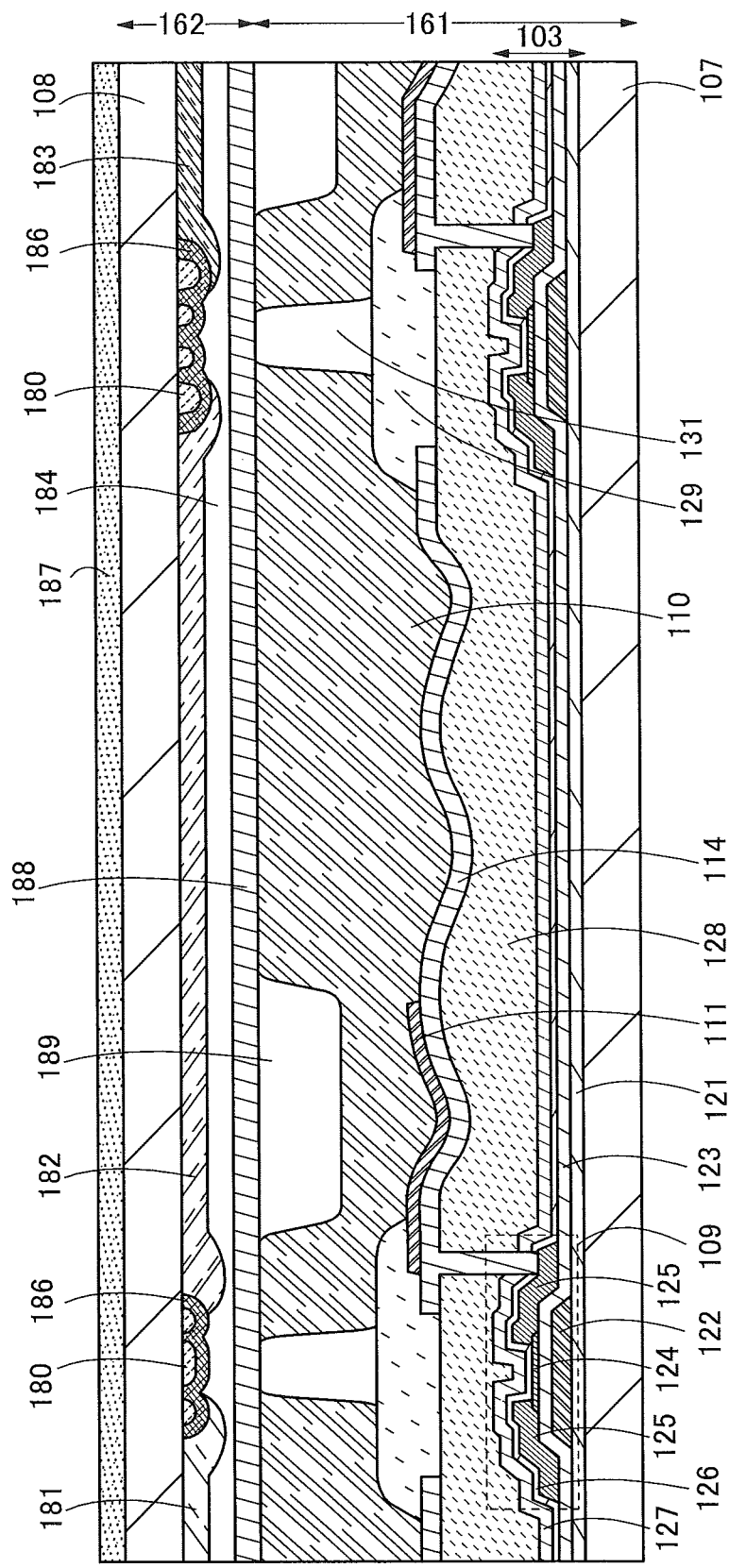
FIG. 17 is a cross-sectional view showing a structure example of a display device.

Note that the insulating layer 189 may be provided between the counter electrode layer 188 and the liquid crystal layer 110 (see FIG. 17). With this structure, electric field applied to the liquid crystal layer 110 through which the light 172 passes can be equal to that through which the light 171 passes.

Figure 18:
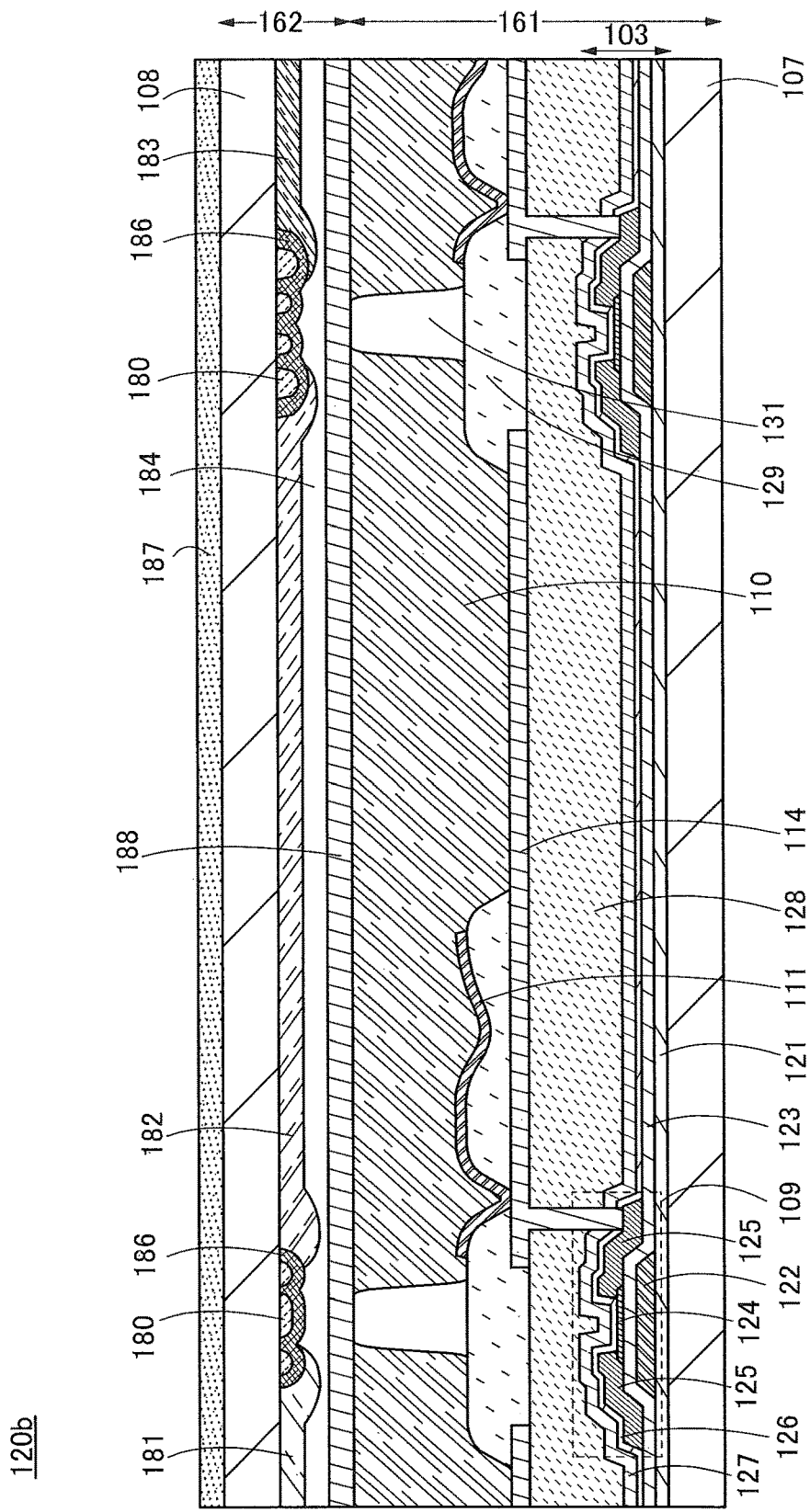
FIG. 18 is a cross-sectional view showing a structure example of a display device.

The insulating layer 189 may be provided not on the counter substrate 162 side but on the element substrate 161 side. That is, an insulating layer may be provided on the reflective electrode layer 111 or over the light-transmitting electrode layer 114 overlapped with the reflective electrode layer 111. The insulating layer 129, the insulating layer 131, or the like may be overlapped with the reflective layer 111. In the liquid crystal display device 120b shown in FIG. 18, the insulating layer 129 is provided over the light-transmitting layer 114 so as to overlap with the reflective electrode layer 111. In FIG. 18, the insulating layer 128 does not have projections or depressions and the insulating layer 129 overlapping with the reflective electrode layer 111 has a plurality of depressions. Furthermore, the insulating layer 129 has an opening through which the reflective electrode layer 111 is connected to the light-transmitting electrode layer 114.

The insulating layer 189 in FIG. 16 and FIG. 17 is a single layer but may be a stacked layer.

In FIG. 16 and FIG. 17, the surface of the insulating layer 189 may have a plurality of depressions reflecting a plurality of depressions in the surface of the insulating layer 128. This structure can keep the distance between the counter electrode layer 188 and the reflective electrode layer 111 overlapping with the insulating layer 189 regardless of irregularity of the surface of the reflective electrode layer 111.

A film similar to the insulating layer 351 described in Embodiment 2 can be used as a film of the insulating layer 189. The insulating layer 189 can be formed using, for example, a polyimide resin, an epoxy resin, or an acrylic resin.

Modification Example 3

Figure 19:
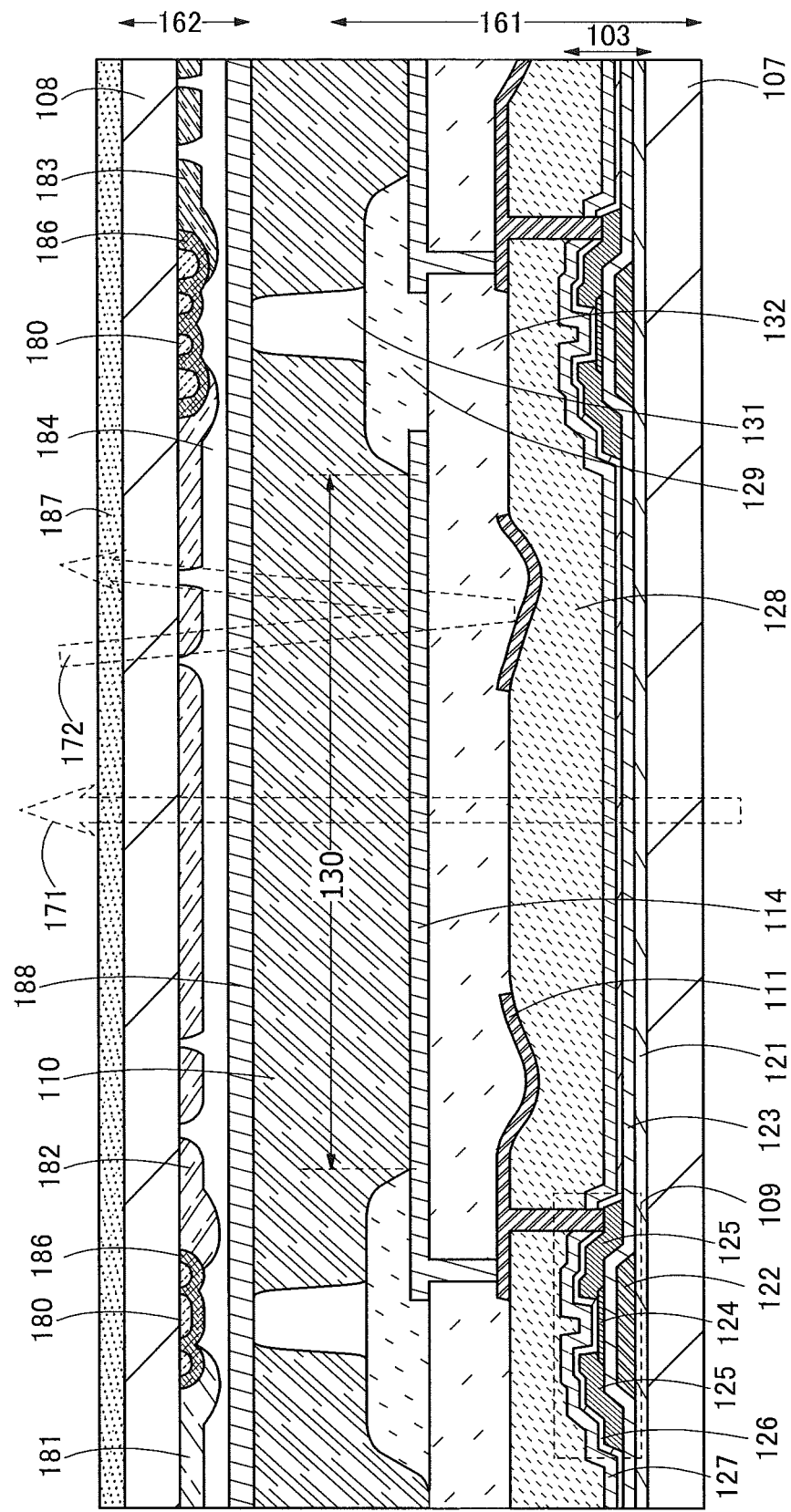
FIG. 19 is a cross-sectional view showing a structure example of a display device.

A liquid crystal display device 120c shown in FIG. 19 is different from the liquid crystal display device 120a in that the reflective electrode layer 111 is apart from the light-transmitting electrode layer 114 in the opening 130 and that the color filters 181, 182, and 183 have openings.

The reflective electrode layer 111, the insulating layer 132, and the light-transmitting electrode layer 114 are stacked in this order on the insulating layer 128. The insulating layer 132 in which the opening 130 is not formed has an opening through which the light-transmitting electrode layer 114 is connected to the reflective electrode layer 111. Part of the reflective electrode layer 111 is not connected to one of the source electrode and the drain electrode 125. The insulating layer 128 overlapping with the reflective electrode layer 111 has a plurality of depressions.

The liquid crystal display device 120c can have a higher degree of freedom for selecting a material of the reflective electrode layer 111 and the light-transmitting electrode layer 114 because the reflective electrode layer 111 is apart from the light-transmitting electrode layer 114.

Note that the liquid crystal display device 120c may be configured not to connect the reflective electrode layer 111 with the light-transmitting electrode layer 114. In other words, one of the source electrode and the drain electrode 125 of the transistor 109 may be directly connected to the light-transmitting electrode layer 114. This structure leads to a reduction in the number of steps because the openings of the insulating layers 128 and 132 for connecting the light-transmitting electrode layer 114 with one of the source electrode and drain electrode 125 can be formed simultaneously.

The color filters 181, 182, and 183 have a plurality of openings overlapping with the reflective electrode layer 111. As illustrated in FIG. 19, the light 171 from a backlight or the like travels through the color filter once, whereas the light 172 from the outside of the liquid crystal display device 120c travels through the color filter twice. In order to prevent major changes in color tones of a display image between the case where the liquid crystal display device 120c serves as a reflective liquid crystal display device and the case where the liquid crystal display device 120c serves as a transmissive liquid crystal display device, a plurality of openings are preferably provided in the color filter through which the light 172 passes, i.e., the color filter overlapping with the reflective electrode layer 111. It is preferable that the plurality of openings be small in hole diameter and uniform in number; however, the hole diameter and number can be adjusted as appropriate so that the liquid crystal display device 120c can meet the requirements for color tone and brightness of display images as a reflective liquid crystal display device.

Another structure may be used in which a plurality of openings are not provided in the color filter overlapping with the reflective electrode layer 111 and the thickness of this color filter is less than that of the color filter through which the light 171 passes. This structure can reduce color unevenness of display images when the liquid crystal display device 120c serves as a reflective liquid crystal display device.

This embodiment can increase irregularity of the surface shape of the reflective electrode of the light-emitting element, leading to inhibition of interference fringes and reflection of images due to outside light reflected by the display of the liquid crystal display device. The projections on the surface of the black matrix can also inhibit interference fringes and reflection of images due to outside light.

Note that one embodiment of the present invention using a liquid crystal element is a non-limiting example. For example, a display element, a display device including a display element, a light-emitting element, and a light-emitting device including a light-emitting element in this specification and the like can employ a variety of modes or can include a variety of elements. Examples of the display element, the display device, the light-emitting element, and the light-emitting device include an electroluminescence (EL) element (e.g., an EL element containing organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube.

Other than the above elements, a display device including display media whose contrast, luminance, reflectivity, transmittance, or the like is changed by electrical or magnetic effect may be included. Alternatively, quantum dots may be used as the display element. Examples of display devices having EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like, and furthermore, a memory circuit such as an SRAM can be provided under the reflective electrodes, leading to lower power consumption. In the case of using LEDs, graphene or graphite may be provided below an electrode. The graphene or graphite may be a multiple film of a plurality of layers stacked. Since the graphene or graphite is provided, an n-type GaN semiconductor layer including crystals can be easily formed on the graphene or graphite. Note that an AlN layer may be provided between the graphene or graphite and the n-type GaN semiconductor layer including crystals. The GaN layer may be deposited by MOCVD. The provision of graphene allows deposition of the GaN layer by sputtering.

This embodiment can be implemented in appropriate combination with any of the structures described in the other embodiments.

Embodiment 7

Embodiment 7 describes a method for increasing irregularity of the surface shape of of the reflective electrode and black matrix of the EL display device 260 (in FIG. 4) with reference to FIGS. 24A1 to 24B5.

As described in Embodiments 1 to 4, in order to form a plurality of depressions in a surface of a reflective electrode, a method of forming a plurality of depressions in a surface of an insulating layer that is a base layer of a reflective electrode can be used. Thus, to increase irregularity of the surface shape of the reflective electrode layer 331 in the EL display device 260, the plurality of depressions 361 with irregular planar shapes are randomly formed in the surface of the insulating layer 353.

To increase the irregularity of the surface shape of the black matrix 379 of the EL display device 260, the plurality of structures 378 with irregular planar shapes are randomly arranged.

However, when the EL display device 260 has a larger screen and is provided with an increased number of pixels, making a photomask pattern irregular in all the pixels becomes a significant burden on design of a photomask pattern. In view of the above, in this embodiment, a method for designing a photomask with the use of an extremely smaller number of layout patterns than unit pixels while increasing irregularity of the surface shape of the reflective electrode and that of the black matrix.

First, a method for increasing irregularity of the surface shape of the reflective electrode is described with reference to FIGS. 24A1 to 24A5.

FIG. 24A1 is a plan view illustrating an example that is a standard layout pattern 500 of the depressions 361 of the reflective electrode layer 331.

As the planar shape of the standard layout pattern 500 illustrated in FIG. 24A1, a shape capable of being tiled by translation operation or rotating operation can be used. A square is employed here.

Hatching patterns 501 in FIG. 24A1 correspond to the depressions 361. The shape of the pattern 501 does not have rotational symmetry. All the patterns 501 in the standard layout pattern 500 are different from each other. The pattern 501 is preferably drawn freehand to make the shapes of the patterns 501 themselves irregular. The patterns 501 are preferably provided at substantially regular intervals as illustrated in FIG. 24A1.

A hollow pattern 511 in FIG. 24A2 corresponds to the region 360 where the depressions 361 are formed (FIG. 22A).

Here, the shape of the standard layout pattern 500, which is a square having four-fold rotational symmetry, is utilized and four standard mask patterns for forming the depressions are formed from one standard layout pattern 500. Specifically, the standard layout pattern 500 is rotated 0°, 90°, 180°, and 270°, and each of the rotated layout patterns are used to form standard mask patterns for forming the depressions. FIGS. 24A2 to 24A5 show four standard mask patterns obtained by such a method.

The patterns 501 of the depressions in the four mask patterns are preferably arranged at the same densities as illustrated in FIGS. 24A2 to 24A5. For this reason, the shapes and arrangement of some of the patterns 501 in the mask patterns obtained by the method in FIGS. 24A2 to 24A5 may be finely adjusted.

The use of one or more of the four mask patterns shown in FIGS. 24A2 to 24A5 allows design of a mask pattern for forming the depressions 361.

Next, a method for increasing irregularity of the surface shape of the black matrix is described with reference to FIGS. 24B1 to 24B5.

FIG. 24B1 is a plan view illustrating an example that is a standard layout pattern 530 of the depressions of the black matrix 379.

Like the standard layout pattern 500 of the depressions 361 of the reflective electrode layer 331, as the planar shape of the standard layout pattern 530 illustrated in FIG. 24B1, a shape capable of being tiled by translation operation or rotating operation can be used. A square is employed here.

Hatching patterns 531 in FIG. 24B1 correspond to the depressions of the black matrix 379. The shape of the pattern 531 does not have rotational symmetry. All the patterns 531 in the standard layout pattern 530 are different from each other. The pattern 531 is preferably drawn freehand to make the shapes of the patterns 501 themselves irregular. The patterns 531 are preferably provided at substantially regular intervals as illustrated in FIG. 24B1.

A hollow pattern 511 in FIG. 24A2 corresponds to the region 360 where the depressions 361 are formed (the pixel opening). Projections of the black matrix 379 are formed in the vicinity of the region 360.

Here, the shape of the standard layout pattern 530, which is a square having four-fold rotational symmetry, is utilized and four standard mask patterns for forming the depressions of the black matrix 379 are formed from one standard layout pattern 530. Specifically, layout patterns are obtained in such a manner that the standard layout pattern 530 is rotated 0°, 90°, 180°, and 270°, and each of rotated the layout patterns are used to form standard mask patterns for forming the depressions. FIGS. 24B2 to 24B5 show four standard mask patterns obtained by such a method.

The patterns 531 of the depressions in the four mask patterns are preferably arranged at the same densities as illustrated in FIGS. 24B2 to 24B5. For this reason, the shapes and arrangement of some of the patterns 531 in the mask patterns obtained by the method in FIGS. 24B2 to 24B5 may be finely adjusted.

The use of one or more of the mask patterns of FIGS. 24B2 to 24B5 allows design of a mask pattern for forming the projections of the black matrix 379.

FIGS. 25A to 25F illustrates the mask patterns. A mask pattern A corresponds to the standard mask pattern which is not rotated. A mask pattern B corresponds to the standard mask pattern rotated 90°. A mask pattern C corresponds to the standard mask pattern rotated 180°. A mask pattern D corresponds to the standard mask pattern rotated 270°.

FIG. 25A is an example using one mask pattern, the mask pattern A here. FIGS. 25B to 25F are example each using four mask patterns A to D.

FIG. 25B is an example where the mask patterns A to D are repeatedly arranged for unit pixels in each row and each column in the order of A, B, C, and D. In FIG. 25C, the mask patterns in the column direction are arranged in the order of A, C, B, and D so that regularity of arrangement of the mask patterns A to D in FIG. 25C is lower than that in FIG. 25B.

In the example in FIG. 25D or 25E, the mask patterns are arranged in such a manner that the same mask patterns are used for two adjacent unit pixels in each row and each column and the mask pattern is changed in the same order as that in FIG. 25B or 25C.

The example shown in FIG. 25F is obtained randomly arranging pixels without regular repetition. Such an irregular arrangement can be made by determining arrangement of mask patterns using random numbers.

The use of the plurality of mask patterns as shown in FIGS. 25B to 25F can increase irregularity of the surface shape of the reflective electrode layer 331 and that of the black matrix 379.

Since the mask patterns A to D are formed from the same standard layout pattern 500, the reflecting properties of the reflective electrode layers 331 in the adjacent unit pixels Pix are not considerably different from each other even when the depressions 361 are formed in the insulating layer 353 with the use of the plurality of mask patterns A to D. Accordingly, favorable display can be performed on the EL display device 260.

Since the mask patterns A to D are formed from the same standard layout pattern 530, the reflecting properties and the absorbing properties of the black matrixes 379 in the adjacent unit pixels Pix are not considerably different from each other even when the plurality of structures 180 are formed with the use of the plurality of mask patterns A to D. Accordingly, favorable display can be performed on the EL display device 260.

Although the four mask patterns A to D are designed from one standard layout pattern 500 or 530, the number of standard mask patterns can be increased by using the plurality of standard layout patterns 500 or 530. For example, the use of two kinds of standard layout patterns 500 or 530 enables formation of eight kinds of standard mask patterns for forming the depressions.

Although an example where the standard layout pattern 500 or 530 is rotated 90° to design the four mask patterns A to D is described here, the angle of rotation is not limited to 90°. For example, when the angle of rotation is 60°, six kinds of standard mask patterns for forming the depressions can be formed from one kind of standard layout pattern 500 or 530.

As described above, by the method for designing a photomask of this embodiment, irregularity of the surface shape of a plurality of reflective electrodes and that of a black matrix can be increased in the whole pixel portion and a larger screen and higher definition can be easily achieved.

This embodiment can be appropriately combined with any of the other embodiments described in this specification.

Embodiment 8

Embodiment 8 describes electronic devices provided with a display device for a display portion or provided with a flexible touch panel shown in the other embodiments of the present invention.

Examples of the electronic devices to which the display portion including a display device is applied include television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, and large game machines such as pachinko machines.

The touch panel of one embodiment of the present invention has flexibility, and can be used in flexible electronic devices. The use of one embodiment of the present invention can provide an electronic device or a lighting device having high reliability and high resistance to repeated bending. The touch panel of one embodiment of the present invention which has flexibility can be incorporated along a curved inside/outside wall surface of a house or a building or a curved interior/exterior surface of a car.

Specific examples of these electronic devices are shown in FIGS. 26A to 26D and FIGS. 27A to 27F.

Figure 26C:
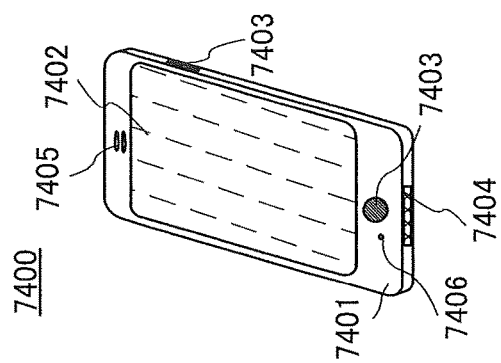
FIGS. 26A to 26D are diagrams showing examples of an electronic device.
Figure 26B:
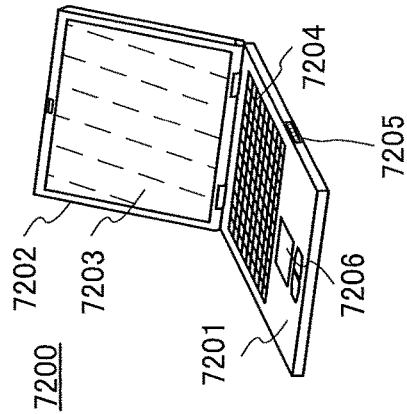
Figure 26A:
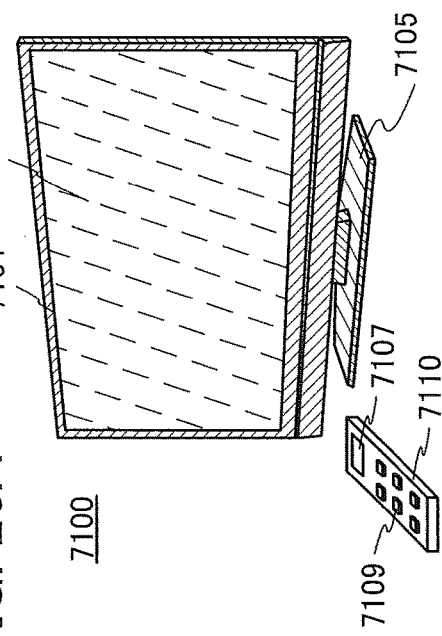

FIG. 26A illustrates an example of a television set. In a television set 7100, a display portion 7103 is incorporated in a housing 7101. The display portion 7103 is capable of displaying images, and a display device can be used for the display portion 7103. In addition, here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Further, the remote controller 7110 may be provided with a display portion 7107 for displaying data output from the remote controller 7110.

The television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

FIG. 26B illustrates an example of a computer. A computer 7200 includes a main body 7201, a housing 7202, a display portion 7203, a keyboard 7204, an external connecting port 7205, a pointing device 7206, and the like.

FIG. 26C illustrates an example of a mobile phone. A mobile phone 7400 is provided with operation buttons 7403, an external connection port 7404, a speaker 7405, a microphone 7406, and the like, in addition to a display portion 7402 incorporated in a housing 7401.

When the display portion 7402 of the mobile phone 7400 is touched with a finger or the like, data can be input into the mobile phone 7400. Further, operations such as making a call and creating an e-mail can be performed with the touch of a finger or the like on the display portion 7402.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that characters displayed on a screen can be inputted. In this case, it is preferable to display a keyboard or number buttons on almost the entire screen of the display portion 7402.

When a sensing device including a sensor for sensing inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken with the touch of the palm or the finger on the display portion 7402, whereby personal authentication can be performed. Further, by providing a backlight or a sensing light source which emits a near-infrared light in the display portion, an image of a finger vein, a palm vein, or the like can be taken.

Figure 26D:
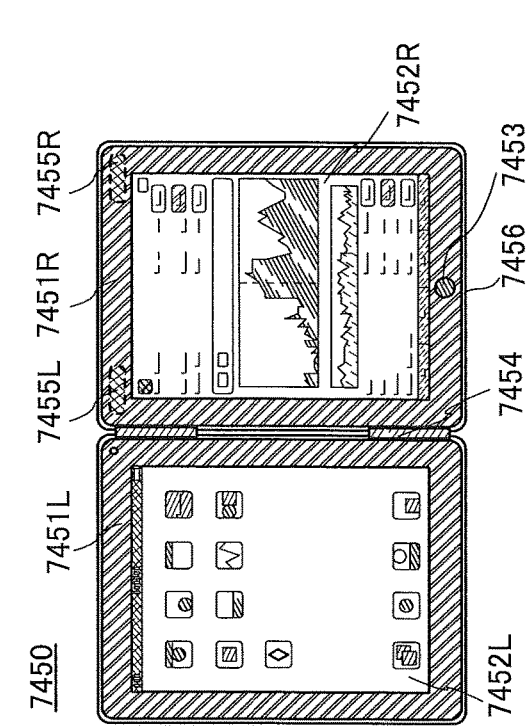

FIG. 26D illustrates an example of a foldable computer. A foldable computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for an installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables data input.

Further, the computer 7450 can also include a gyroscope, an acceleration sensor, a global positioning system (GPS) receiver, a fingerprint sensor, or a video camera. For example, when a detection device including a sensor for sensing inclination, such as a gyroscope or an acceleration sensor, is provided, the orientation of the display screen can be automatically changed by determining the orientation of the computer 7450 (whether the computer 7450 is placed horizontally or vertically for a landscape mode or a portrait mode).

Furthermore, the computer 7450 can be connected to a network. The computer 7450 not only can display data on the Internet but also can be used as a terminal that controls another electronic device connected to the network from a distant place.

Figure 27A:
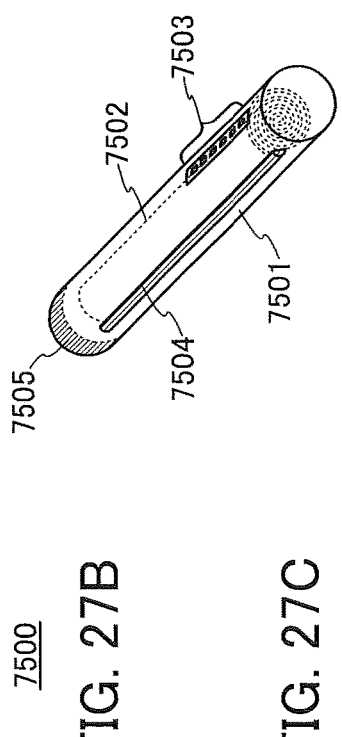
FIGS. 27A to 27F are diagrams showing examples of an electronic device.

FIG. 27A illustrates an example of a portable game machine. A portable game machine 7300 includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine 7300 includes a speaker portion 7306, a recording medium insertion portion 7307, an LED lamp 7308, input means (operation keys 7309, a connection terminal 7310, a sensor 7311 (a sensor having a function of measuring force, displacement, position, speed, acceleration, angular velocity, rotational speed, distance, light, liquid, magnetism, temperature, chemical substance, sound, time, hardness, electric field, current, voltage, electric power, radiation, flow rate, humidity, gradient, vibration, smell, or infrared ray), a microphone 7312, and the like.

The portable game machine 7300 has a function of reading a program or data stored in a recording medium to display it on the display portion, and a function of sharing data with another portable game machine by wireless communication. Note that a function of the portable game machine 7300 is not limited to the above, and the portable game machine 7300 can have a variety of functions.

It is needless to say that the structure of the portable game machine 7300 is not limited to that in FIG. 27A as long as a display device is used for at least one or both of the display portion 7304 and the display portion 7305. The portable game machine 7300 can further include any of various accessories as appropriate.

Figure 27B:
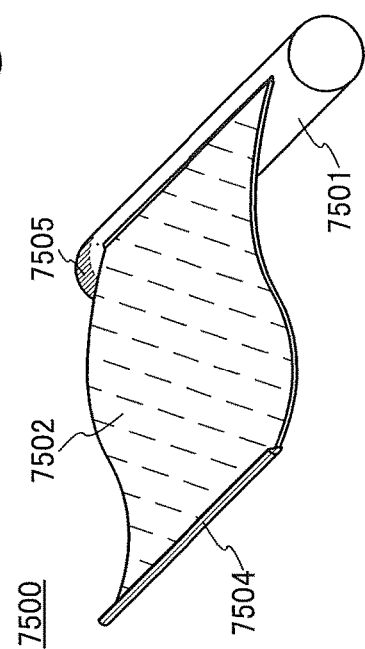

FIG. 27B illustrates an example of a portable touch panel. A touch panel 7500 includes a housing 7501, a display portion 7502, operation buttons 7503, a display portion pull 7504, and a control portion 7505.

The touch panel 7500 includes a rolled flexible display portion 7502 in the cylindrical housing 7501.

The touch panel 7500 can receive a video signal with the control portion 7505 and can display the received video on the display portion 7502. In addition, a battery is included in the control portion 7505. Moreover, a terminal portion for connecting a connector may be included in the control portion 7505 so that a video signal or power can be directly supplied from the outside with a wiring.

By pressing the operation buttons 7503, power ON/OFF, switching of displayed videos, and the like can be performed.

Figure 27C:
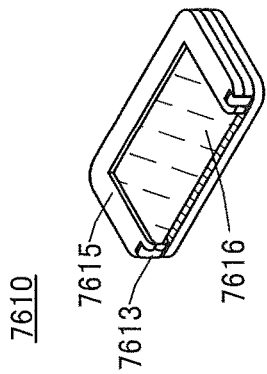

FIG. 27C illustrates a touch panel 7500 in a state where the display portion 7502 is pulled out with the display portion pull 7504. Videos can be displayed on the display portion 7502 in this state. Further, the operation buttons 7503 on the surface of the housing 7501 allow one-handed operation. The operation buttons 7503 are provided not in the center of the housing 7501 but on one side of the housing 7501 as illustrated in FIG. 27B, which makes one-handed operation easy.

Note that a reinforcement frame may be provided for a side portion of the display portion 7502 so that the display portion 7502 has a flat display surface when pulled out.

Note that in addition to this structure, a speaker may be provided for the housing so that sound is output with an audio signal received together with a video signal.

Figure 27D:
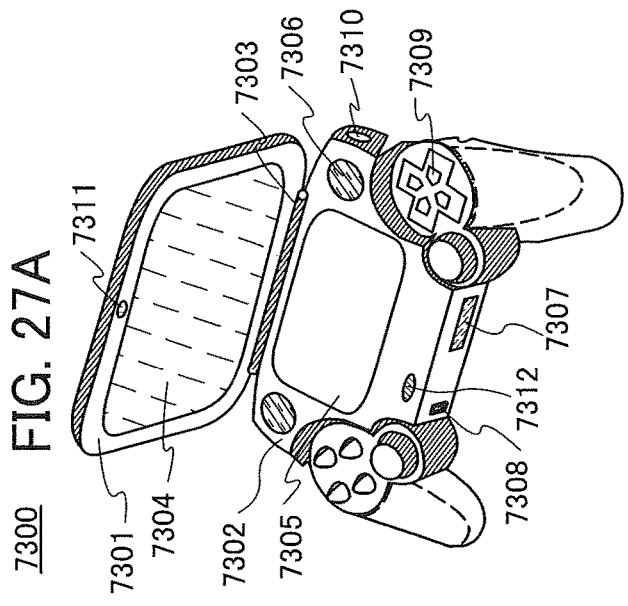
Figure 27E:
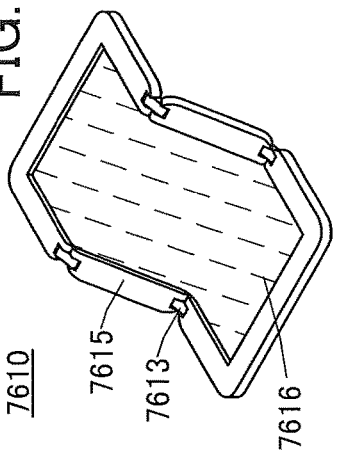
Figure 27F:
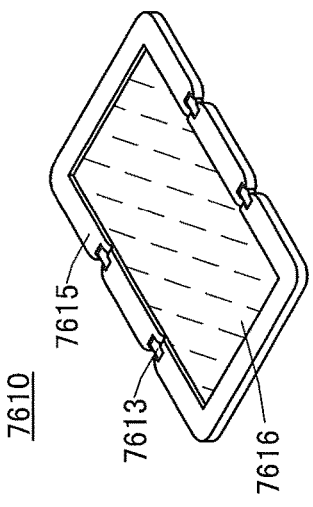

FIGS. 27D to 27F illustrate a foldable portable information terminal 7610. FIG. 27D illustrates the portable information terminal 7610 that is opened. FIG. 27E illustrates the portable information terminal 7610 that is being opened or being folded. FIG. 27F illustrates the portable information terminal 7610 that is folded. The portable information terminal 7610 is highly portable when folded. When the portable information terminal 7610 is opened, a seamless large display region is highly browsable.

A display panel 7616 is supported by three housings 7615 joined together by hinges 7613. By folding the portable information terminal 7610 at a connection portion between two housings 7615 with the hinges 7613, the portable information terminal 7610 can be reversibly changed in shape from an opened state to a folded state. The touch panel according to one embodiment of the present invention can be used for the display panel 7616. For example, a touch panel that can be bent with a radius of curvature of greater than or equal to 1 mm and less than or equal to 150 mm can be used.

Note that in one embodiment of the present invention, a sensor that senses whether the touch panel is in a folded state or an unfolded state and supplies sensing data may be used. The operation of a folded portion (or a portion that becomes invisible by a user by folding) of the touch panel may be stopped by a control device through the acquisition of data indicating the folded state of the touch panel. Specifically, display of the portion may be stopped, and furthermore, sensing by the touch sensor may be stopped.

Similarly, the control device of the touch panel may acquire data indicating the unfolded state of the touch panel to resume displaying and sensing by the touch sensor.

This embodiment can be implemented in appropriate combination with any of the structures described in the other embodiments.

Example 1

The effect of an EL display device in which a pixel electrode has depressions and a black matrix has projections on reflection of outside light will be described with reference to FIGS. 28A to 28C.

Figure 28A:
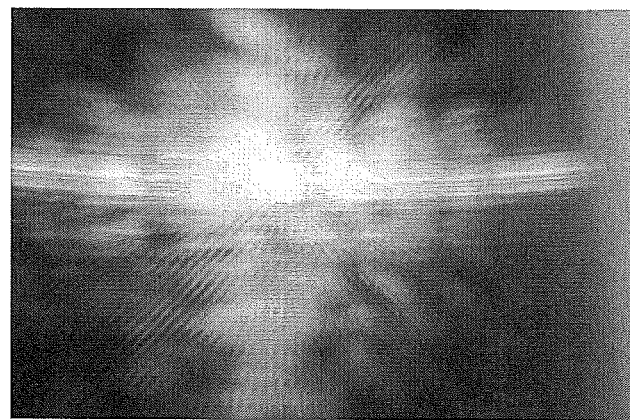
FIGS. 28A to 28C shows results of observing reflection of outside light.

FIG. 28A shows an image observed from the counter substrate side of an EL display device 1 in which the measures described in Embodiment 1 are not taken for the element substrate and the counter substrate. In other words, a pixel electrode region of the element substrate does not have depressions and a black matrix region of the counter substrate does not have projections in the EL display device 1. Note that the EL display device 1 does not include a black matrix itself. The EL display device 1 and EL display devices 2 and 3 described later do not include an anti-reflection film.

The EL display device 1 was observed in a dark room. Light from a room lamp was used as outside light. The EL display device 1 was photographed in a position where reflection of outside light is observed on the rear of the counter substrate (the display side) of the EL display device 1. Note that the EL display devices 2 and 3 were observed under the same conditions.

As shown in FIG. 28A, interference fringes caused by reflection of outside light are clearly observed from the element and counter substrates in which measures are not taken.

Figure 28B:
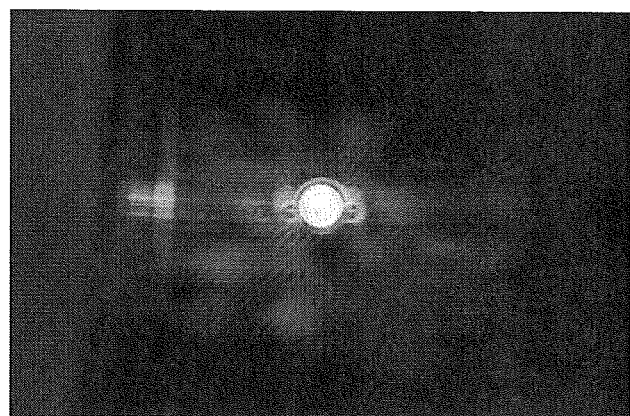

FIG. 28B shows an image observed from the counter substrate of the EL display device 2 in which the measures described in Embodiment 1 are taken only for the counter substrate. In other words, a pixel electrode of the element substrate does not have depressions and a black matrix of the counter substrate has projections in the EL display device 2.

As shown in FIG. 28B, interference fringes caused by reflection of outside light can be greatly suppressed in the EL display device in which the counter substrate has the black matrix having projections.

Figure 28C:
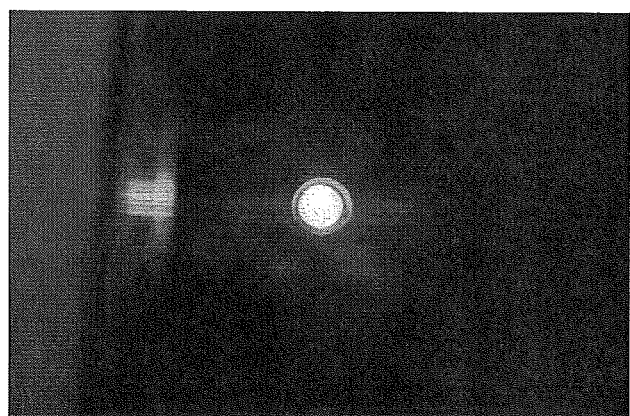

FIG. 28C shows an image observed from the counter substrate of the EL display device 3 in which the measures described in Embodiment 1 are taken for both the element substrate and the counter substrate. In other words, a pixel electrode of the element substrate has depressions and a black matrix of the counter substrate has projections in the EL display device 3.

As shown in FIG. 28C, interference fringes caused by reflection of outside light can be further suppressed in the EL display device 3 than in the EL display device 2.

The above observation results show that a black matrix having projections provided on a counter substrate can suppress interference fringes caused by reflection of outside light and that depressions of a pixel electrode on an element substrate can further suppress interference fringes caused by reflection of outside light.

Example 2

Next, reflectance of outside light is compared from an example in which a black matrix has projections having irregular surface shapes with an example in which a black matrix does not have projections.

A counter substrate 1 (comparison example) includes a black matrix and a color filter and does not include a structure on the black matrix. A counter substrate 2 includes a structure, a black matrix, and a color filter. The black matrix of the counter substrate 2 has projections reflecting the surface shape of the structure. In other words, the black matrix of the counter substrate 2 has irregular surface shapes.

Reflectance of outside light was measured on the side (the display side) of the counter substrates 1 and 2 where a black matrix and the like are not provided. An angle formed by outside light and a normal of the substrate surface and an angle formed by a measurement apparatus (LCD-7200) and the normal of the substrate surface are changed. The measurement results are shown in FIG. 29.

With respect to the counter substrates 1 and 2, a projecting angle of outside light was varied while an acceptance angle of the measurement apparatus was fixed at 15°, 20°, 25°, 30°, 35°, and 40°, so that the measurement results of FIG. 29 were obtained.

Table 1 shows the measurement results of reflectance (%) when the projecting angles and the acceptance angles were each 15°, 20°, 25°, 30°, 35°, and 40°. That is, the values in Table 1 are values at and around the tops of the vertexes of parabolas shown in FIG. 29. Note that in order to observe an influence only of a difference in surface shapes of black matrixes, the counter substrate 1 and 2 are not EL display devices but counter substrates themselves. The counter substrates 1 and 2 do not include anti-reflection films.

TABLE 1

| Measurement angle | 15° | 20° | 25° | 30° | 35° | 40° |
|---|---|---|---|---|---|---|
| Reflectance (%) of counter substrate 1 (comparison example) | 5.3615 | 5.4078 | 5.4783 | 5.5852 | 5.7655 | 6.054 |
| Reflectance (%) of counter substrate 2 | 4.6331 | 4.6433 | 4.6986 | 4.772 | 4.9392 | 5.2185 |
| Reflectance difference (%) | 0.7284 | 0.7645 | 0.7797 | 0.8132 | 0.8263 | 0.8355 |
| Reduction in reflectance (%) | 13.586 | 14.137 | 14.233 | 14.56 | 14.332 | 13.801 |

The comparison of the reflectance between the counter substrate 1 (comparison example) and the counter substrate 2 shows that the reflectance of outside light is reduced by about 0.8% at a measurement angle of 30° due to the projections of a black matrix. This result means a reduction of about 14.56% in comparison with the reflectance of the counter substrate 1. In other words, the irregular surface shape of a black matrix can greatly suppress reflection of outside light.

As compared to a reduction ratio of reflectance between measurement angles, the reflectance is most reduced between 25° and 30°. This result shows that one embodiment of the present invention is more effective on reflection in a slanting direction than on reflection in a direction perpendicular to the display surface. In other words, one embodiment of the present invention exerts an effect on a flexible display device whose screen is often seen from a slanting direction.

Reflection of outside light by a black matrix receives little attention because absorptance of visible light of a black matrix is high. However, the use of one embodiment of the present invention achieves a display device which can effectively reduce reflection of outside light by a black matrix.

Example 3

Next, outside-light reflectance of an EL display device in which a pixel electrode has depressions and a black matrix has projections was measured.

An EL display device 4 includes an element substrate and a counter substrate. The element substrate includes a reflective electrode having depressions. The counter substrate includes a structure, a black matrix, and a color filter. An EL display device 5 includes, in addition to the structure of the EL display device 4, an anti-reflection film on the side (the display side) of the counter substrate where a black matrix and the like are not provided.

Outside-light reflectance was measured on the display side of the counter substrate of each of the EL display devices 4 and 5. An angle formed by outside light and a normal of the substrate surface and an angle formed by a measurement apparatus (LCD-7200) and the normal of the substrate surface are changed. The measurement results are shown in FIG. 30.

With respect to the EL display devices 4 and 5, a projecting angle of outside light was varied while an acceptance angle of the measurement apparatus was fixed at 15°, 20°, 25°, 30°, 35°, and 40°, so that the measurement results of FIG. 30 were obtained.

Table 2 shows the results of reflectance (%) when the projecting angles and the acceptance angles were each 15°, 20°, 25°, 30°, 35°, and 40°. That is, the values in Table 2 are values at and around the tops of the vertexes of parabolas shown in FIG. 30.

TABLE 2

| Measurement angle | 15° | 20° | 25° | 30° | 35° | 40° |
|---|---|---|---|---|---|---|
| EL display device 4 | 4.3828 | 4.416 | 4.4844 | 4.5938 | 4.7648 | 5.0272 |
| EL display device 5 | 1.0828 | 1.1102 | 1.1608 | 1.2564 | 1.4089 | 1.6601 |

The results in Table 2 show that the reflective electrode having depressions, the black matrix having projections, and the anti-reflection film can reduce reflectance of outside light.

REFERENCE NUMERALS

10: touch panel, 20: touch sensor module, 21: substrate, 22: sensor element, 23: circuit, 24: circuit, 30: display panel, 31: substrate, 32: display portion, 33: pixel, 34: circuit, 41: FPC, 42: FPC, 43: terminal, 100: EL display device, 101: element substrate, 102: counter substrate, 103: transistor layer, 104: space, 105: light-emitting element, 106: light, 107: substrate, 108: substrate, 109: transistor, 110: liquid-crystal layer, 111: reflective electrode layer, 112: light-transmitting electrode layer, 113: light-emitting layer, 114: light-transmitting electrode layer, 120: liquid crystal display device, 120a: liquid crystal display device, 120b: liquid crystal display device, 120c: liquid crystal display device, 121: insulating layer, 122: gate electrode, 123: gate insulating layer, 124: semiconductor layer, 125: source electrode and drain electrode, 126: insulating layer, 127: insulating layer, 128: insulating layer, 129: insulating layer, 130: opening, 131: insulating layer, 132: insulating layer, 140: region, 141: depression, 141a: depression, 142: opening, 161: element substrate, 162: counter substrate, 171: light, 172: light, 180: structure, 180a: structure, 180b: structure, 181: color filter, 182: color filter, 183: color filter, 184: overcoat, 186: black matrix, 187: anti-reflection film, 188: counter electrode layer, 189: insulating layer, 200: light, 201: element substrate, 202: counter substrate, 230: pixel circuit, 260: EL display device, 261: EL display device, 301: gate line, 302: power supply line, 303: electrode, 311: oxide semiconductor layer, 312: oxide semiconductor layer, 313: oxide semiconductor layer, 321: source line, 322: power supply line, 323: electrode, 324: electrode, 325: electrode, 331: reflective electrode layer, 332: semi-transmissive conductive layer, 333: light-emitting layer, 334: light-transmitting conductive layer, 351: insulating layer, 352: insulating layer, 353: insulating layer, 354: insulating layer, 355: insulating layer, 360: region, 361: depression, 378: structure, 379: black matrix, 384: overcoat, 385: anti-reflection film, 390: space, 401: substrate, 402: substrate, 411: opening, 412: opening, 413: opening, 414: opening, 420: opening, 500: standard layout pattern, 501: pattern, 511: pattern, 530: standard layout pattern, 531: pattern, 701: transistor, 702: transistor, 703: transistor, 704: light-emitting element, 705: contact portion, 710: connection layer, 711: bonding layer, 712: insulating layer, 713: insulating layer, 714: insulating layer, 715: insulating layer, 716: insulating layer, 717: insulating layer, 718: insulating layer, 719: spacer, 720: bonding layer, 721: electrode, 722: EL layer, 723: electrode, 724: optical adjustment layer, 725: conductive layer, 751: transistor, 752: transistor, 753: contact portion, 760: connection layer, 761: bonding layer, 762: insulating layer, 763: insulating layer, 764: insulating layer, 765: insulating layer, 766: insulating layer, 767: overcoat, 770: capacitor, 771: conductive layer, 771a: conductive layer, 772: dielectric layer, 773: conductive layer, 774: color filter, 775: black matrix, 776: conductive layer, 777: structure, 778: opening, 779: wiring, 781: contact portion, 782: contact portion, 7100: television set, 7101: housing, 7103: display portion, 7105: stand, 7107: display portion, 7109: operation key, 7110: remote controller, 7200: computer, 7201: main body, 7202: housing, 7203: display portion, 7204: keyboard, 7205: external connecting port, 7206: pointing device, 7300: portable game machine, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: mobile phone, 7401: housing, 7402: display portion, 7403: operation button, 7404: external connection port, 7405: speaker, 7406: microphone, 7450: computer, 7451L: housing, 7451R: housing, 7452L: display portion, 7452R: display portion, 7453: operation button, 7454: hinge, 7455L: left speaker, 7455R: right speaker, 7456: external connection port, 7500: touch panel, 7501: housing, 7502: display portion, 7503: operation button, 7504: display portion pull, 7505: control portion, 7610: portable information terminal, 7613: hinge, 7615: housing, 7616: display panel.

This application is based on Japanese Patent Application serial no. 2014-122084 filed with Japan Patent Office on Jun. 13, 2014 and Japanese Patent Application serial no. 2014-132646 filed with Japan Patent Office on Jun. 27, 2014, the entire contents of which are hereby incorporated by reference.

The invention claimed is:

1. A display device comprising:
a first substrate comprising a first surface;
a second substrate comprising a second surface; and
a transistor over the first surface,
wherein a first structure having a projection, a second structure having a projection, a black matrix covering the first structure and the second structure, an overcoat layer formed by a polyimide resin, an epoxy resin, or an acrylic resin covering the black matrix, and a color filter are provided over the second surface,
wherein the first surface faces the second surface,
wherein the black matrix has a plurality of projections reflecting the projection of the first structure and the projection of the second structure,
wherein a bottom surface of the black matrix is in direct contact with the first structure and the second structure,
wherein a planar shape of the first structure is different from a planar shape of the second structure, and
wherein the black matrix is a single-layer structure.

2. The display device according to claim 1, wherein the first structure and the second structure comprise a portion connected to each other.

3. The display device according to claim 1, wherein the first structure and the second structure each comprises a region having a thickness of greater than or equal to 0.2 μm and less than or equal to 3 μm.

4. The display device according to claim 1, wherein each of an angle between a side surface of the first structure and the second surface and an angle between a side surface of the second structure and the second surface is greater than or equal to 2° and less than or equal to 80°.

5. The display device according to claim 1, wherein a thickness of the first structure is different from a thickness of the second structure.

6. The display device according to claim 1, wherein a refractive index of each of the first structure and the second structure is higher than a refractive index of the black matrix.

7. The display device according to claim 1, wherein each of the planar shape of the first structure and the planar shape of the second structure does not have rotational symmetry.

8. A display device comprising:
a first substrate comprising a first surface; and
a second substrate comprising a second surface,
wherein a first transistor, an insulating layer, and a light-emitting element over the insulating layer are provided over the first surface,
wherein a first structure having a projection, a second structure having a projection, a black matrix covering the first structure and the second structure, an overcoat layer formed by a polyimide resin, an epoxy resin, or an acrylic resin covering the black matrix, and a color filter are provided over and in contact with the second surface,
wherein the first surface faces the second surface,
wherein the insulating layer has a plurality of depressions,
wherein the light-emitting element comprises a first electrode, a second electrode, and a layer containing a light-emitting material between the first electrode and the second electrode,
wherein the first electrode has a plurality of depressions reflecting the plurality of depressions of the insulating layer,
wherein planar shapes of the plurality of depressions of the insulating layer are different from each other,
wherein the black matrix has a plurality of projections reflecting the projection of the first structure and the projection of the second structure,
wherein a bottom surface of the black matrix is in direct contact with the first structure and the second structure, and
wherein the black matrix is a single-layer structure.

9. The display device according to claim 8,
wherein a first pixel and a second pixel are provided over the first surface, and
wherein a planar shape of the depression in the first pixel is a planar shape in which the depression in the second pixel is rotated 90°.

10. The display device according to claim 8, wherein the planar shape of the depression does not have rotational symmetry.

11. The display device according to claim 8, wherein the first structure and the second structure comprise a portion connected to each other.

12. The display device according to claim 8, wherein a thickness of the first structure is different from a thickness of the second structure.

13. The display device according to claim 8, wherein a refractive index of each of the first structure and the second structure is higher than a refractive index of the black matrix.

14. The display device according to claim 9,
wherein a third pixel and a fourth pixel are provided over the first surface,
wherein the third pixel overlaps with the first structure,
wherein the fourth pixel overlaps with the second structure, and
wherein a planar shape of the first structure is a planar shape in which the second structure is rotated 90°.

15. The display device according to claim 8, wherein each of the planar shape of the first structure and the planar shape of the second structure does not have rotational symmetry.

16. A display device comprising:
a first substrate comprising a first surface; and
a second substrate comprising a second surface,
wherein a first transistor, an insulating layer, and a third electrode over the insulating layer are provided over the first surface,
wherein a first structure having a projection, a second structure having a projection, a black matrix covering the first structure and the second structure, and an overcoat layer formed by a polyimide resin, an epoxy resin, or an acrylic resin covering the black matrix are provided over the second surface,
wherein the first surface faces the second surface,
wherein the black matrix has a plurality of projections reflecting the projection of the first structure and the projection of the second structure,
wherein a bottom surface of the black matrix is in direct contact with the first structure and the second structure,
wherein a planar shape of the first structure is different from a planar shape of the second structure,
wherein the black matrix is a single-layer structure,
wherein a liquid crystal layer is between the first substrate and the second substrate, and
wherein the insulating layer has a plurality of depressions.

17. The display device according to claim 16, wherein the first structure and the second structure comprise a portion connected to each other.

18. The display device according to claim 16, wherein a thickness of the first structure is different from a thickness of the second structure.

19. The display device according to claim 16, wherein each of a refractive index of the first structure and the second structure is higher than a refractive index of the black matrix.

20. The display device according to claim 16, wherein each of the planar shape of the first structure and the planar shape of the second structure does not have rotational symmetry.

21. An input/output device comprising:
the display device according to claim 1; and
a sensor element,
wherein the sensor element is provided over the second surface,
wherein the sensor element comprises a first conductive layer, a second conductive layer, and a dielectric layer, and
wherein the dielectric layer is between the first conductive layer and the second conductive layer.

22. An input/output device comprising:
the display device according to claim 16; and
an input device,
wherein the input device is provided over the second surface,
wherein the input device comprises a second transistor and a sensor element,
wherein the sensor element comprises a first conductive layer, a second conductive layer, and a dielectric layer,
wherein the dielectric layer is between the first conductive layer and the second conductive layer, and
wherein the second transistor is electrically connected to the sensor element.

23. The input/output device according to claim 21,
wherein a third conductive layer is provided over the second surface,
wherein the third conductive layer is electrically connected to at least one of the first conductive layer and the second conductive layer, and
wherein a part of the third conductive layer is between the black matrix and the first substrate.

24. An electronic device comprising:
the input/output device according to claim 21; and
a microphone, a speaker, a battery, an operational switch, or a housing.

25. The display device according to claim 1,
wherein each of the first structure and the second structure is in direct contact with the second surface of the second substrate, and
wherein the first structure and the second structure comprise photopolymer, photosensitive acrylic, or photosensitive polyimide.

26. The display device according to claim 8,
wherein each of the first structure and the second structure is in direct contact with the second surface of the second substrate, and
wherein the first structure and the second structure comprise photopolymer, photosensitive acrylic, or photosensitive polyimide.

27. The display device according to claim 16,
wherein each of the first structure and the second structure is in direct contact with the second surface of the second substrate, and
wherein the first structure and the second structure comprise photopolymer, photosensitive acrylic, or photosensitive polyimide.

* * * * *